(12) United States Patent
Tsuda

(10) Patent No.: US 11,217,605 B2
(45) Date of Patent: Jan. 4, 2022

(54) SEMICONDUCTOR DEVICE AND METHOD OF MANUFACTURING THE SAME

(71) Applicant: RENESAS ELECTRONICS CORPORATION, Tokyo (JP)

(72) Inventor: Shibun Tsuda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/003,245

(22) Filed: Aug. 26, 2020

(65) Prior Publication Data
US 2021/0111193 A1   Apr. 15, 2021

(30) Foreign Application Priority Data

Oct. 10, 2019 (JP) .............................. JP2019-186897

(51) Int. Cl.
| | |
|---|---|
| H01L 27/12 | (2006.01) |
| H01L 27/092 | (2006.01) |
| H01L 27/11 | (2006.01) |
| H01L 29/08 | (2006.01) |
| H01L 29/417 | (2006.01) |
| H01L 29/51 | (2006.01) |
| H01L 21/84 | (2006.01) |
| H01L 21/02 | (2006.01) |
| H01L 21/32 | (2006.01) |
| H01L 21/8238 | (2006.01) |

(52) U.S. Cl.
CPC .... *H01L 27/1207* (2013.01); *H01L 21/02145* (2013.01); *H01L 21/02148* (2013.01); *H01L 21/32* (2013.01); *H01L 21/823814* (2013.01); *H01L 21/823857* (2013.01); *H01L 21/823864* (2013.01); *H01L 21/823871* (2013.01); *H01L 21/84* (2013.01); *H01L 27/092* (2013.01); *H01L 27/1104* (2013.01); *H01L 29/0847* (2013.01); *H01L 29/41725* (2013.01); *H01L 29/517* (2013.01)

(58) Field of Classification Search
None
See application file for complete search history.

(56) References Cited

U.S. PATENT DOCUMENTS

| | | | |
|---|---|---|---|
| 9,935,125 | B2 | 4/2018 | Tsunomura et al. |
| 10,043,881 | B2 | 8/2018 | Yamamoto |

(Continued)

FOREIGN PATENT DOCUMENTS

| | | |
|---|---|---|
| JP | 2013-219181 A | 10/2013 |
| JP | 2016-018936 A | 2/2016 |
| JP | 2019-062170 A | 4/2019 |

*Primary Examiner* — Alexander G Ghyka
(74) *Attorney, Agent, or Firm* — McDermott Will & Emery LLP

(57) ABSTRACT

The first gate insulating film is an insulating film made of silicon oxide, and to which hafnium (Hf) is added without addition of aluminum (Al). Also, the second gate insulating film is an insulating film made of silicon oxide, and to which aluminum is added without addition of hafnium. The third gate insulating film is an insulating film made of silicon oxide, and to which aluminum is added. Further, the fourth gate insulating film is an insulating film made of silicon oxide, and to which hafnium is added. Accordingly, it is possible to reduce the power consumption of the semiconductor device.

18 Claims, 30 Drawing Sheets

(56) References Cited

U.S. PATENT DOCUMENTS

| | | | |
|---|---|---|---|
| 2011/0114946 A1* | 5/2011 | Saito | G11C 7/24 |
| | | | 257/43 |
| 2016/0118425 A1* | 4/2016 | Kurokawa | H01L 27/14641 |
| | | | 257/43 |
| 2016/0316160 A1* | 10/2016 | Kurokawa | H04N 5/3698 |
| 2019/0080998 A1* | 3/2019 | Rastogi | H01L 21/823821 |
| 2019/0097018 A1 | 3/2019 | Yoshida | |
| 2021/0028258 A1* | 1/2021 | Lee | H01L 27/3276 |
| 2021/0159342 A1* | 5/2021 | Asami | H01L 29/66742 |
| 2021/0202759 A1* | 7/2021 | Lee | H01L 27/3244 |
| 2021/0233952 A1* | 7/2021 | Kurokawa | H01L 27/14609 |
| 2021/0249498 A1* | 8/2021 | Cho | H01L 27/3276 |

\* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2019-186897 filed on Oct. 10, 2019 including the specification, drawings and abstract is incorporated herein by reference in its entirety.

BACKGROUND

The present invention relates to a semiconductor device and a method of manufacturing the same, and the present invention can be suitably used for a semiconductor device and a method of manufacturing the same using, for example, an SOI substrate.

There are disclosed techniques listed below.
[Patent Document 1] Japanese Unexamined Patent Application Publication No. 2013-219181
[Patent Document 2] Japanese Unexamined Patent Application Publication No. 2016-18936
[Patent Document 3] Japanese Unexamined Patent Application Publication No. 2019-62170

As a semiconductor device using the SOI substrate having a semiconductor substrate (semiconductor base material), a BOX film (insulating layer) formed on the semiconductor substrate, and a silicon layer (SOI layer, semiconductor layer) formed on the BOX film, for example, as shown in Patent Document 1, there is a semiconductor device of a so-called hybrid structure, comprising an n-channel type (or p-channel type) field effect transistor formed in an SOI region of an SOI substrate (that is a region having a BOX film and a silicon layer) and an n-channel type (or p-channel type) field effect transistor formed in a bulk silicon region of the SOI substrate (that is a region having no BOX film and a silicon layer).

As a semiconductor device using the SOI substrate, as shown in Patent Document 2, there is a semiconductor device including an n-channel type field effect transistor having a gate insulating film and a p-channel type field effect transistor having a gate insulating film. Also, hafnium (Hf) whose concentration per a unit area of a surface of the gate insulating film is $1\times10^{13}$ cm$^2$ or more is added to each gate insulating film. In such a case, it is possible to make the work function of a gate electrode of each of the n-channel type field effect transistor and the p-channel type field effect transistor smaller. That is, it is possible to reduce the threshold voltage of the n-channel type field effect transistor, while it is possible to increase the threshold voltage of the p-channel type field effect transistor.

Furthermore, as a measure against NBTI (Negative Bias Temperature Instability) in a p-channel type field effect transistor of BTI (Bias Temperature Instability) that the threshold voltage of the field effect transistor is varied, as shown in the first embodiment of Patent Document 3, there is a semiconductor device using the SOI substrate that a ratio of a number of hafnium atoms to a total number of aluminum atoms and hafnium atoms, in a gate insulating film of each of an n-channel type field effect transistor and the p-channel type field effect transistor, is 75% or more, and less than 100%. Also, as a semiconductor device using the SOI substrate, as shown in the second embodiment of Patent Document 3, there is a semiconductor device comprising: an n-channel field effect transistor having a gate insulating film to which aluminum (Al) is added without addition of hafnium (Hf); and a p-channel field effect transistor having a gate insulating film to which hafnium (Hf) is added without addition of aluminum (Al). In such a case, it is possible to suppress a decrease of the threshold voltage of the p-channel type field effect transistor, due to aluminum (Al).

SUMMARY

As shown in Patent Document 2 or Patent Document 3, it is preferable to add a metal such as aluminum (Al) or hafnium (Hf) to the gate insulating film composing the field effect transistor in order to adjust the threshold voltage of the field effect transistor. Also, it is possible to suppress an occurrence of the gate leakage current by employing a so-called high dielectric constant insulating film that is a gate insulating film to which the metal such as aluminum (Al) or hafnium (Hf) is added. That is, by employing the high dielectric constant insulating film, it is also possible to increase the capacitance of the gate insulating film without reducing the physical thickness of the gate insulating film.

On the other hand, in recent years, it is required to further reduce the power consumption of a semiconductor device and/or to improve the operation speed of a semiconductor device. In order to operate the field effect transistor at high speed, namely, in order to increase ON current flowing through a channel region of the field effect transistor, even if the voltage value (driving voltage) applied to the field effect transistor is reduced, it is conceivable to make the threshold voltage of the field effect transistor lower.

Therefore, the present inventor has studied to adjust the type and amount (ratio, concentration) of the metal composing the above-mentioned high dielectric constant insulating film in order to make the threshold voltage of the field effect transistor lower. As a result, it has been found that it is difficult to produce a semiconductor device having the desired characteristics, depending on the type or amount of the metal.

Other objects and novel features will become apparent from the description of this specification and the accompanying drawings.

The typical ones of the embodiments disclosed in the present application will be briefly described as follows.

A semiconductor device according to one embodiment comprises: a first gate electrode of a first field effect transistor of n-type; a second gate electrode of a second field effect transistor of p-type; a third gate electrode of a third field effect transistor of n-type; and a fourth gate electrode of a fourth field effect transistor of p-type. Here, the first gate electrode is formed on a semiconductor layer located in a first region via a first gate insulating film. Also, the second gate electrode is formed on the semiconductor layer located in a second region via a second gate insulating film. Also, the third gate electrode is formed on a semiconductor base material located in a third region via a third gate insulating film. Further, the fourth gate electrode is formed on the semiconductor base material located in a fourth region via a fourth gate insulating film. Here, the first gate insulating film is an insulating film made of silicon oxide, and to which hafnium is added without addition of aluminum. Also, the second gate insulating film is an insulating film made of silicon oxide, and to which aluminum is added without addition of hafnium. Also, the third gate insulating film is an insulating film made of silicon oxide, and to which aluminum is added. Further, the fourth gate insulating film is an insulating film made of silicon oxide, and to which hafnium is added.

Also, a method of manufacturing a semiconductor device according to one embodiment, comprises: forming a first insulating film made of silicon oxide on a semiconductor layer located in each of a first region and a second region, and forming a second insulating film made of silicon oxide on a semiconductor base material located in each of a third region and a fourth region. Also, the method comprises: adding aluminum to each of the first insulating film located in the second region and the second insulating film located in the third region, while the semiconductor layer located in the first region is covered with a first mask. Also, the method comprises: adding hafnium to each of the first insulating film located in the first region and the second insulating film located in the fourth region, while the semiconductor layer located in the second region is covered with a second mask. Further, the method comprises: forming a first gate electrode of a first field effect transistor of n-type on the semiconductor layer located in the first region via a first gate insulating film, forming a second gate electrode of a second field effect transistor of p-type on the semiconductor layer located in the second region via a second gate insulating film, forming a third gate electrode of a third field effect transistor of n-type on the semiconductor base material located in the third region via a third gate insulating film, and forming a fourth gate electrode of a fourth field effect transistor of p-type on the semiconductor base material located in the fourth region via a fourth gate insulating film. Here, the first gate insulating film is the first insulating film located in the first region, and to which hafnium is added without addition of aluminum. Also, the second gate insulating film is the first insulating film located in the second region, and to which aluminum is added without addition of hafnium. Also, the third gate insulating film is the second insulating film located in the third region, and to which aluminum is added. Further, the fourth gate insulating film is the second insulating film located in the fourth region, and to which hafnium is added.

Furthermore, a method of manufacturing a semiconductor device according to another embodiment, comprises: forming a first insulating film made of silicon oxide on a semiconductor layer located in each of a first region and a second region, and forming a second insulating film made of silicon oxide on a semiconductor base material located in each of a third region and a fourth region. Also, the method comprises: adding both aluminum and hafnium to each of the first insulating film located in each of the first region and the second region and the second insulating film located in each of the third region and the fourth region. Also, the method comprises: forming a first semiconductor material on each of the semiconductor layer located in each of the first region and the second region and the semiconductor base material located in each of the third region and the fourth region such that the first insulating film located in each of the first region and the second region and the second insulating film located in each of the third region and the fourth region are covered with the first semiconductor material. Also, the method comprises: removing the first semiconductor material located in the second region and the first insulating film located in the second region, and to which both aluminum and hafnium are added, such that the first semiconductor material located in each of the first region, the third region and the fourth region is left. Also, the method comprises: forming a third insulating film made of silicon oxide on the semiconductor layer located in the second region. Also, the method comprises: adding aluminum to the third insulating film located in the second region. Also, the method comprises: forming a second semiconductor material on the third insulating film located in the second region, and to which aluminum is added. Also, the method comprises: removing the first semiconductor material located in the first region and the first insulating film located in the first region, and to which both aluminum and hafnium are added, such that the second semiconductor material located in the second region and the first semiconductor material located in each of the third region and the fourth region are left. Also, the method comprises: forming a fourth insulating film made of silicon oxide on the semiconductor layer located in the first region. Also, the method comprises: adding hafnium to the fourth insulating film located in the first region. Also, the method comprises: forming a third semiconductor material on the fourth insulating film located in the first region, and to which hafnium is added. Further, the method comprises: forming a first gate electrode of a first field effect transistor of n-type on the semiconductor layer located in the first region via the fourth insulating film located in the first region, and to which hafnium is added, forming a second gate electrode of a second field effect transistor of p-type on the semiconductor layer located in the second region via the third gate insulating film located in the first region, and to which aluminum is added, forming a third gate electrode of a third field effect transistor of n-type on the semiconductor base material located in the third region via the second insulating film located in the third region, and to which both aluminum and hafnium are added, and forming a fourth gate electrode of a fourth field effect transistor of p-type on the semiconductor base material located in the fourth region via the second insulating film located in the fourth region, and to which both aluminum and hafnium are added, by patterning each of the first semiconductor material, the second semiconductor material and the third semiconductor material.

According to the semiconductor device in one embodiment, it is possible to reduce the power consumption of the semiconductor device.

Also, according to the method of manufacturing the semiconductor device in one embodiment, it is possible to improve the manufacturing yield of the semiconductor device.

Further, according to the method of manufacturing the semiconductor device in another embodiment, it is possible to improve the reliability of the semiconductor device.

DETAILED DESCRIPTION

Figure 1:
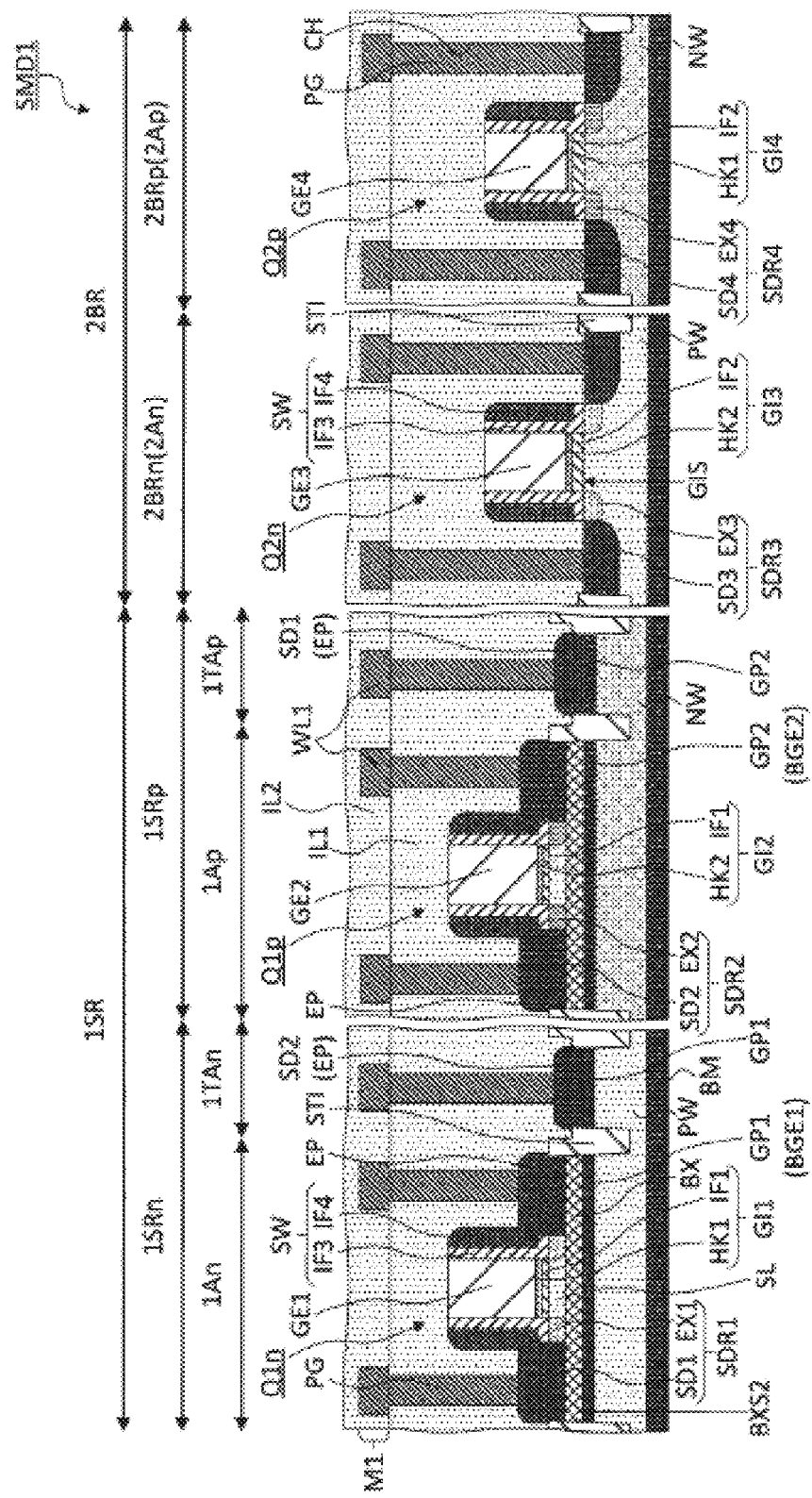
FIG. 1 is a cross-sectional view of a semiconductor device according to one embodiment.

In the following embodiments, when required for convenience, the description will be made by dividing into a plurality of sections or embodiments, but except when specifically stated, they are not independent of each other, and one is related to the modified example, detail, supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

The following embodiments will be explained in detail based on the drawings. In all the drawings for explaining the embodiments, members having the same functions are denoted by the same reference numeral and hatches, and repetitive descriptions thereof are omitted. In the following embodiments, descriptions of the same or similar parts will not be repeated in principle except when particularly necessary.

In the drawings used in the embodiments, hatching may be omitted even in the case of cross-sectional view in order to make the drawings easier to see. Also, even in the case of a plan view, hatching may be used to make the drawing easier to see.

EMBODIMENT

Figure 2:
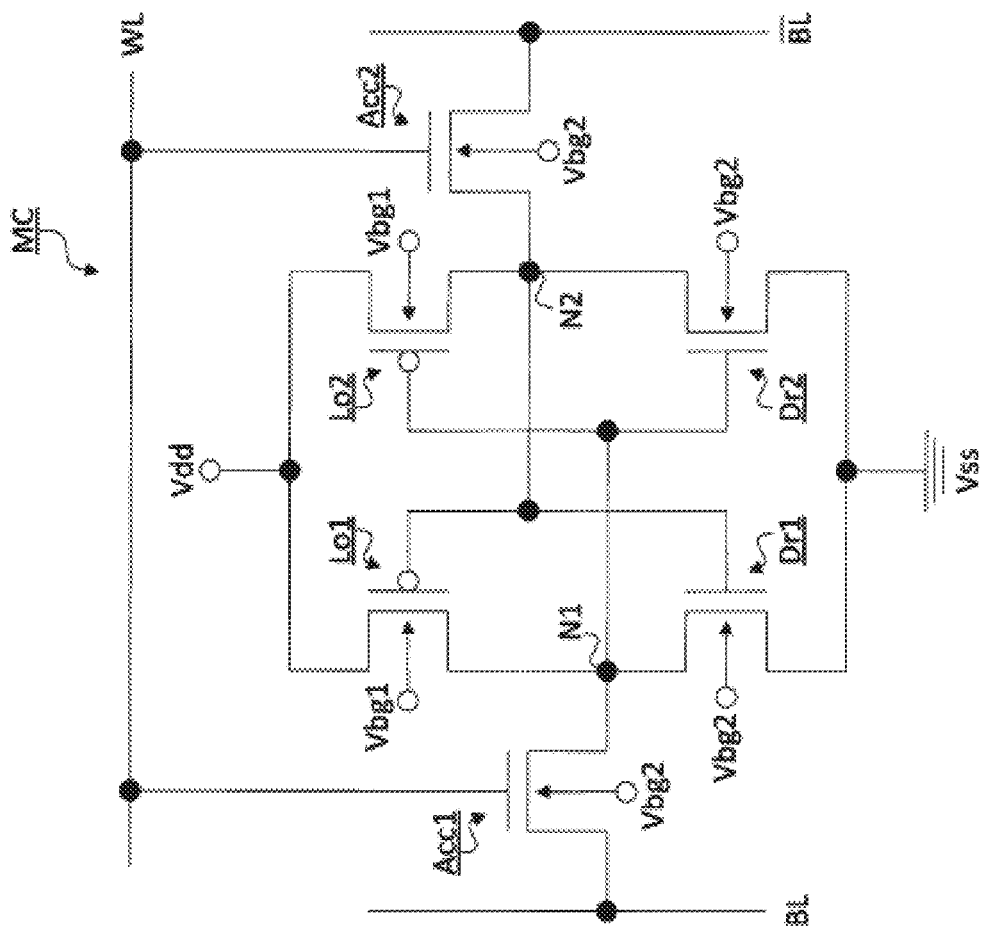
FIG. 2 is a circuit diagram showing a memory cell composing a SRAM circuit.
Figure 3:
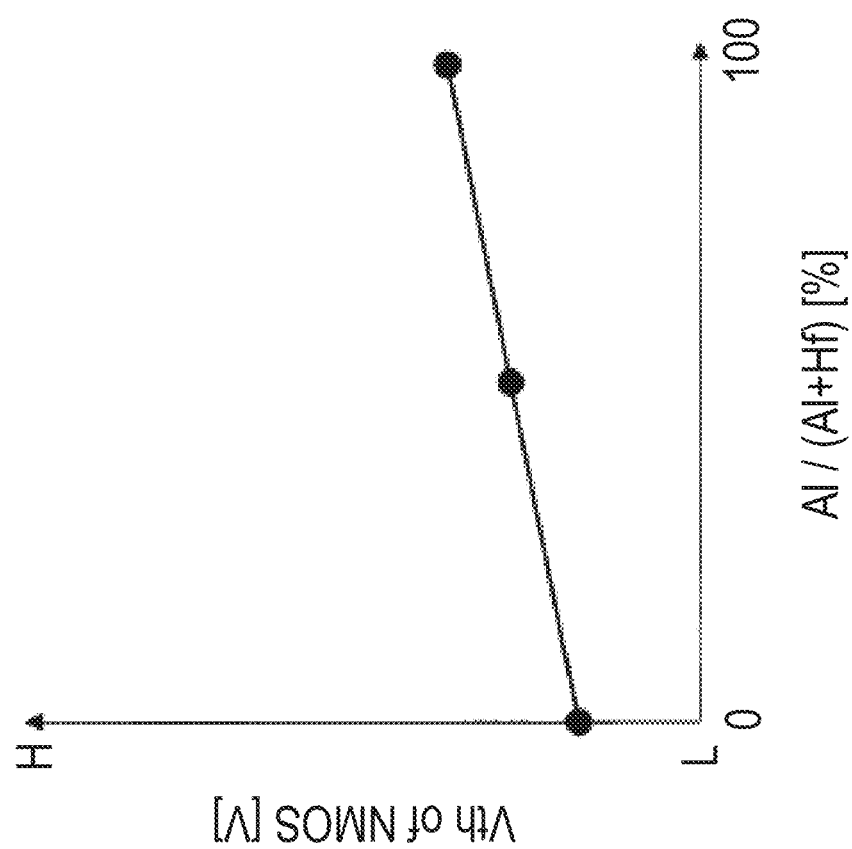
FIG. 3 is a graph showing the relationship between the addition amount of aluminum and the threshold voltage of a field effect transistor of n-type.
Figure 4:
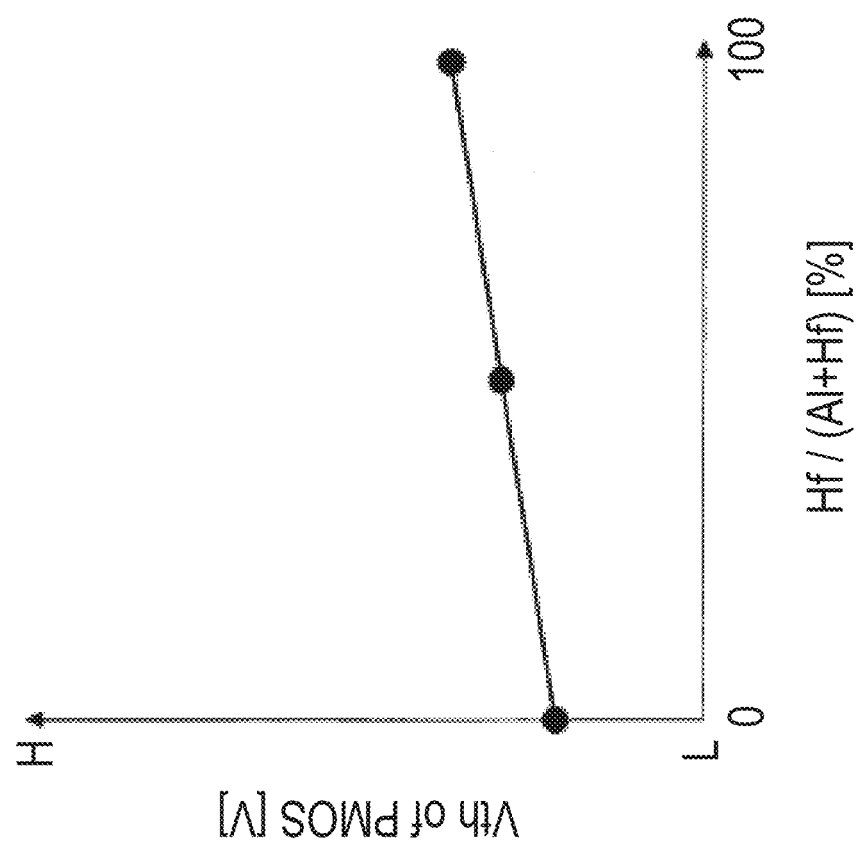
FIG. 4 is a graph showing the relationship between the addition amount of hafnium and the threshold voltage of a field effect transistor of p-type.

A semiconductor device SMD1 and a method of manufacturing the same in the present embodiment will be described. FIG. 1 is a cross-sectional view of the semiconductor device SMD1 of the present embodiment. Further, FIG. 2 is a circuit diagram showing a memory cell MC composing a SRAM (Static Random Access Memory) circuit. Further, FIG. 3 is a graph showing the relationship between the addition amount of aluminum to be added to an insulating film composing a gate insulating film and the threshold voltage of a field effect transistor of aluminum (Al) of n-type. Further, FIG. 4 is a graph showing the relationship between the addition amount of hafnium (Hf) to be added to an insulating film composing a gate insulating film and the threshold voltage of a field effect transistor of p-type.

<Semiconductor Device SMD1 of Present Embodiment>

As shown in FIG. 1, the semiconductor device SMD1 of the present embodiment includes an SOI region 1SR, and a bulk region 2BR, a so-called hybrid structure. As shown in FIG. 1, the SOI region 1SR has a region 1An in which an n-channel type (hereinafter, referred to as n-type) field effect transistor Q1$n$ is formed, a region 1SRn in which a region 1TAn for supplying a back gate voltage to the field effect transistor Q1$n$ of n-type (namely, n-type field effect transistor) is provided, a region 1Ap in which a p-channel type (hereinafter, referred to as p-type) field effect transistor Q1$p$ is formed, and a region 1SRp in which a region 1TAp for supplying a back gate voltage to the field effect transistor Q1$p$ of p-type (namely, p-type field effect transistor) is provided. On the other hand, as shown in FIG. 1, the bulk region 2BR has a region 2BRn in which an n-type field effect transistor Q2$n$ is formed and a region 2BRp in which a p-type field effect transistor Q2$p$ is formed. As shown in FIG. 1, between the region 1An in which an n-type field effect transistor Q1$n$ is formed and the region 1TAn in which a back-gate voltage is supplied to the n-type field effect transistor Q1$n$, an isolation portion STI made of, for example, silicon oxide is formed. That is, the two regions 1An, 1TAn are separated from each other by the element isolating portion STI. As shown in FIG. 1, the element isolation portion STI is also formed between the region 1Ap in which a p-type field effect transistor Q1$p$ is formed and the region 1TAp for supplying a back-gate voltage to the p-type field effect transistor Q1$p$. That is, the regions 1An, 1TAn, 1Ap, 1TAp, 2BRn (2An), and 2BPp (2Ap) are partitioned and formed by the device isolation portions STIs.

Each field effect transistor Q1n and Q1p formed in the SOI region 1SR of the semiconductor device SMD1 is a field effect transistor composing a memory cell MC (see FIG. 2) of the SRAM circuit whose driving voltage is 0.5 v to 1.8 v, for example. On the other hand, each field effect transistor Q2n and Q2p formed in the bulk-region 2BR is a field effect transistor composing a peripheral circuit (not shown) such as an input/output circuit whose driving voltage is, for example, 2.5 v to 3.3 v. In the present embodiment, each field effect transistor Q1n and Q1p is applied to the respective transistor of the memory cell MC composing the SRAM circuit, but each field effect transistor Q1n and Q1p may be applied to the transistor composing another circuit, such as a word line driver circuit connected to the word line of DRAM (Dynamic Random Access Memory) circuit, for example.

<SRAM Circuit>

Here, the memory cell MC of SRAM circuit will be described with reference to FIG. 2. As shown in FIG. 2, the memory cell MC composing the SRAM circuit is disposed at an intersection of a pair of bit lines BL, /(bar) BL and a word line WL. Further, the memory cell MC has, as shown in FIG. 2, a pair of load transistors (load MISFET) Lo1, Lo2, a pair of access transistors (transfer MISFET) Acc1, Acc2, and a pair of driver transistors (driving MISFET) Dr1, Dr2. Here, each of the load transistors Lo1, Lo2 is a p-type field effect transistor, whereas each of the access transistors Acc1, Acc2 and the driver transistors Dr1, Dr2 is an n-type field effect transistor. In the present embodiment, the n-type field effect transistor Q1n formed in the region 1SRn is, for example, the driver transistors Dr1, Dr2 of the memory cell MC shown in FIG. 2, and the p-type field effect transistor Q1n formed in the region 1SRp is, for example, the load transistors Lo1, Lo2 (or access transistors Acc1, Acc2) of the memory cell MC shown in FIG. 2.

In addition, among the six transistors composing the memory cell MC, the load transistor Lo1 and the driver transistor Dr1 compose one of a pair of CMOS inverters as shown in FIG. 2. In addition, among the six transistors composing the memory cell MC, the load transistor Lo2 and the driver transistor Dr2 compose another one of the pair of CMOS inverters as shown in FIG. 2. Nodes N1 and N2 that are mutually input and output terminals of the pair of CMOS inverters are cross-coupled. That is, as shown in FIG. 2, the gate electrode of each of the load transistor Lo1 connected between the power supply voltage Vdd and the node N1, and the driver transistor Dr1 connected between the node N1 and reference voltage Vss is electrically connected to the node N2. Further, as shown in FIG. 2, the gate electrode of each of the load transistor Lo2 connected between the power supply voltage Vdd and the node N2, and the driver transistor Dr2 connected between the node N2 and the ground voltage Vss is connected to the node N1. In other words, a pair of CMOS inverters cross-coupled as described above constitutes a flip-flop circuit as an information storage unit that stores 1-bit information. Furthermore, as shown in FIG. 2, an access transistor Acc1 is connected between the bit line BL and the node N1, and an access transistor Acc2 is connected between the bit line/BL and the node N2. Then, the gate electrode of each access transistor Acc1, Acc2 is connected to the word line WL as shown in FIG. 2.

Next, the field effect transistors formed in the regions 1An, 1TAn, 1Ap, 1TAp, 2BRn (2An), and 2BPp (2Ap) will be described in detail. First, the n-type field effect transistor Q1n formed in the region 1SRn of the SOI region 1SR will be described. Further, in the configuration of the field effect transistor to be described later, for the same parts as the configuration of the field effect transistor described above, a description thereof will be omitted.

<Field Effect Transistor Q1n of Present Embodiment>

As shown in FIG. 1, the n-type field effect transistor Q1n formed in the SOI region 1SR has a semiconductor base material BM located in the region 1An, an insulating layer BX formed on the semiconductor base material BM located in the region 1An, a semiconductor layer SL formed on the insulating layer BX located in the region 1An, and a gate electrode GE1 formed on the semiconductor layer SL located in the region 1An via a gate insulating film GI1. Here, the semiconductor base material BM is made of a p-type monocrystalline silicon having a resistivity of, for example, 1 Ωcm to 15 Ωcm. The insulating layer BX is made of, for example, silicon oxide. Further, the semiconductor layer SL, for example, is made of monocrystalline silicon. Also, the gate electrode GE1 is made of, for example, polycrystalline silicon (specifically, doped polysilicon in which impurities are introduced or ion-implantation). The thickness of the semiconductor layer SL located in the region 1An is 10 nm to 20 nm. Furthermore, the thickness of the insulating layer BX located in the region 1An is 10 nm to 20 nm. On the other hand, the detail of the gate insulating film GI1 will be described later.

Further, as shown in FIG. 1, the semiconductor base material BM located in the region 1SRn, so as to contact the lower surface BXS2 of the insulating layer BX located in the region 1SRn, p-type well region PW is formed. Then, the p-type well region PW, so as to contact the lower surface BXS2 of the insulating layer BX located in the region 1SRn, p-type ground plane region GP1 is formed. The p-type ground plane region GP1 functions as a back-gate BGE1 of the n-type field effect transistor Q1n formed in the region 1An. Further, the concentration of impurities composing the ground plane region GP1 is higher than the concentration of impurities composing the well region PW As shown in FIG. 1, the sidewall spacer SW is formed on the sidewall of the gate electrode GE1 composing the n-type field effect transistor Q1n formed in the region 1An. The sidewall spacer SW is comprised of an offset spacer IF3 formed on the sidewall of the gate electrode GE1 and an insulating film IF4 formed on the sidewall of the gate electrode GE1 through the offset spacer IF3, as shown in FIG. 1. Here, the offset spacer IF3 is, for example, an insulating film made of silicon oxide. The insulating film IF4, for example, an insulating film made of silicon nitride. Further, as shown in FIG. 1, on the surface exposed from the gate electrode GE1 and the offset spacer IF3 of the semiconductor layer SL located in the region 1An, the epitaxial grown layer EP is formed. The epitaxial growth layer EP is obtained by performing an epitaxial growth process on the surface of the semiconductor layer SL exposed from the gate electrode GE1 and the offset spacer IF3. Then, a part of the epitaxially growth layer EP, as shown in FIG. 1, is covered with an insulating film IF4 composing the sidewall spacer SW.

Further, as shown in FIG. 1, the region overlapping the offset spacer IF3 of the semiconductor layer SL formed in the region 1An, the extension region EX1 is formed. Specifically, the extension area EX1 is formed self-aligned with respect to the gate electrode GE1 as shown in FIG. 1. Incidentally, the extension area EX1 is made of an impurity of a conductivity type having a certain concentration. Since the field effect transistor Q1n formed in the region 1An is an n-type field effect transistor, the impurity composing the extension region EX1 is an n-type. The extension region EX1 is a region formed by an implantation condition in which the implantation energies of the above-mentioned impurities are, for example, 5 keV to 25 keV, and the dose of the above-mentioned impurities is, for example, about $1 \times 10^{14}$ cm$^{-2}$.

Further, as shown in FIG. 1, a region overlapping the epitaxial growth layer EP of the semiconductor layer SL formed in the region 1An (i.e., a region not overlapping the offset spacer IF3), the epitaxial growth layer EP, the diffusion layer SD1 is formed. Note that the polarity of the impurity composing the diffusion layer SD1 is the same as that of the impurity composing the extension region EX1 That is, the impurity composing the diffusion layer SD1 is n-type. The diffusion layer SD1 is made of an impurity of a conductivity type having a concentration higher than the concentration of the impurity composing the extension region EX1. Specifically, the diffused region SD1 is a region formed under an implantation condition in which the implantation energies of the above-mentioned impurities are, for example, 5 keV to 25 keV, and the dosage of the above-mentioned impurities is, for example, about $1 \times 10^{15}$ cm$^{-2}$. Semiconductor region SDR1 forming the source/drain of n-type field effect transistor Q1n formed in region 1An includes the above-described extension region EX1 and the diffusion layer SD1.

As shown in FIG. 1, the p-type well region PW is also formed in the region 1TAn for supplying the back-gate voltage Vbg2 to the n-type field effect transistor Q1n formed in the region 1An. That is, the p-type well region PW is formed in the region 1SRn including the two regions 1An and 1TAn. As shown in FIG. 1, the p-type ground plane region GP1 is also formed in the p-type well region PW located in the region 1TAn. Incidentally, as shown in FIG. 1, the region 1TAn, the semiconductor layer SL and the insulating layer BX is not formed. On the other hand, as shown in FIG. 1, the epitaxial growth layer EP is also formed on the surface of the semiconductor base material BM located in the region 1TAn and exposed from the element isolation portion STI. Then, the epitaxial growth layer EP formed on the region 1TAn, the diffusion layer SD2 is formed. The polarity of the impurities composing this diffusion layer SD2 is different from that of the impurities composing the diffusion layer SD1 described above. That is, the impurity composing the diffusion layer SD2 is p-type. The diffused region SD2 is a region formed under an implantation condition in which the implantation energies of the above-mentioned impurities are, for example, 2 keV to 25 keV, and the dose of the above-mentioned impurities is, for example, about $1 \times 10^{15}$ cm$^{-2}$.

<Field Effect Transistor Q1P of Present Embodiment>

Next, the p-type field effect transistor Q1p formed in 1SRp of the region of the SOI area 1SR will be described.

As shown in FIG. 1, the p-type field effect transistor Q1p formed in the SOI region 1SR has a semiconductor base material BM located in the region 1Ap, the insulating layer BX formed on the semiconductor base material BM located in the region 1Ap, a semiconductor layer SL formed on the insulating layer BX located in the region 1Ap, and a gate electrode GE2 formed on the semiconductor layer SL located in the region 1Ap via a gate insulating film GI2, similarly to the n-type field effect transistor Q1n formed in the region 1An. The semiconductor base material BM, the insulating layer BX, the semiconductor layer SL, and the gate electrode GE2, which respectively constitute the p-type field effect transistor Q1p formed in the region 1Ap, are made of the same materials as the semiconductor base material BM, the insulating layer BX, the semiconductor layer SL, and the gate electrode GE1, which respectively constitute the n-type field effect transistor Q1n formed in the region 1An. The insulating layer BX and the semiconductor layer SL respectively composing the p-type field effect transistor Q1p formed in the region 1Ap have the same thickness as the insulating layer BX and the semiconductor layer SL respectively composing the n-type field effect transistor Q1n formed in the region 1An. On the other hand, detailed gate insulating film GI2 will be described later.

Further, as shown in FIG. 1, the semiconductor base material BM located in the region 1SRp, so as to contact the lower surface BXS2 of the insulating layer BX located in the region 1SRp, n-type well region NW is formed. Then, the n-type well region NW, so as to contact the lower surface BXS2 of the insulating layer BX located in the region 1SRp, n-type ground plane region GP2 is formed. The n-type ground plane region GP2 functions as a back-gate BGE2 of the p-type field effect transistor Q1p formed in the region 1Ap. Further, the concentration of impurities composing the ground plane region GP2 is higher than the concentration of impurities composing the well region NW As shown in FIG. 1, the sidewall spacer SW is formed on the sidewall of the gate electrode GE2 composing the p-type field effect transistor Q1p formed in the region 1Ap, similarly to the n-type field effect transistor Q1n formed in the region 1An. The sidewall spacer SW is comprised of an offset spacer IF3 formed on the sidewall of the gate electrode GE2 and an insulating film IF4 formed on the sidewall of the gate electrode GE2 through the offset spacer IF3, as shown in FIG. 1. Note that the offset spacer IF3 and the insulating film IF4 which respectively constitute the p-type field effect transistor Q1p formed in the region 1Ap are made of the same materials as the offset spacer IF3 and the insulating film IF4 which respectively constitute the n-type field effect transistor Q1n formed in the region 1An. Further, as shown in FIG. 1, on the surface exposed from the gate electrode GE2 and the offset spacer IF3 of the semiconductor layer SL located in the region 1Ap, the epitaxial grown layer EP is formed. The epitaxial growth layer EP is obtained by performing an epitaxial growth process on the surface of the semiconductor layer SL exposed from the gate electrode GE2 and the offset spacer IF3. Then, a part of the epitaxial grown layer EP, as shown in FIG. 1, is covered with an insulating film IF4 composing the sidewall spacer SW.

Further, as shown in FIG. 1, the region overlapping the offset spacer IF3 of the semiconductor layer SL formed in the region 1Ap, the extension region EX2 is formed. Specifically, the extension area EX2 is formed self-aligned with respect to the gate electrode GE2 as shown in FIG. 1. Incidentally, the extension area EX2 is made of an impurity of a conductivity type having a certain concentration. Since the field effect transistor Q1p formed in the region 1Ap is a p-type field effect transistor, the impurity composing the extension region EX2 is a p-type. The extension region EX2 is a region formed by an implantation condition in which the implantation energies of the above-mentioned impurities are, for example, 5 keV to 25 keV, and the dose of the above-mentioned impurities is, for example, about $1 \times 10^{14}$ cm$^{-2}$.

Further, as shown in FIG. 1, a region overlapping the epitaxial growth layer EP of the semiconductor layer SL formed in the region 1Ap (i.e., a region that does not overlap with the offset spacer IF3), the epitaxial growth layer EP, the diffusion layer SD2 is formed. The polarity of the impurity composing the diffusion layer SD2 is the same as the polarity of the impurity composing the extension region EX2. That is, the impurity composing the diffusion layer SD2 is p-type. The diffusion layer SD2 is made of an impurity of a conductivity type having a concentration higher than the concentration of the impurity composing the extension region EX2. Specifically, the diffused region SD2 is a region formed under an implantation condition in which the implantation energies of the above-mentioned impurities are, for example, 2 keV to 25 keV, and the dosage of the above-mentioned impurities is, for example, about $1\times10^{15}$ cm$^{-2}$. The semiconductor region SDR2 serving as the source or drain of the p-type field effect transistor Q1$p$ formed in the region 1Ap includes the above-described extension region EX2 and the diffusion layer SD2.

As shown in FIG. 1, the n-type well region NW is also formed in the region 1TAp for supplying the back-gate voltage Vbg1 to the n-type field effect transistor Q1$p$ formed in the region 1Ap. That is, the n-type well region NW is formed in the region 1SRp including the two regions 1Ap and 1TAp. As shown in FIG. 1, the n-type ground plane region GP2 is also formed in the n-type well region NW located in the region 1TAp. Incidentally, as shown in FIG. 1, the region 1TAp, the semiconductor layer SL and the insulating layer BX is not formed. On the other hand, as shown in FIG. 1, the epitaxial growth layer EP is also formed on the surface of the semiconductor base material BM located in the region 1TAp and exposed from the element isolation portion STI. Then, the epitaxial growth layer EP formed on the region 1TAp, the diffusion layer SD1 is formed. The polarity of the impurities composing this diffusion layer SD1 is different from that of the impurities composing the diffusion layer SD2 described above. That is, the impurity composing the diffusion layer SD1 is n-type. The diffused region SD1 is a region formed under an implantation condition in which the implantation energies of the above-mentioned impurities are, for example, 5 keV to 25 keV, and the dose of the above-mentioned impurities is, for example, about $1\times10^{15}$ cm$^{-2}$.

<Field Effect Transistor Q2$n$ of Present Embodiment>

Next, the n-type field effect transistor Q2$n$ formed in 2BRn of the region of the bulk region 2BR, it will be described.

As shown in FIG. 1, the n-type field effect transistor Q2$n$ formed in the bulk region 2BR has a semiconductor base material BM located in a region 2An, and gate electrodes GE3 formed on the semiconductor base material BM located in the region 2An via a gate insulating film GI3. The semiconductor base material BM and the gate electrode GE3 respectively composing the n-type field effect transistor Q2$n$ formed in the region 2An are made of the same materials as the semiconductor base material BM and the gate electrode GE1 respectively composing the n-type field effect transistor Q1$n$ formed in the region 1An. On the other hand, detailed gate insulating film GI3 will be described later.

Further, as shown in FIG. 1, the semiconductor base material BM located in the region 2BRn (i.e., region 2An), so as to contact the lower surface GIS of the gate insulating film GI3 located in the region 2BRn, p-type well region PW is formed.

As shown in FIG. 1, the sidewall spacer SW is formed on the sidewall of the gate electrode GE3 composing the n-type field effect transistor Q2$n$ formed in the region 2An, similarly to the n-type field effect transistor Q1$n$ formed in the region 1An. The sidewall spacer SW is comprised of an offset spacer IF3 formed on the sidewall of the gate electrode GE3 and an insulating film IF4 formed on the sidewall of the gate electrode GE3 through the offset spacer IF3, as shown in FIG. 1. Note that the offset spacer IF3 and the insulating film IF4 which respectively constitute the n-type field effect transistor Q2$n$ formed in the region 2An are made of the same materials as the offset spacer IF3 and the insulating film IF4 which respectively constitute the n-type field effect transistor Q1$n$ formed in the region 1An. In the present embodiment, as shown in FIG. 1, although an epitaxial growth layer is not formed on the surface of the semiconductor base material BM located in the region 2An exposed from the gate electrode GE3 and the sidewall spacer SW, an epitaxial growth layer may be formed on the surface of the semiconductor base material BM exposed from the gate electrode GE3 and the sidewall spacer SW, similarly to the field effect transistors Q1$n$ and Q1$p$ formed in the SOI region 1SR.

Further, as shown in FIG. 1, the region overlapping the sidewall spacer SW of the semiconductor base material BM formed in the region 2An (i.e., the well region PW formed in the region 2An), the extension region EX3 is formed. Specifically, the extension area EX3 is formed self-aligned with respect to the gate electrode GE3 as shown in FIG. 1. Incidentally, the extension area EX3 is made of an impurity of a conductivity type having a certain concentration. Since the field effect transistor Q2$n$ formed in the region 2An is an n-type field effect transistor, the impurity composing the extension region EX3 is an n-type. The extension region EX3 is a region formed by an implantation condition in which the implantation energies of the above-mentioned impurities are, for example, 5 keV to 50 keV, and the dose of the above-mentioned impurities is, for example, about $1\times10^{14}$ cm$^{-2}$.

Further, as shown in FIG. 1, the region that does not overlap with the sidewall spacer SW of the semiconductor base material BM formed in the region 2An, the diffusing layer SD3 is formed. Specifically, the diffusion layer SD3 is formed self-aligned with respect to the sidewall spacer SW formed on the sidewall of the gate electrode GE3 as shown in FIG. 1. Note that the polarity of the impurity composing the diffusion layer SD3 is the same as that of the impurity composing the extension region EX3 That is, the impurity composing the diffusion layer SD3 is n-type. The diffusion layer SD3 is made of an impurity of a conductivity type having a concentration higher than the concentration of the impurity composing the extension region EX3. Specifically, the diffused region SD3 is a region formed under an implantation condition in which the implantation energies of the above-mentioned impurities are, for example, 5 keV to 25 keV, and the dosage of the above-mentioned impurities is, for example, about $1\times10^{15}$ cm$^{-2}$. Semiconductor region SDR3 forming the source/drain of n-type field effect transistor Q2$n$ formed in region 2An includes the above-described extension region EX3 and diffusion layer SD3.

<Field Effect Transistor Q2$p$ of Present Embodiment>

Next, a p-type field effect transistors Q2$p$ formed in the region 2BRp of the bulk region 2BR will be described.

As shown in FIG. 1, the p-type field effect transistor Q2$p$ formed in the bulk region 2BR has a semiconductor base material BM located in a region 2Ap, and gate electrodes GE4 formed on the semiconductor base material BM located in the region 2Ap via a gate insulating film GI4. The semiconductor base material BM and the gate electrode GE4 respectively composing the p-type field effect transistor Q2$p$ formed in the region 2Ap are made of the same materials as the semiconductor base material BM and the gate electrode GE3 respectively composing the n-type field effect transistor Q2$n$ formed in the region 2An. On the other hand, the detail of the gate insulating film GI4 will be described later.

Further, as shown in FIG. 1, the semiconductor base material BM located in the region 2BRp (i.e., region 2Ap), so as to contact the lower surface GIS of the gate insulating film GI3 located in the region 2BRp, n-type well region NW is formed.

As shown in FIG. 1, the sidewall spacer SW is formed on the sidewall of the gate electrode GE4 composing the p-type field effect transistor Q2p formed in the region 2Ap, similarly to the n-type field effect transistor Q2n formed in the region 2An. The sidewall spacer SW is comprised of an offset spacer IF3 formed on the sidewall of the gate electrode GE4 and an insulating film IF4 formed on the sidewall of the gate electrode GE4 through the offset spacer IF3, as shown in FIG. 1. Note that the offset spacer IF3 and the insulating film IF4 which respectively constitute the p-type field effect transistor Q2p formed in the region 2Ap are made of the same materials as the offset spacer IF3 and the insulating film IF4 which respectively constitute the n-type field effect transistor Q2n formed in the region 2An. In the present embodiment, as shown in FIG. 1, although an epitaxial growth layer is not formed on the surface of the semiconductor base material BM located in the region 2Ap exposed from the gate electrode GE4 and the sidewall spacer SW, an epitaxial growth layer may be formed on the surface of the semiconductor base material BM exposed from the gate electrode GE4 and the sidewall spacer SW, similarly to the field effect transistors Q1n and Q1p formed in the SOI region 1SR.

Further, as shown in FIG. 1, the region overlapping the sidewall spacer SW of the semiconductor base material BM formed in the region 2Ap (i.e., the well region NW formed in the region 2Ap), the extension region EX4 is formed. Specifically, the extension area EX4 is formed self-aligned with respect to the gate electrode GE4 as shown in FIG. 1. Incidentally, the extension area EX4 is made of an impurity of a conductivity type having a certain concentration. Since the field effect transistor Q2p formed in the region 2Ap is a p-type field effect transistor, the impurity composing the extension region EX4 is a p-type. The extension region EX4 is a region formed by an implantation condition in which the implantation energies of the above-mentioned impurities are, for example, 5 keV to 30 keV, and the dose of the above-mentioned impurities is, for example, about $1 \times 10^{14}$ cm$^{-2}$.

Further, as shown in FIG. 1, the region that does not overlap with the sidewall spacer SW of the semiconductor base material BM formed in the region 2Ap, the diffusing layer SD4 is formed. Specifically, the diffusion layer SD4 is formed self-aligned with respect to the sidewall spacer SW formed on the sidewall of the gate electrode GE4 as shown in FIG. 1. Note that the polarity of the impurity composing the diffusion layer SD4 is the same as that of the impurity composing the extension region EX4 That is, the impurity composing the diffusion layer SD4 is p-type. The diffusion layer SD4 is made of an impurity of a conductivity type having a concentration higher than the concentration of the impurity composing the extension region EX4. Specifically, the diffused region SD4 is a region formed under an implantation condition in which the implantation energies of the above-mentioned impurities are, for example, 2 keV to 25 keV, and the dosage of the above-mentioned impurities is, for example, about $1 \times 10^{15}$ cm$^{-2}$. Semiconductor region SDR4 forming the source/drain of p-type field effect transistor Q2p formed in region 2Ap includes the above-described extension region EX4 and diffusion layer SD4.

Then, as shown in FIG. 1, each gate electrode GE1, GE2, GE3, GE4 composing each field effect transistor Q1n, Q1p, Q2n, Q2p formed in each region 1An, 1Ap, 2Ap, 2An, the sidewall spacer SW formed on the sidewall of each gate electrode GE1, GE2, GE3, GE4, the epitaxial growth layer EP (i.e., diffusion layer SD1, SD2) formed in each region 1An, 1Ap, 1TAn, 1TAp, and the surface of the semiconductor base material BM located in the bulk region 2BR and exposed from each gate electrode GE3, GE4 formed in the bulk region 2BR are covered with an interlayer insulating film IL1. The interlayer insulating film IL1 is made of, for example, silicon oxide. Further, the interlayer insulating film IL1 is formed by CVD method.

Further, the interlayer insulating film IL1, as shown in FIG. 1, the contact holes CH reaching the respective epitaxial growth layer EP and the respective diffusion layer SD3, SD4 from the surface of the interlayer insulating film IL1 is formed. Then, the inside of each contact hole CH, as shown in FIG. 1, the contact plug PG is formed. Incidentally, the contact plug PG, for example, is made of a conductive member such as tungsten (W). In addition, a silicide layer may be formed in a portion of each epitaxial growth layer EP in contact with each contact plug PG, and the contact plug PG may be electrically connected to the epitaxial growth layer EP through the silicide layer. Further, although not shown, the contact holes CH and the contact plugs PG are also formed on the respective gate electrodes GE1, GE2, GE3, GE4.

Then, on the surface of the interlayer insulating film IL1, as shown in FIG. 1, the interlayer insulating film IL2 covering a plurality of wiring WL1 formed in the wiring layer M1 is formed. A plurality of wiring WL1, via a plurality of contact plugs PG, a plurality of epitaxially grown layers EP, are electrically connected, respectively. Although not shown, the wiring layer M1 and the interlayer insulating film IL2 described above are alternately stacked on the interlayer insulating film IL1. That is, the wiring layer M1 and the interlayer insulating film IL2 is formed on the interlayer insulating film IL1 is a contact interlayer insulating layer, a member composing the multilayer wiring layer.

<Each Gate Insulating Film GI1, GI2, GI3, GI4 of Present Embodiment>

Next, each gate insulating film GI1, GI2, GI3, GI4 composing each field effect transistor Q1n, Q1p, Q2n, Q2p will be described in detail.

First, the gate insulating film GI1 composing the n-type field effect transistor Q1n formed in the region 1An, which is the SOI region 1SR, is an insulating film in which hafnium (Hf) is added to the insulating film IF1 made of silicon oxide. Aluminum (Al) is not added to the insulating film IF1 composing the gate insulating film GI1. The gate insulating film GI2 forming the p-type field effect transistor Q1p formed in the region 1Ap as the SOI region 1SR is an insulating film in which aluminum (Al) is added to the insulating film IF1 made of silicon oxide. Note that hafnium (Hf) is not added to the insulating film IF1 composing the gate insulating film GI2. The gate insulating film GI3 forming the n-type field effect transistor Q2n formed in the region 2An, which is the bulk region 2BR, is an insulating film in which aluminum (Al) is added to the insulating film IF2 made of silicon oxide. In the present embodiment, hafnium (Hf) is not added to the insulating film IF2 composing the gate insulating film GI3. Further, the gate insulating film GI4 composing the p-type field effect transistor Q2p formed in the region 2Ap which is the bulk region 2BR is an insulating film in which hafnium (Hf) is added to the insulating film IF2 made of silicon oxide. In the present embodiment, aluminum (Al) is not added to the insulating film IF2 composing the gate insulating film GI4.

Further, as shown in FIG. 1, the thickness of each gate insulating film GI3, GI4 formed on the bulk region 2BR is larger than the thickness of each gate insulating film GI1, GI2 formed on the SOI region 1SR. In the present embodiment, the thickness of the gate insulating film GI1, GI2 formed on the SOI region 1SR is, for example, 1.5 nm to 3.0 nm. On the other hand, the thickness of the gate insulating film GI3, GI4 formed in the bulk region 2BR is, for example, 6.0 nm to 10.0 nm.

Although the specific manufacturing method of the gate insulating film GI1, GI2, GI3, GI4 will be described later, the gate insulating film GI1, GI2, GI3, GI4, hafnium (Hf) or aluminum (Al) is formed by depositing on substantially the entire surface of the corresponding insulating film IF1, IF2 (upper surface). Therefore, in FIG. 1, each gate insulating film GI1, GI2, GI3, GI4 is illustrated as a laminated structure, for convenience, that a metallic film HK1 made of hafnium (Hf) or a metallic film HK2 made of aluminum (Al) is formed (deposited) on the respective insulating film IF1, IF2.

<Result of Present Inventor's Review>

Next, it has been clarified by the study of the present inventor, the threshold voltage of the n-type field effect transistor, the relationship between the respective addition amount of aluminum (Hf) and hafnium (Hf) to be added to the gate insulating film composing the n-type field effect transistor, the threshold voltage of the p-type field effect transistor, hafnium added to the gate insulating film composing the p-type field effect transistor (Hf) and the relationship between the respective addition amount of aluminum (Hf), will be described with reference to FIGS. 3 and 4. Incidentally, FIG. 3 is a graph showing the ratio of the number of atoms of aluminum (Al) to the total number of atoms of aluminum (Al) and hafnium (Hf) in the gate insulating film in the case of adding each of aluminum (Al) and hafnium (Hf), the relationship between the threshold voltage of the n-type field effect transistor. FIG. 4 is a graph showing the relationship between the ratio of the number of atoms of hafnium (Hf) to the total number of atoms of aluminum (Al) and hafnium (Hf) and the threshold voltage of the p-type field effect transistor when aluminum (Al) and hafnium (Hf) are added to the gate insulating film.

First, as shown in FIG. 3, in the n-type field effect transistor, when both aluminum (Al) and hafnium (Hf) are added to the gate insulating film, the threshold voltage of the n-type field effect transistor becomes lower as the ratio of the number of atoms of hafnium (Hf) to the total number of atoms of aluminum (Al) and hafnium (Hf) (i.e., the concentration of hafnium) is larger than the ratio of the number of atoms of aluminum (Al) (i.e., the concentration of aluminum). That is, in the n-type field effect transistor, as shown in FIG. 3, the smaller the amount of aluminum (Al) added to the gate insulating film, the threshold voltage of the n-type field effect transistor is low.

On the other hand, as shown in FIG. 4, in the n-type field effect transistor, the gate insulating film, when adding both aluminum (Al) and hafnium (Hf), the ratio of the number of atoms of aluminum (Al) to the total number of atoms of aluminum (Al) and hafnium (Hf) (i.e., the concentration of aluminum) is hafnium (Hf) as large as the ratio of the number of atoms (i.e., the concentration of hafnium), the threshold voltage of the n-type field effect transistor is low. That is, in the p-type field effect transistor, as shown in FIG. 4, the smaller the amount of hafnium added to the gate insulating film (Hf), the threshold voltage of the n-type field effect transistor is low.

Effect Due to Semiconductor Device SMD1 of Present Embodiment

As described above, in the present embodiment, as the gate insulating film GI1 composing the n-type field effect transistor Q1n formed in the region 1An which is the SOI region 1SR, an insulating film (so-called high dielectric constant insulating film) that is the insulating film IF1 made of silicon oxide, and to which hafnium (Hf) is added (deposited) without addition (deposition) of aluminum (Al) is used. Then, as shown in FIG. 1, the gate electrodes GE1 composing the n-type field effect transistors Q1n are formed on the semiconductor layer SL located in the region 1An, which is the SOI region 1SR, via the gate insulating film GI1, which is the high dielectric constant insulating film, described above. Therefore, as shown in FIG. 3, the threshold voltage of the n-type field effect transistor Q1n formed in the region 1An can be lowered. As a result, the driving voltage of the n-type field effect transistor Q1n formed in the region 1An can be reduced, that is, the power consumption can be reduced. In other words, the operation speed of the n-type field effect transistor Q1n formed in the region 1An can be improved.

In the present embodiment, as the gate insulating film GI2 composing the p-type field effect transistor Q1p formed in the region 1Ap which is the SOI region 1SR, an insulating film (so-called high dielectric constant insulating film) that is the insulating film IF1 made of silicon oxide, and to which aluminum (Al) is added (deposited) without addition (deposition) of hafnium (Hf) is used. Then, as shown in FIG. 1, the gate electrodes GE2 composing the p-type field effect transistors Q1p are formed on the semiconductor layer SL located in the region 1Ap which is the SOI region 1SR via the gate insulating film GI2 which is the high dielectric constant insulating film described above. Therefore, as shown in FIG. 4, the threshold voltage of the p-type field effect transistor Q1p formed in the region 1Ap can be lowered. As a result, the driving voltage of the p-type field effect transistor Q1p formed in the region 1Ap can be reduced, that is, the power consumption can be reduced. In other words, the operation speed of the p-type field effect transistor Q1p formed in the region 1Ap can be improved. Incidentally, the above NBTI, when adding a stress such as voltage or temperature to the p-channel type field effect transistor, with the lapse of time, the threshold voltage of the field effect transistor is a phenomenon that varies. Then, this NBTI, the higher the voltage value applied to the p-type field effect transistor becomes remarkable. On the other hand, as described above, in recent years, further reduction in power consumption of semiconductor device is required. For this reason, in a semiconductor device in which low power consumption measures are particularly required, it is preferable to use an insulating film in which aluminum (Al) is added (deposited) without hafnium (Hf) being added to the insulating film IF1 made of silicon oxide as the gate insulating film GI2 composing the p-type field effect transistor Q1p formed in the region 1Ap which is the SOI region 1SR, as in the present embodiment.

Further, as described above, in the present embodiment, an insulating film that is the insulating film IF1 made of silicon oxide, and to which hafnium (Hf) is added (deposited) without addition of aluminum (Al) is used as the gate insulating film GI1 composing the n-type field effect transistor Q1n formed in the region 1An which is the SOI region 1SR, while, an insulating film that is the insulating film IF1 made of silicon oxide, and to which aluminum (Al) is added (deposited) without addition of hafnium (Hf) is used as the gate insulating film GI2 composing the p-type field effect transistor Q1p formed in the region 1Ap which is the SOI region 1SR. Therefore, the driving voltage of the SRAM circuit including the n-type field effect transistor Q1n and the p-type field effect transistor Q1p can be reduced. In other words, the operation speed of SRAM circuit can be improved.

In the present embodiment, as the gate insulating film GI3 forming the n-type field effect transistor Q2n formed in the region 2An as the bulk region 2BR, an insulating film in which at least aluminum (Al) is added (deposited) on the insulating film IF2 made of silicon oxide is used. In the present embodiment, an insulating film in which at least hafnium (Hf) is added (deposited) on the insulating film IF2 made of silicon oxide is used as the gate insulating film GI4 composing the p-type field effect transistor Q2p formed in the region 2Ap which is the bulk region 2BR. Therefore, the threshold voltage of the n-type field effect transistor Q2n formed in the region 2An is higher than the threshold voltage of the n-type field effect transistor Q1n formed in the region 1An. Similarly, the threshold voltage of the p-type field effect transistor Q2n formed in the region 2Ap is higher than the threshold voltage of the p-type field effect transistor Q1p formed in the region 1Ap. That is, in the present embodiment, the threshold voltage of each of the field effect transistors Q2n and Q2p formed in the bulk region 2BR is set higher than the threshold voltage of each of the field effect transistors Q1n and Q1p formed in the SOI region 1SR.

Here, as described above, each of the n-type field effect transistor Q2n and the p-type field effect transistor Q2p formed in the bulk region 2BR is a field effect transistor that constitutes a peripheral circuit whose drive voltage is higher than the drive voltage of SRAM circuit composed of each of the n-type field effect transistor Q1n and the p-type field effect transistor Q1p formed in the SOI region 1SR. Like the field effect transistors Q1n and Q1p formed in the SOI region 1SR, the SOI region does not have the ground plane region GP1, GP2 functioning as the back-gate BGE1, BGE2. Therefore, if the threshold voltage of the n-type field effect transistor Q2n and the p-type field effect transistor Q2p formed in the bulk region 2BR are lowered, a leakage current (sub-threshold leakage current) may occur between the sources and the drains of the field effect transistors Q2n and Q2p formed in the bulk region 2BR. Further, in the present embodiment, the thickness of the insulating layer BX composing the field effect transistors Q1n and Q1p formed on the SOI region 1SR is as thin as 10 nm to 20 nm. Therefore, if the field effect transistors Q1n and Q1p adopt the same driving voltage as the driving voltage of the peripheral circuit, the insulating layers BX formed in the SOI region 1SR may be damaged (so-called Time Dependent Dielectric Breakdown: TDDB).

However, in the present embodiment, as shown in FIG. 1, each of the field effect transistors Q1n and Q1p formed in the SOI region 1SR has a ground plane region GP1, GP2 functioning as the back-gate BGE1, BGE2 of each of the field effect transistors Q1n and Q1p on the lower surface of the insulating layer BX. Therefore, even if the threshold voltage of each of the field effect transistors Q1n and Q1p is lowered, it is possible to suppress the occurrence of a leakage current between the source and the drain of each of the field effect transistors Q1n and Q1p. In addition, since the driving voltage of the SRAM circuit composed of the n-type field effect transistor Q1n and the p-type field effect transistor Q1p formed in the SOI region 1SR can be lowered, the above-described TDDB can be suppressed from occurring in the field effect transistors Q1n and Q1p. In the present embodiment, as described above, the threshold voltage of each of the field effect transistors Q2n and Q2p formed in the bulk region 2BR is higher than the threshold voltage of each of the field effect transistors Q1n and Q1p formed in the SOI region 1SR. Therefore, it is possible to suppress the occurrence of a leakage current between the sources and the drains of the field effect transistors Q2n and Q2p formed in the bulk region 2BR.

In the present embodiment, the thickness of each gate insulating film GI1, GI2 formed in the SOI region 1SR is, for example, 1.5 nm to 3.0 nm, while the thickness of each gate insulating film GI3, GI4 formed in the bulk region 2BR is, for example, 6.0 nm to 10.0 nm. In the present embodiment, as shown in FIG. 1, the thickness of the gate insulating film GI3, GI4 composing each of the field effect transistors Q2n and Q2p formed in the bulk region 2BR is larger than the thickness of the gate insulating film GI1, GI2 composing each of the field effect transistors Q1n and Q1p formed in the SOI region 1SR. Therefore, the breakdown voltage of the field effect transistors Q2n and Q2p formed in the bulk region 2BR can be ensured. That is, even if a drive voltage higher than the drive voltage of SRAM circuit composed of the n-type field effect transistor Q1n and the p-type field effect transistor Q1p formed in the SOI region 1SR is employed in the peripheral circuit composed of the n-type field effect transistor Q2n and the p-type field effect transistor Q2p formed in the bulk region 2BR, the gate insulating film GI3, GI4 of the field effect transistors Q2n and Q2p formed in the bulk region 2BR can be suppressed from being damaged.

<Method of Manufacturing Semiconductor Device SMD1 of Present Embodiment>

Figure 5:
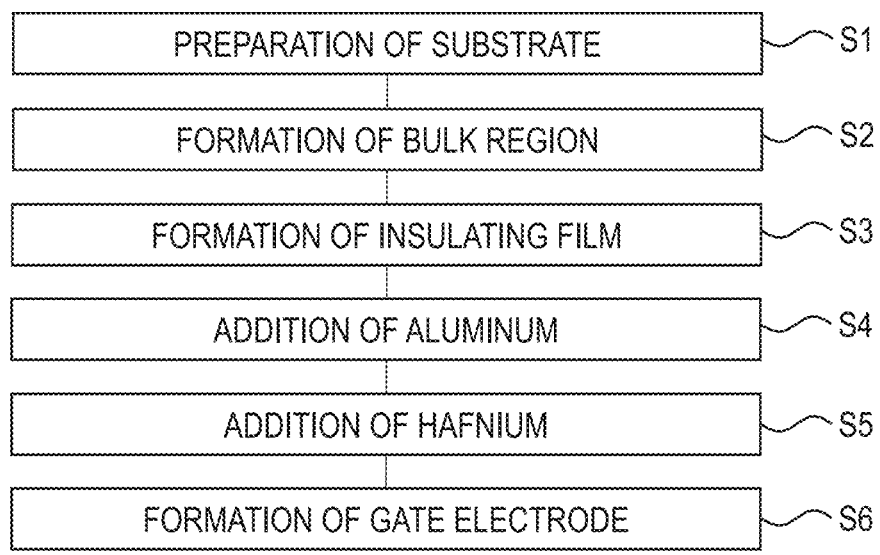
FIG. 5 is a process flow diagram showing a manufacturing process of the semiconductor device according to the one embodiment.

Next, a method of manufacturing the semiconductor device SMD1 of the present embodiment will be described with reference to FIGS. 5 to 15. FIG. 5 is a process flow diagram showing a manufacturing process of the semiconductor device SMD1 of the present embodiment. FIGS. 6 to 15 are a cross-sectional view of the semiconductor device of the present embodiment during the manufacturing process.

1. Preparation of Substrate (Step S1 in FIG. 5)

Figure 6:
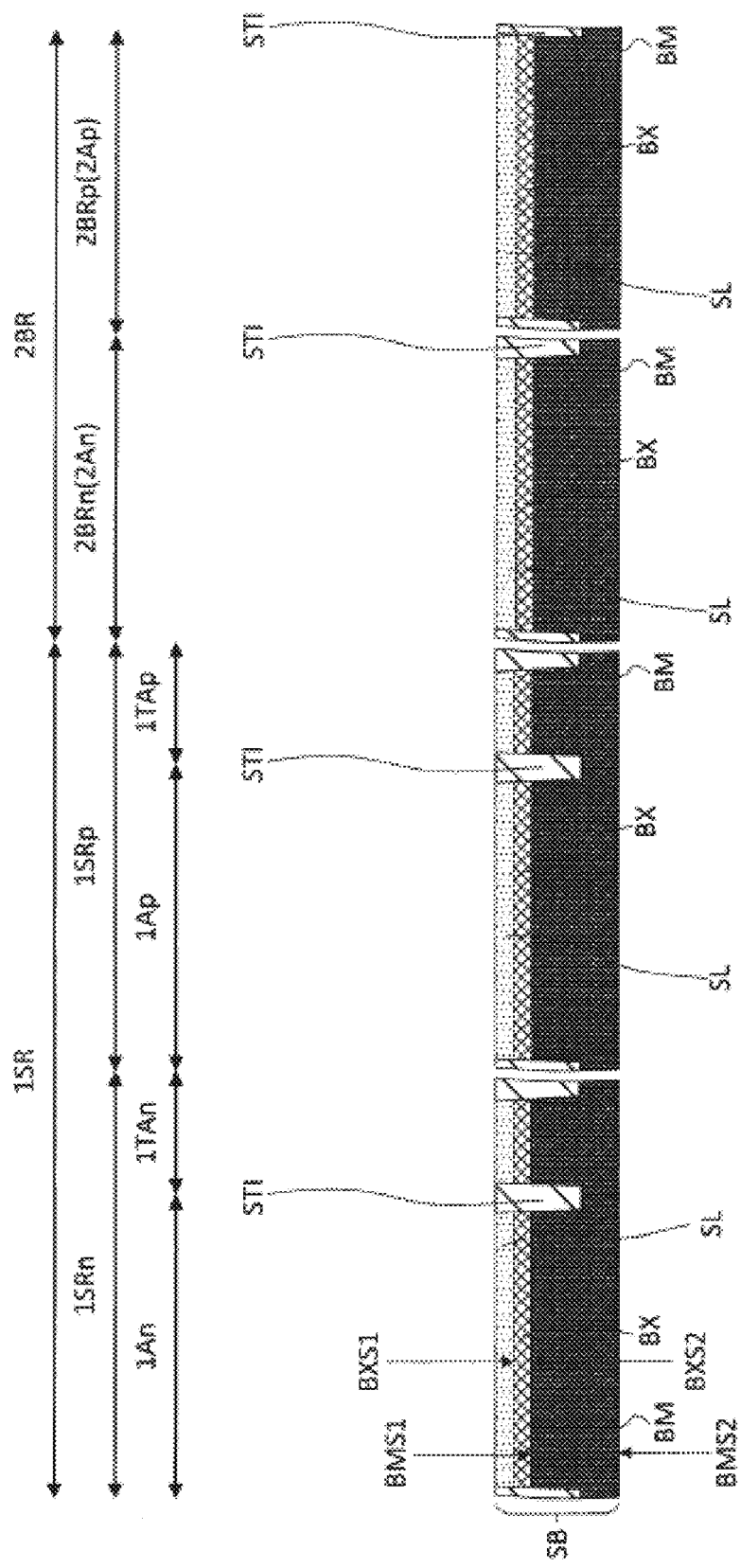
FIG. 6 is a cross-sectional view of the semiconductor device according to one embodiment during the manufacturing process.

First, a substrate SB is prepared. Specifically, in the present embodiment, as shown in FIG. 6, the substrate SB having at least four regions 1SRn, 1SRp, 2BRn, 2BRp is prepared. As shown in FIG. 6, the region 1SRn, which is the SOI region 1SR, has the region 1An in which an n-type field effect transistor Q1n shown in FIG. 1 is to be formed later, and the region 1TAn for supplying the back gate voltage Vbg2 to the n-type field effect transistor Q1n to be formed in the region 1An. As shown in FIG. 6, the region 1SRp, which is the SOI region 1SR, has the region 1Ap in which a p-type field effect transistor Q1p shown in FIG. 1 is to be formed later, and the region 1TAp for supplying a back-gate voltage Vbg1 to the p-type field effect transistor Q1p to be formed in the region 1Ap. The region 2BRn, which is the bulk region 2BR, is the region 2An in which an n-type field effect transistor Q2n shown in FIG. 1 is to be formed later. The region 2BRp, which is the bulk region 2BR, is the region 2Ap in which a p-type field effect transistor Q2p shown in FIG. 1 is to be formed later.

Further, as shown in FIG. 6, the substrate SB includes a semiconductor base material BM, an insulating layer BX formed on the semiconductor base material BM, and a semiconductor layer SL formed on the insulating layer BX, so-called SOI (Silicon On Insulator) substrate. As shown in FIG. 6, the semiconductor base material BM has an upper surface (front surface) BMS1 and a lower surface (back surface) BMS2 opposite to upper surface BMS1, and the insulating layers BX are formed on upper surface BMS1 of the semiconductor base material BM. As shown in FIG. 6, the insulating layer BX has a lower surface BXS2 opposite to upper surface BXS1 and upper surface BXS1, and the semiconductor layer SL is formed on upper surface BXS1 of the insulating layer BX.

Further, as shown in FIG. 6, the element isolation portion STI penetrating through each of the semiconductor layer SL and the insulating layer BX, and reaching the semiconductor base material BM is formed in the substrate SB. Also, the respective regions 1An, 1TAn, 1Ap, 1TAp, 2An, 2Ap are separated from each other by the element isolation portion STI. In the present embodiment, the method of manufacturing the semiconductor device will be explained based on the substrate SB in which the element isolation portion STI is formed.

2. Formation of Bulk Region (Step S2 in FIG. 5)

Next, the semiconductor layer SL located in the region 1TAn, the semiconductor layer SL located in the region 1TAp, the semiconductor layer SL located in the region 2An, and the semiconductor layer SL located in the region 2Ap are removed. Thus, the insulating layer BX located in each region 1TAn, 1TAp, 2An, 2Ap is exposed.

Thereafter, the semiconductor base material BM located in each of the region 1SRn and the region 2BRn where the n-type field effect transistor is formed, to form a well region PW of p-type. On the other hand, the semiconductor base material BM located in each of the region 1SRp and the region 2BRp where the p-type field effect transistor is formed, to form an n-type well region NW. The p-type well region PW is formed by ion-implanting a p-type impurity such as boron (B) into the semiconductor base material BM. On the other hand, the n-type well region NW is formed by ion implanting an n-type impurity such as arsenic (As) or phosphorus (P) into the semiconductor base material BM, for example.

Figure 7:
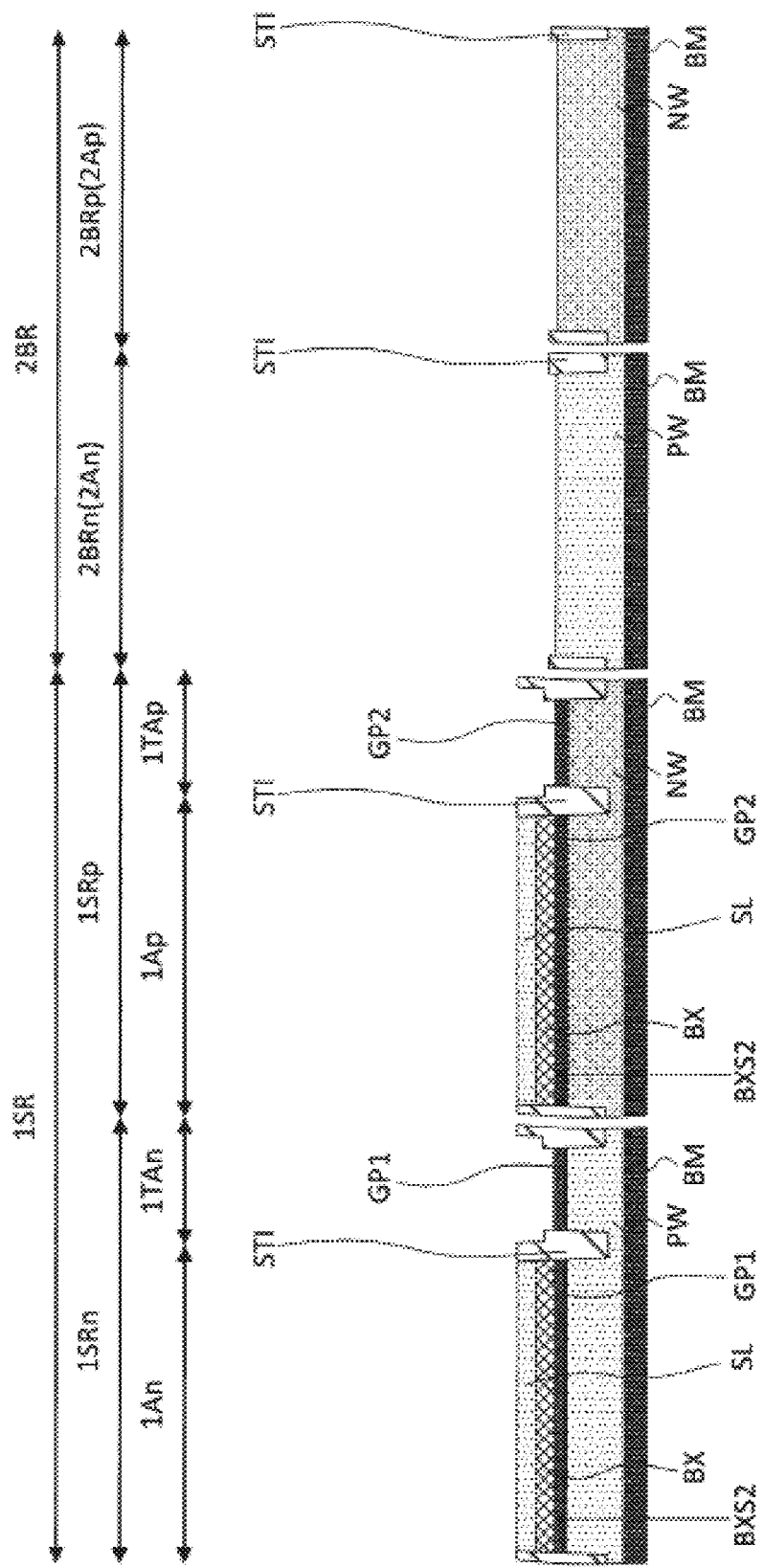
FIG. 7 is a cross-sectional view of the semiconductor device following FIG. 6 during the manufacturing process.

Thereafter, a p-type ground plane region GP1 is formed in the p-type well region PW formed in each of the region 1An and the region 1TAn. At this time, the p-type ground plane region GP1 formed in the region 1An, as shown in FIG. 7, so as to contact the lower surface BXS2 of the insulating layer BX located in the region 1An, p-type well region PW It is formed in. On the other hand, an n-type ground plane region GP2 is formed in the n-type well region NW formed in each of the region 1Ap and the region 1TAp. At this time, n-type ground plane region GP2 formed in the region 1Ap, as shown in FIG. 7, so as to contact the lower surface BXS2 of the insulating layer BX located in the region 1Ap, n-type well region NW It is formed in. The p-type ground plane region GP1 is formed by ion-implanting a p-type impurity such as boron (B) into the p-type well region PW. On the other hand, an n-type ground plane region GP2 is formed by ion-implanting an n-type impurity such as arsenic (As) or phosphorus (P) into an n-type well region NW Further, the concentration of impurities composing the p-type ground plane region GP1 is higher than the concentration of impurities composing the p-type well region PW Further, the concentration of impurities composing the n-type ground plane region GP2 is higher than the concentration of impurities composing the n-type well region NW Thereafter, the insulating layer BXs located in the region 1TAn, region 1TAp, region 2An, and region 2Ap are removed. As a result, the semiconductor base material BM located in the region 1TAn, the semiconductor base material BM located in the region 1TAp, the semiconductor base material BM located in the region 2An, and the semiconductor base material BM located in the region 2Ap is exposed. Specifically, as shown in FIG. 7, the p-type ground plane region GP1 formed in the region 1TAn, the n-type ground plane region GP2 formed in the region 1TAp, the p-type well region PW formed in the region 2An, and the n-type well region NW formed in the region 2Ap are exposed.

3. Formation of Insulating Film (Step S3 in FIG. 5)

Figure 8:
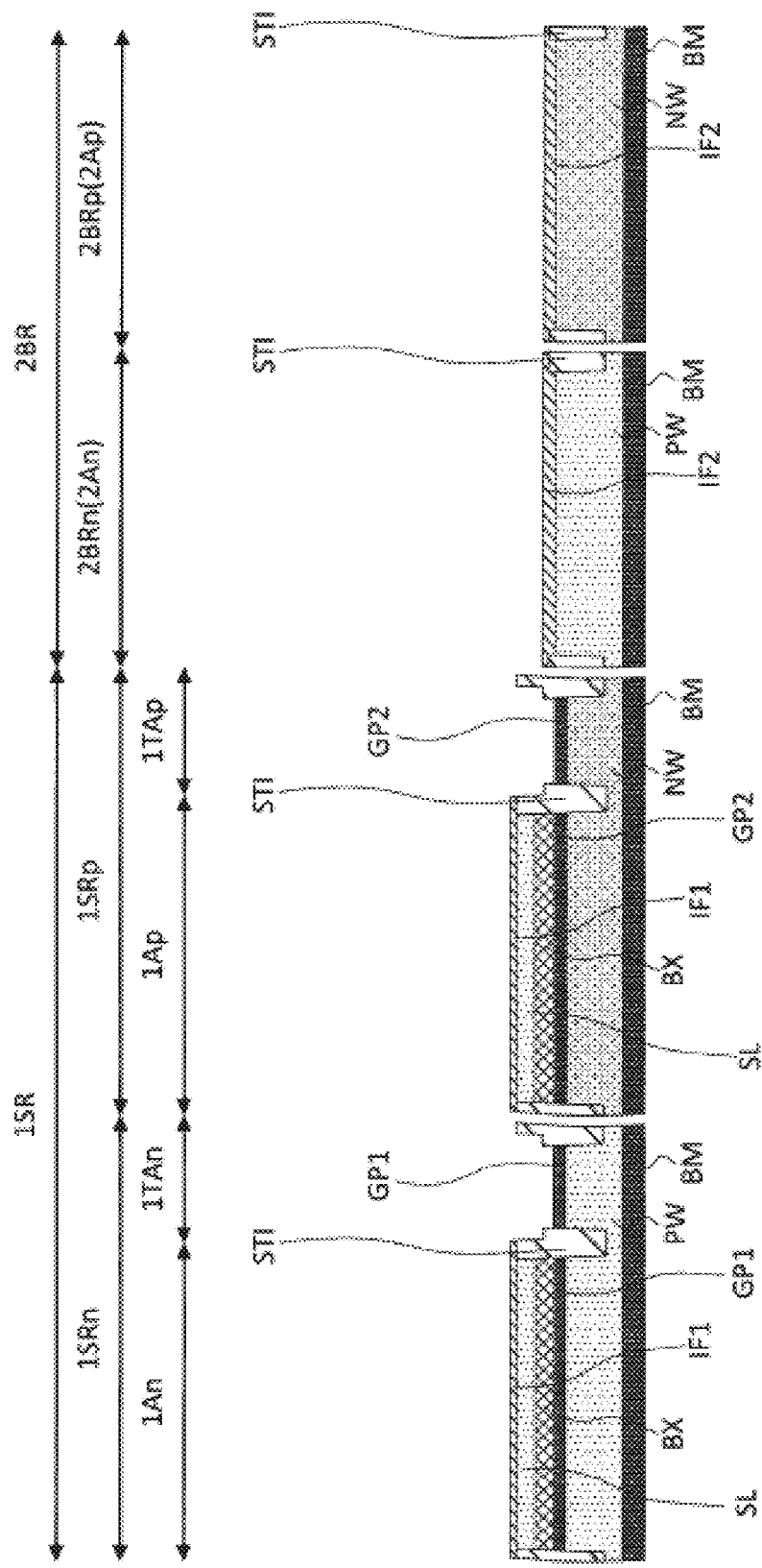
FIG. 8 is a cross-sectional view of the semiconductor device following FIG. 7 during the manufacturing process.

Next, as shown in FIG. 8, on the semiconductor layer SL located in each of the region 1An and the region 1Ap, to form an insulating film IF1 made of silicon oxide. On the other hand, as shown in FIG. 8, on the semiconductor base material BM located in each of the region 2An and the region 2Ap, to form an insulating film IF2 made of silicon oxide. Incidentally, in the present embodiment, as shown in FIG. 8, the thickness of the insulating film IF2 formed in each of the region 2An and the region 2Ap is the bulk region 2BR, the SOI region 1SR than the thickness of the insulating film IF1 formed in each of the region 1An and the region 1Ap is larger.

4. Addition of Aluminum (Step S4 in FIG. 5)

Next, in the SOI region 1SR, and an insulation film IF1 formed in region 1Ap p-type field effect transistors Q1$p$ shown in FIG. 1 is formed, the bulk region 2BR, and n-type field effect transistors Q2$n$ shown in FIG. 1 to an insulation film IF2 formed in region 2An is formed, an aluminum (Al) is added.

Figure 9:
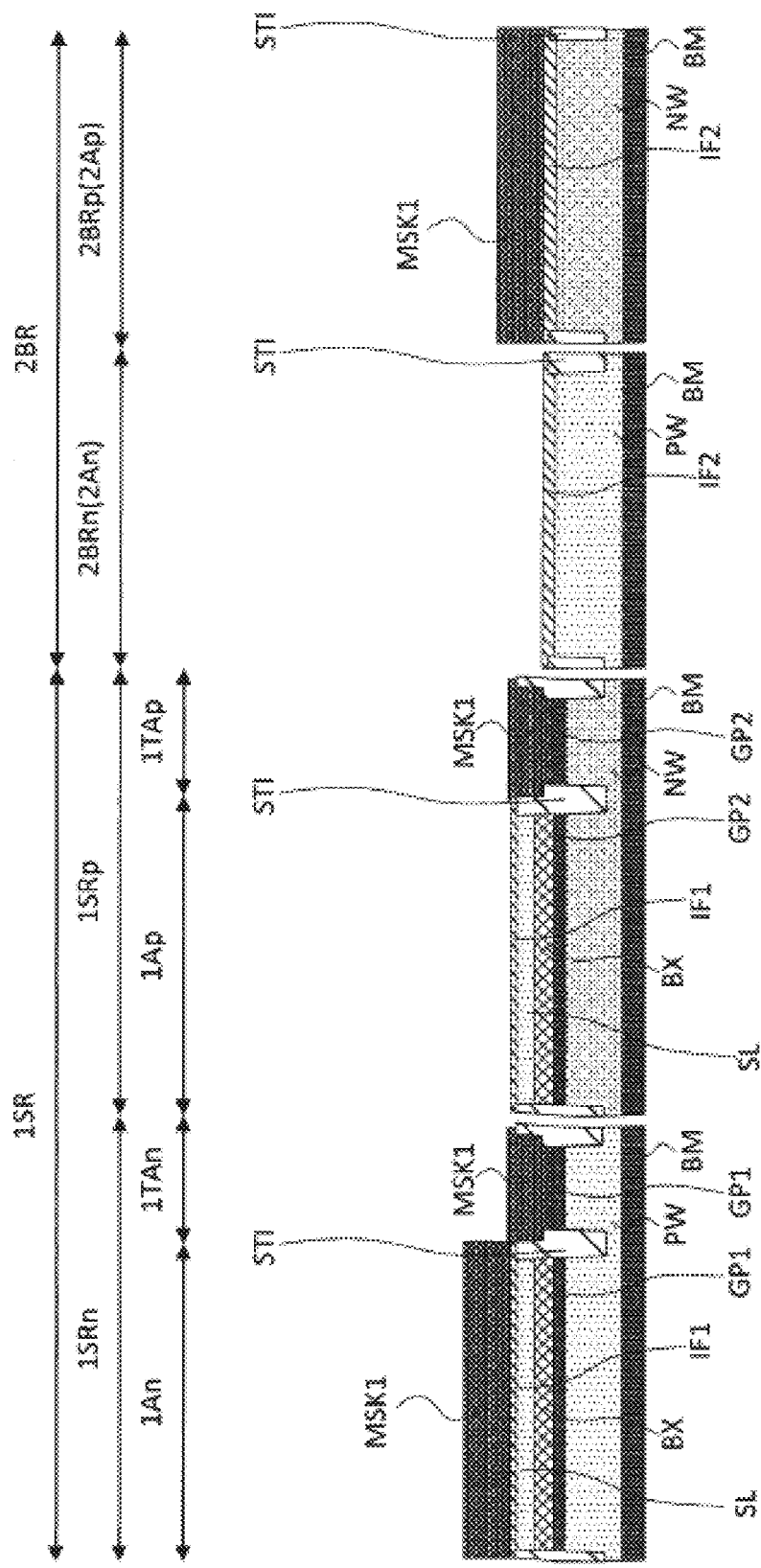
FIG. 9 is a cross-sectional view of the semiconductor device following FIG. 8 during the manufacturing process.

For details, first, as shown in FIG. 9, as the insulating film IF2 located in the insulating film IF1 and the region 2An located in the region 1Ap is exposed, and the insulating film IF2 located in the insulating film IF1 and the region 2Ap located in the region 1An is covered, on the semiconductor layer SL located in the region 1An, on the semiconductor base material BM located in the region 1TAn, on the semiconductor base material BM and the region 2Ap located in the region 1TAp, to form a mask MSK1. The masking MSK1 is made of, for example, amorphous silicon.

Figure 10:
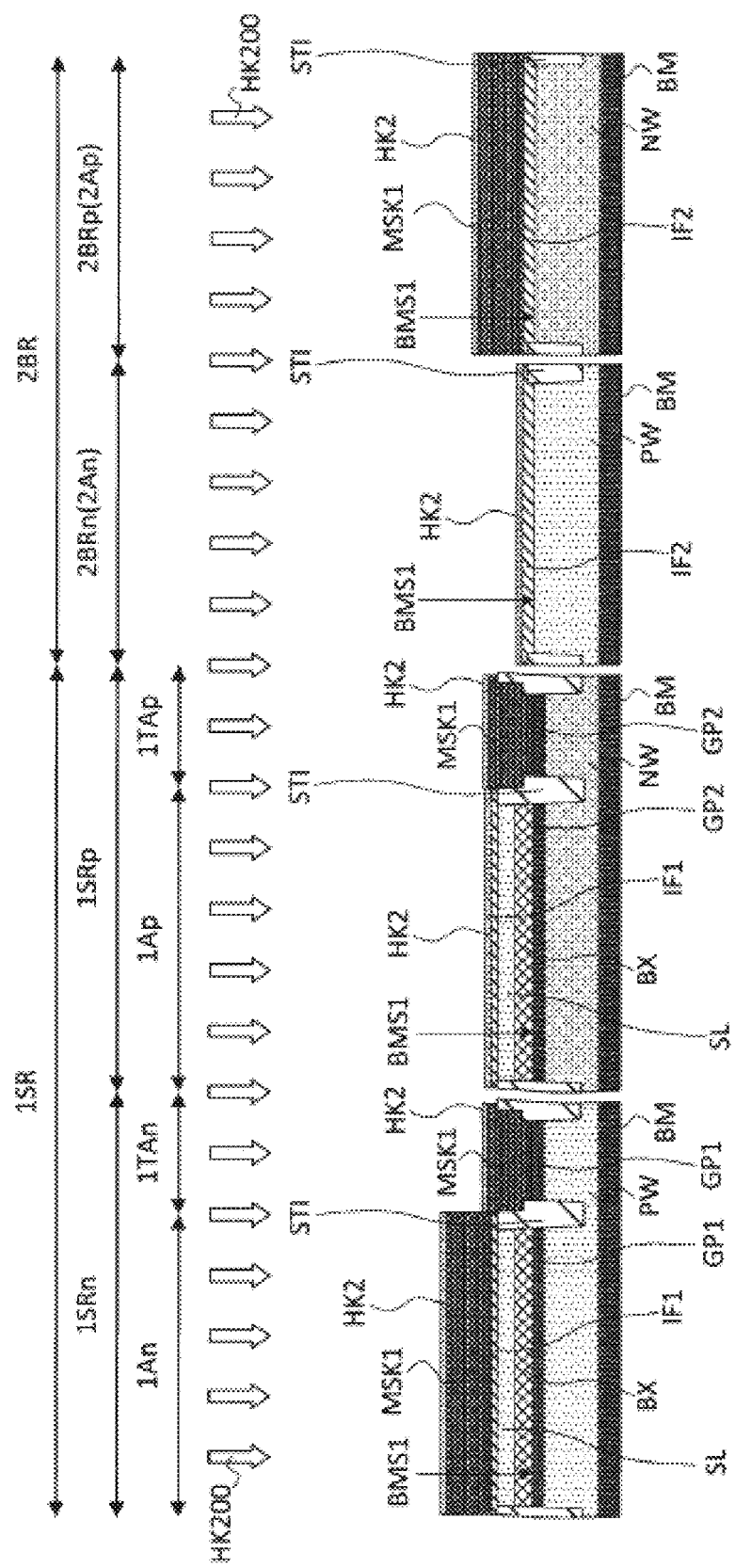
FIG. 10 is a cross-sectional view of the semiconductor device following FIG. 9 during the manufacturing process.

Next, in such a state that the semiconductor layer SL located in the region 1An, the semiconductor base material BM located in the region 1TAn, the semiconductor base material BM located in the region 1TAp, and the semiconductor base material BM located in the region 2Ap are covered with the mask MSK1, aluminum (Al) HK200 is deposited on each of the mask MSK1 located in the region 1An, the insulating film IF1 located in the region 1Ap, the insulating film IF2 located in the region 2An, and the mask MSK1 located in the region 2Ap from the upper surface BMS1 side of the semiconductor base material BM as shown in FIG. 10. That is, an aluminum (Al) HK200 is added to each insulating film IF1, IF2. In the present embodiment, aluminum (Al) HK200 is added to the insulating film IF1, IF2 by, e.g., a sputtering method. Thus, as shown in FIG. 10, a metallic film HK2 made of aluminum (Al) is formed on each of the mask MSK1 formed in the respective regions 1An, 1TAn, 1TAp, 2Ap, the insulating film IF1 located in the region 1Ap, and the insulating film IF2 located in the region 2An.

Figure 11:
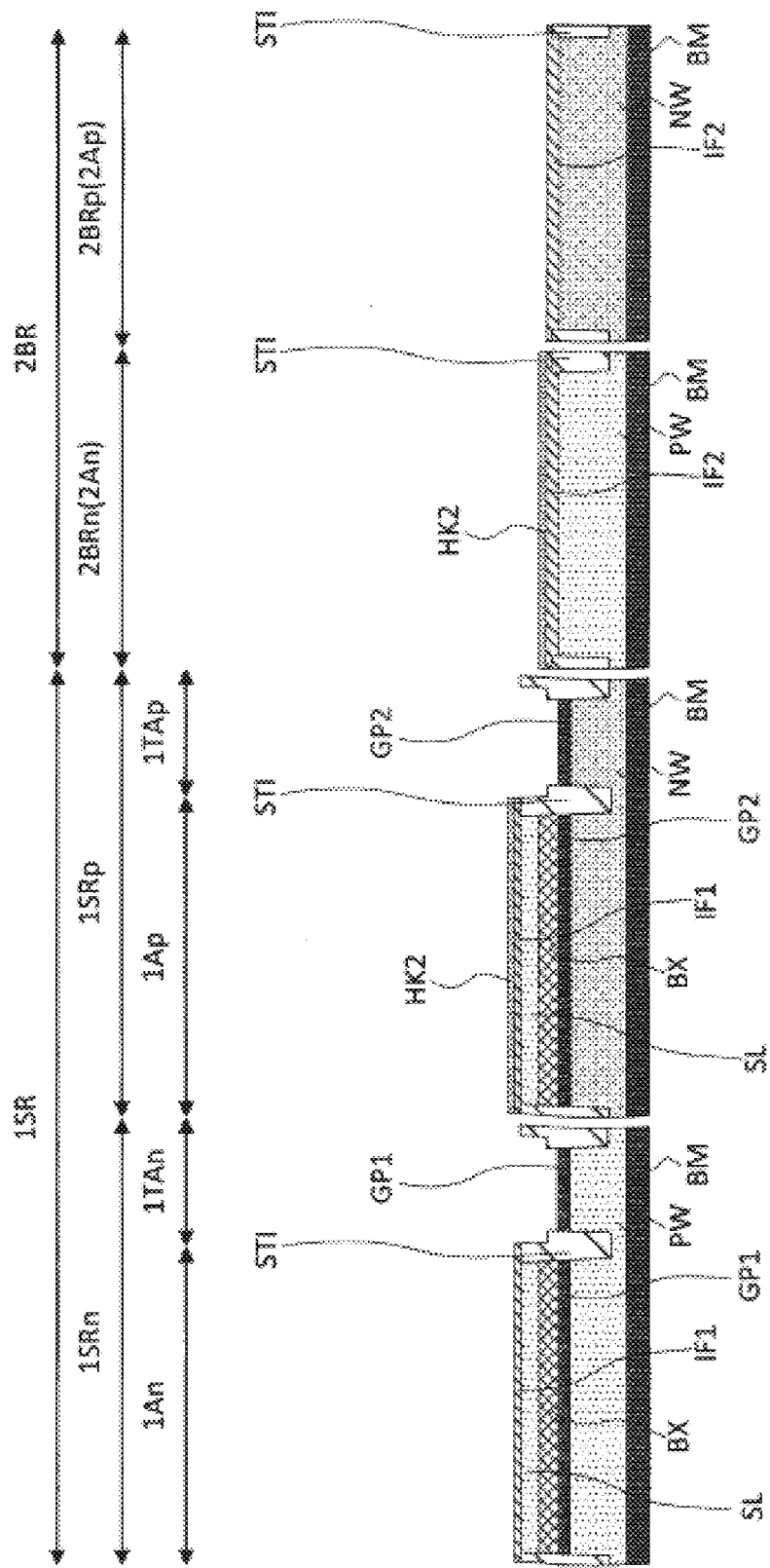
FIG. 11 is a cross-sectional view of the semiconductor device following FIG. 10 during the manufacturing process.

Thereafter, the mask MSK1 formed on each of the semiconductor layer SL located in the region 1An, the semiconductor base material BM located in the region 1TAn, the semiconductor base material BM located in the region 1Tap, and the semiconductor base material BM located in the region 2Ap is removed. Although not shown, when removing the mask MSK1, for example, a photoresist is formed on the insulating film IF1 located in the region 1Ap and on the insulating film IF2 located in the region 2An, and the mask MSK1 is removed by using this photoresist as a mask. The photoresist is then removed. Thus, as shown in FIG. 11, on the insulating film IF2 located on the insulating film IF1 and the region 2An located in the region 1Ap, while the metallic film HK2 made of aluminum (Al) is formed, the insulating film IF1 formed in the region 1An and the insulating film IF2 formed in the region 2Ap is exposed.

5. Addition of Hafnium (Step S5 in FIG. 5)

Next, hafnium (Hf) is added to each of the insulation film IF1 formed in region 1An in which the n-type field effect transistors Q1n shown in FIG. 1 is to be formed, which is also the SOI region 1SR, and the insulation film IF2 formed in region 2Ap in which the p-type field effect transistors Q2p shown in FIG. 1 is to be formed, which is also the bulk region 2BR.

Figure 12:
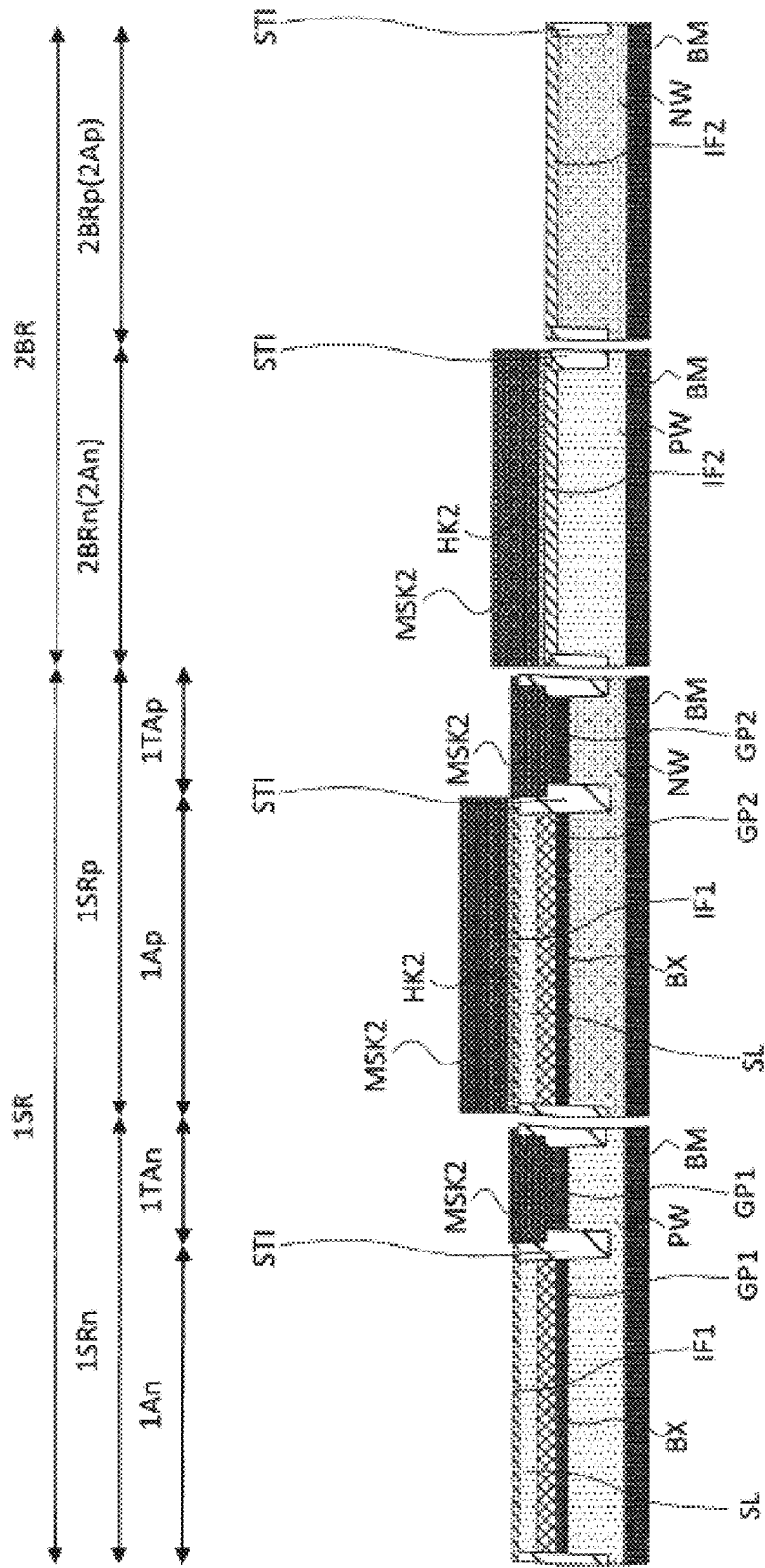
FIG. 12 is a cross-sectional view of the semiconductor device following FIG. 11 during the manufacturing process.

For details, first, as shown in FIG. 12, as the insulating film IF2 located in the insulating film IF1 and the region 2Ap located in the region 1An is exposed, and the insulating film IF2 located in the insulating film IF1 and the region 2An located in the region 1Ap is covered, on the semiconductor base material BM located in the region 1TAn, the semiconductor layer SL located in the region 1Ap, on the semiconductor base material BM and the region 2An located in the region 1TAp, to form a mask MSK2. Note that, like the mask MSK1 described above, this mask MSK2 is made of, for example, amorphous silicon.

Figure 13:
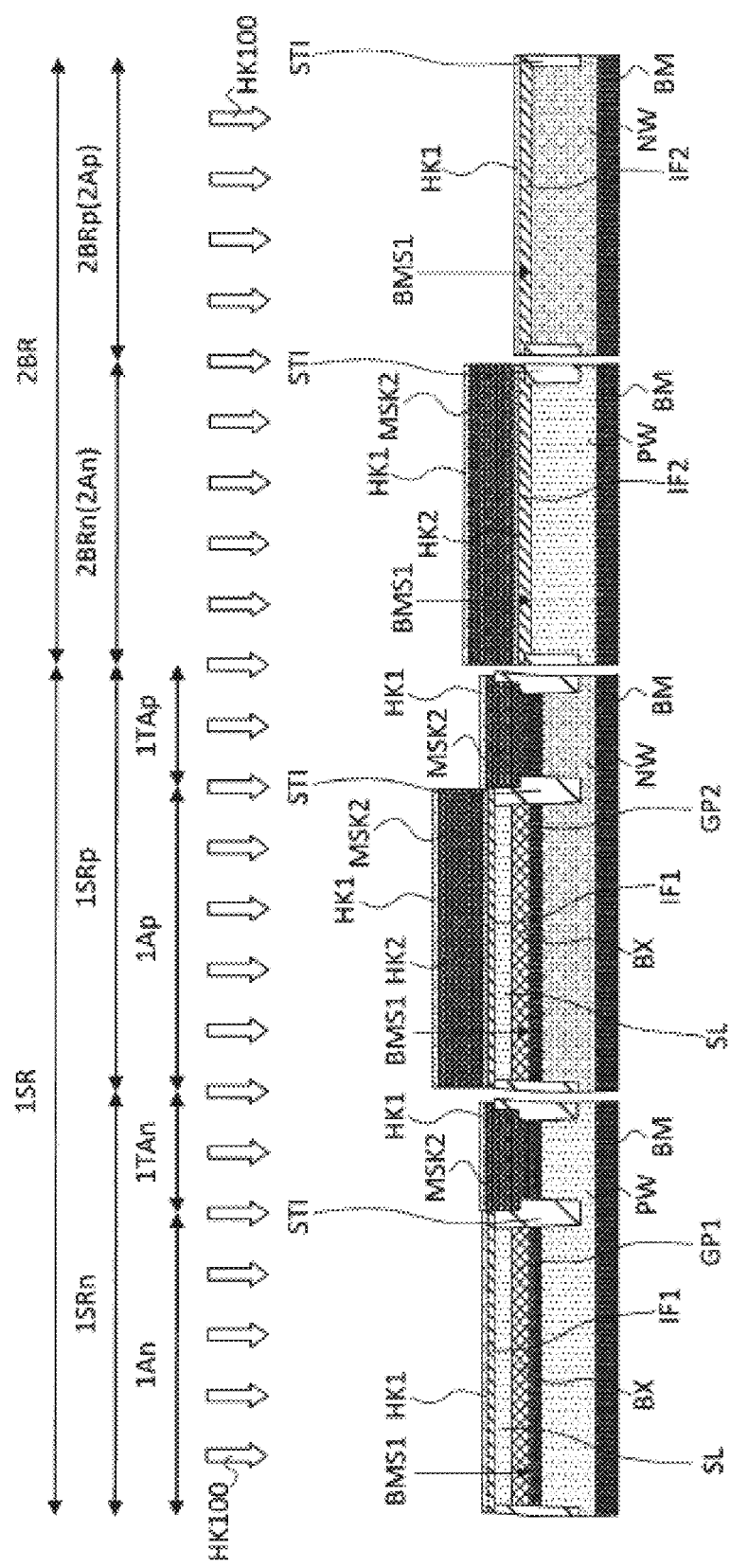
FIG. 13 is a cross-sectional view of the semiconductor device following FIG. 12 during the manufacturing process.

Next, in such a state that the semiconductor base material BM located in the region 1TAn, the semiconductor layer SL located in the region 1Ap, the semiconductor base material BM located in the region 1TAp, and the semiconductor base material BM located in the region 2An are covered with the mask MSK2, hafnium (Hf) HK100 is deposited on each of the insulating film IF1 located in the region 1An, the mask MSK2 located in the region 1Ap, the mask MSK2 located in the region 2An, and on the insulating film IF2 located in the region 2Ap from the upper surface BMS1 side of the semiconductor base material BM as shown in FIG. 13. That is, hafnium (Hf) HK100 is added to each insulating film IF1, IF2. In the present embodiment, hafnium (Hf) HK100 is added to the insulating film IF1, IF2 by, e.g., a sputtering method. As a result, as shown in FIG. 13, a metallic film HK1 made of hafnium (Hf) is formed on each of the mask MSK2 formed in the regions 1TAn, 1Ap, 1TAp, and 2An, the insulating film IF1 located in the region 1An, and the insulating film IF2 located in the region 2Ap.

Figure 14:
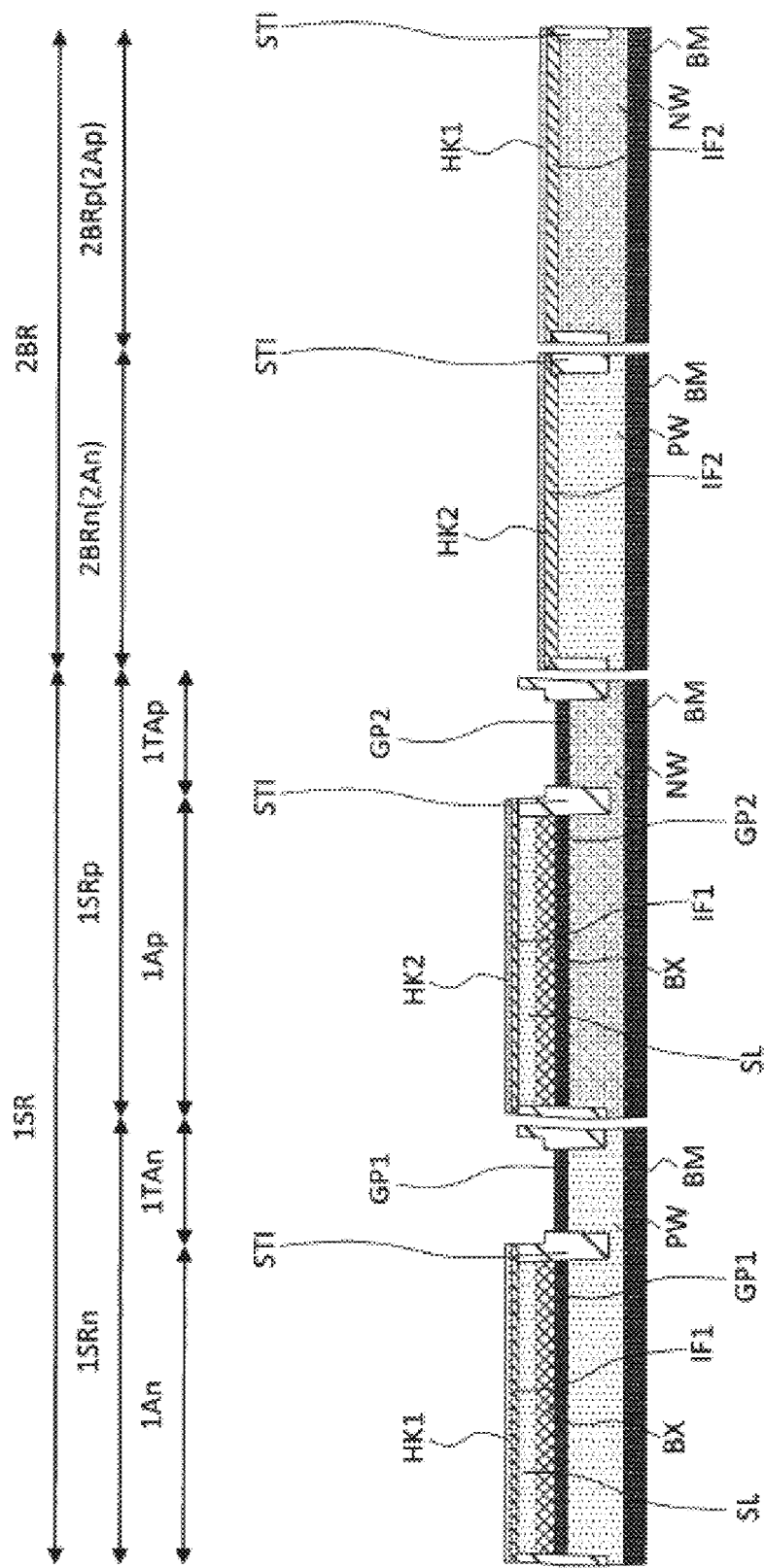
FIG. 14 is a cross-sectional view of the semiconductor device following FIG. 13 during the manufacturing process.

Thereafter, the mask MSK2 formed on each of the semiconductor base material BM located in the region 1Tan, the semiconductor layer SL located in the region 1Ap, the semiconductor base material BM located in the region 1TAp and the semiconductor base material BM located in the region 2An is removed. Although not shown, when removing the mask MSK2, for example, a photoresist is formed on each of the insulating film IF1 located in the region 1An and the insulating film IF2 located in the region 2Ap, and the mask MSK2 is removed by using this photoresist as a mask. The photoresist is then removed. Thus, as shown in FIG. 14, while the metallic film HK1 made of hafnium (Hf) is formed on the insulating film IF2 located on the insulating film IF1 and the region 2Ap located in the region 1An, the region 1Ap is formed, and, an insulating film IF1 where aluminum (Al) is added, is formed in the region 2An, and, the insulating film IF2 where aluminum (Al) is added is exposed.

6. Formation of Gate Electrode (Step S6 in FIG. 5)

Next, the gate electrodes GE1, GE2, GE3, GE4 are formed in the region 1An, 1Ap, 2An, 2Ap, respectively. Specifically, first, a semiconductor material is deposited on substrate SB by, e.g., a CVD method so that the semiconductor material covers the respective regions 1An, 1Ap, 2An, and 2Ap. The semiconductor material deposited on substrate SB is, for example, a polysilicon film.

Next, an impurity is introduced into the deposited semiconductor material. Specifically, ions of an n-type impurity such as arsenic (As) or phosphorus (P) are implanted into portions of the semiconductor material located in the regions 1An and 2An where n-type field effect transistors are to be formed. On the other hand, p-type impurities such as boron (B) are ion-implanted into portions of the semiconductor material located in the regions 1Ap and 2Ap in which p-type field effect transistors are formed.

Figure 15:
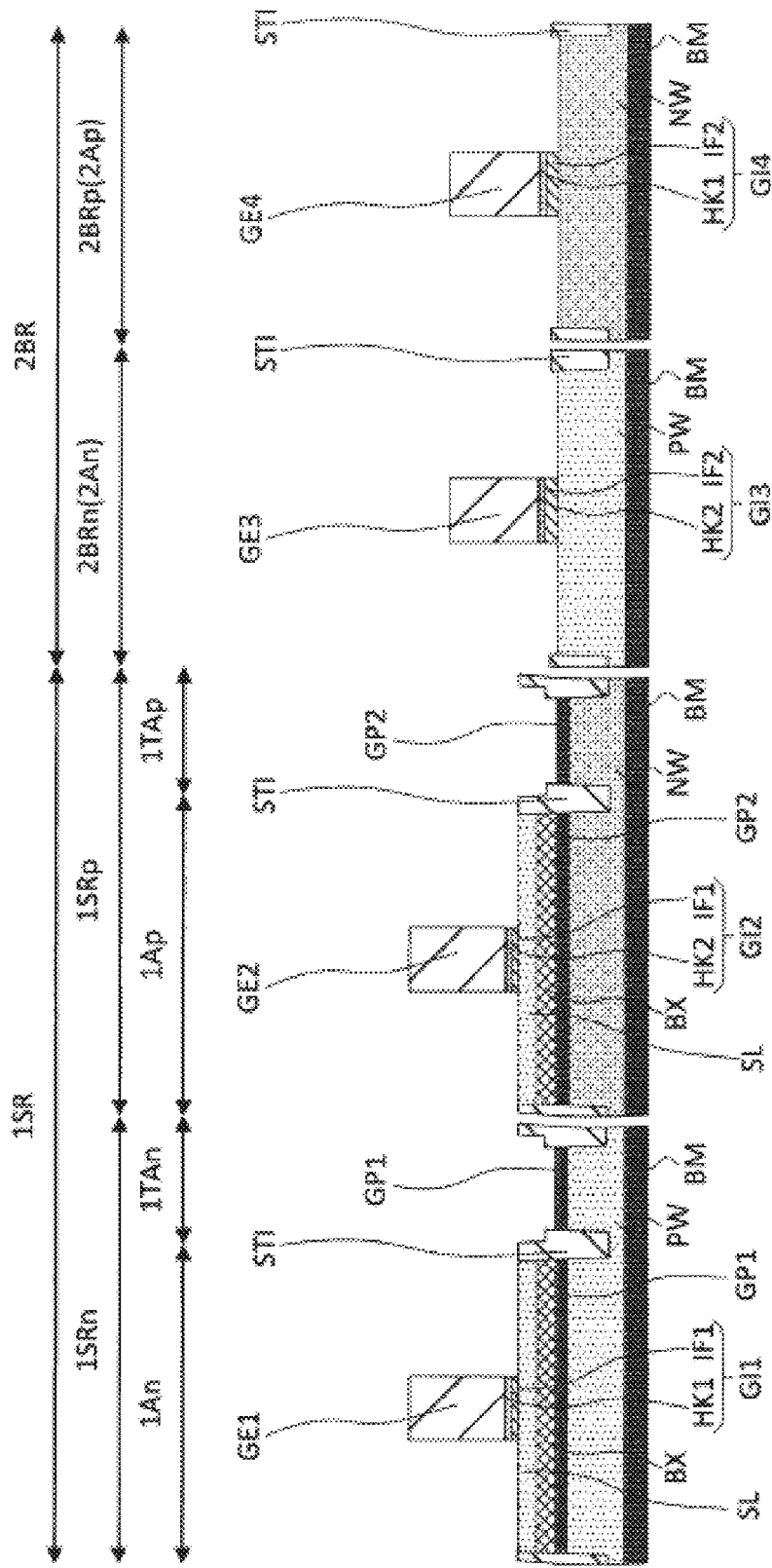
FIG. 15 is a cross-sectional view of the semiconductor device following FIG. 14 during the manufacturing process.

Next, the semiconductor material in which the impurity is introduced is patterned into the desired shape. Also, the portion of each insulating film IF1, IF2, which is exposed from the respective gate electrode GE1, GE2, GE3, GE4, is removed with each gate electrode GE1, GE2, GE3, GE4 formed by patterning, as a mask. Incidentally, the patterning of the semiconductor material or the removal of the insulating film IF1, IF2 are, for example, performed by using a photolithography method and a dry etching method. Thus, as shown in FIG. 15, a gate electrode GE1 is formed on the semiconductor layer SL located in the region 1An via the gate insulating film GI1 (i.e., a film made of the insulating film IF1 and a metallic film HK1 formed on the insulating film IF1) formed by adding hafnium (Hf) to the insulating film IF1 located in the region 1An without addition of aluminum (Al). Also, as shown in FIG. 15, a gate electrode GE2 is formed on the semiconductor layer SL located in the region 1Ap via the gate insulating film GI2 (i.e., a film made of the insulating film IF1 and a metallic film HK2 formed on the insulating film IF1) formed by adding aluminum (Al) to the insulating film IF1 located in the region 1Ap without addition of hafnium (Hf). Also, as shown in FIG. 15, a gate electrode GE3 is formed on the semiconductor base material BM located in the region 2An via the gate insulating film GI3 (i.e., a film made of the insulating film IF2 and a metallic film HK2 formed on the insulating film IF2) formed by adding aluminum (Al) to the insulating film IF2 located in the region 2An. Furthermore, as shown in FIG. 15, a gate electrode GE4 is formed on the semiconductor base material BM located in the region 2Ap via the gate insulating film GI4 (i.e., a film made of the insulating film IF2 and a metallic film HK1 formed on the insulating film IF2) formed by adding hafnium (Hf) to the insulating film IF2 located in the region 2Ap.

Thereafter, the sidewall spacer SW as described above is formed on the sidewall of each gate electrode GE1, GE2, GE3, GE4. Further, in the SOI region 1SR, the surface exposed from the gate electrode GE1 and the offset spacer IF3 of the semiconductor layer SL located in the region 1An (composing the sidewall spacer SW) (exposed surface), the gate electrode GE2 and the offset spacer IF3 of the semiconductor layer SL located in the region 1Ap (the insulating film composing the sidewall spacer SW) surface exposed from (exposed surface), the surface of the semiconductor base material BM located in the region 1TAn (exposed surface), with respect to the surface of the semiconductor base material BM located in the region 1TAp (exposed surface), subjected to epitaxial growth treatment. As a result, epitaxial growth layers EP (see FIG. 1) are formed in the respective regions 1An, 1TAn, 1Ap, and 1TAp. Then, as shown in FIG. 1, after forming the interlayer insulating film IL1 on substrate SB so as to cover the epitaxial grown layer EP, to form a contact hole CH in the interlayer insulating film IL1. In addition, the contact hole CH is closed with a conductive member. Thus, the respective semiconductor region SDR1, SDR2, SDR3, SDR4 serving as the source or drain of the field effect transistors Q1n, Q2n, Q2n, Q2p, and the contact plug PG connected to each diffusion layer SD1, SD2 formed in each region 1TAn, 1TAp, to form. Incidentally, the contact plug PG is made of a conductive member such as tungsten (W), for example. Further, after forming the contact plug PG, as shown in FIG. 1, the multilayer wiring layer described above is formed on the surface of the interlayer insulating film IL1.

<Effect of Method of Manufacturing Semiconductor Device of Present Embodiment>

As described above, in the present embodiment, when the n-type field effect transistor Q1n is formed in the region 1An which is the SOI region 1SR, hafnium (Hf) is added to the insulating film IF1 made of silicon oxide (a film composing the gate insulating film GI1 of the n-type field effect transistor Q1n) formed in the region 1An, but aluminum (Al) is not added. Therefore, it is possible to reduce the threshold voltage of the n-type field effect transistor Q1n formed in the region 1An while suppressing the generation of the gate leakage current in the field effect transistor Q1n. Similarly, in the present embodiment, when forming the p-type field effect transistor Q1p in the region 1Ap is the SOI region 1SR, the insulating film IF1 made of silicon oxide formed in the region 1Ap (p-type field effect transistor Q1p gate insulating film GI2 of the film composing the film), although aluminum (Al) is added, hafnium (Hf) is not added. Therefore, while the threshold voltage of the p-type field effect transistor Q1p formed in the region 1Ap is lowered, it is possible to suppress generation of a gate leakage current in the field effect transistor Q1p.

In the present embodiment, when hafnium (Hf) is added to the insulating film IF1 formed in the region 1An, the insulating film IF1 formed in the region 1Ap is covered with a masking MSK2, as shown in FIG. 13. On the other hand, when adding aluminum (Al) to the insulating film IF1 formed in the region 1Ap, as shown in FIG. 10, covering the insulating film IF1 formed in the region 1An with a mask MSK1. Here, the present inventor have investigated that both hafnium (Hf) and aluminum (Al) are added to each of the regions 1An and 1Ap, but in the region 1An, the ratio of the number of atoms of aluminum (Al) to the total number of atoms of aluminum (Al) and hafnium (Hf) in the gate insulating film is reduced, and in the region 1Ap, the ratio of the number of atoms of hafnium (Hf) to the total number of atoms of aluminum (Al) and hafnium (Hf) in the gate insulating film is reduced. In this case, it is sufficient to shorten the sputtering time of the metal to reduce the ratio of the number of atoms. However, the shorter the sputtering time, it was found that variations in the amount of metallic to be deposited tend to occur. In other words, it has been found that it becomes difficult to set the added amount (concentration) of a metal to a desired value. This makes it difficult to produce semiconductor device with the desired properties. On the other hand, in the present embodiment, a metal that is not necessary in the respective regions 1An and 1Ap is not added by using the respective mask MSK1, MSK2. Therefore, it is possible to improve the manufacture yield of semiconductor device.

Further, in the present embodiment, when hafnium (Hf) is added to the insulating film IF1 formed in the region 1An, as shown in FIG. 13, the insulating film IF1 formed in the region 1Ap is covered with the mask MSK2, but the insulating film IF2 formed in the region 2Ap is not covered with the mask MSK2. That is, as shown in FIG. 13, when hafnium (Hf) is added to the insulating film IF1 formed in the region 1An, hafnium (Hf) is also added to the insulating film IF2 formed in the region 2Ap. Similarly, when adding aluminum (Al) to the insulating film IF1 formed in the region 1Ap, as shown in FIG. 10, the insulating film IF1 formed in the region 1An is covered with a mask MSK1, the insulating film IF2 formed in the region 2An is not covered with a mask MSK1. That is, as shown in FIG. 10, when adding aluminum (Al) to the insulating film IF1 formed in the region 1Ap, is also added aluminum (Al) to the insulating film IF2 formed in the region 2An. Therefore, it is possible to reduce the number of manufacturing steps of semiconductor device. Further, the amount (ratio, concentration) of the metal (here, hafnium) to be added to the insulating film IF2 formed in the region 2Ap can be made substantially the same amount as the amount (ratio, concentration) of the metal (here, hafnium) to be added to the insulating film IF1 formed in the region 1An. Similarly, the amount (ratio, concentration) of the metal (here, aluminum) added to the insulating film IF2 formed in the region 2An can be substantially the same as the amount (ratio, concentration) of the metal (here, aluminum) added to the insulating film IF1 formed in the region 1Ap.

MODIFIED EXAMPLE OF PRESENT EMBODIMENT

Next, a description will be given of a modified example of the above embodiment.

First Modified Example

Figure 16:
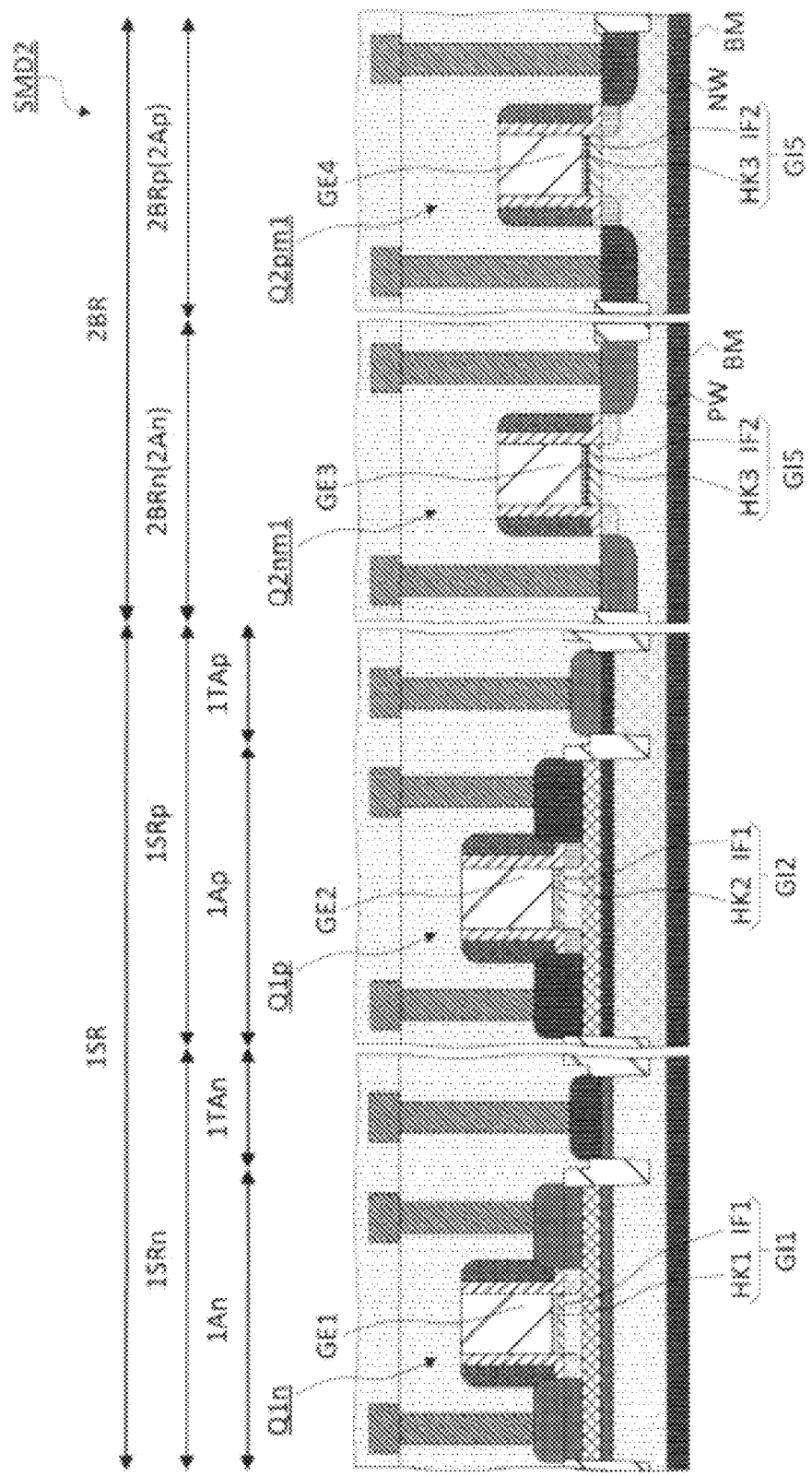
FIG. 16 is a cross-sectional view of a semiconductor device according to a first modified example.

First, in the above embodiment, the semiconductor device SMD1 has been described in which an insulating film to which aluminum (Al) is added (deposited) without adding hafnium (Hf) to the insulating film IF2 made of silicon oxide is used as the gate insulating film GI3 composing the n-type field effect transistor Q2n formed in the region 2An which is the bulk region 2BR, and an insulating film to which hafnium (Hf) is added (deposited) is used as the gate insulating film GI4 composing the p-type field effect transistor Q2p formed in the region 2Ap which is the bulk region 2BR without adding aluminum (Al) to the insulating film IF2 made of silicon oxide. However, as shown in FIG. 16, an insulating film that is an insulating film IF2 made of silicon oxide, and to which both hafnium (Hf) and aluminum (Al) are added (deposited), can be used as a gate insulating film GI5 composing each field effect transistor Q2nm1, Q2pm1. As described above, each of the n-type field effect transistor Q2n and the p-type field effect transistor Q2p formed in the bulk region 2BR is a field effect transistor composing a peripheral circuit whose drive voltage is higher than the drive voltage of SRAM circuit composed of each of the n-type field effect transistor Q1n and the p-type field effect transistor Q1p formed in the SOI region 1SR. That is, the driving voltage of each field effect transistor formed in the bulk region 2BR is higher than the driving voltage of each field effect transistor formed in the SOI region 1SR. Therefore, when it is desired to produce a semiconductor device SMD2 considering the above NBTI as well, as shown in FIG. 16, it is preferable to use a gate insulating film GI5 whose ratio of the number of hafnium atoms composing the gate insulating film GI5 that is the insulating film IF2 (deposited) on which the metallic film HK3 made of hafnium (Hf) and aluminum (Al) is formed, to the total number of atoms composing the metallic film HK3, is 75% or more, and less than 100%. Furthermore, NBTI described above occurs particularly in a p-type field effect transistor. Therefore, the bulk region 2BR, and the region 2An where the n-type field effect transistor is formed, the gate insulating film GI3 described above, or using the gate insulating film GI5, also the bulk region 2BR, and the region 2Ap where the p-type field effect transistor is formed, the gate insulating film GI6 may be used.

Second Modified Example

In the above-mentioned embodiment and the above-mentioned first modified example, an insulating film (in the above-mentioned embodiment, "insulating film IF1" located in the region 1Ap) to which a metal (in the above-mentioned embodiment, "aluminum") is added is covered with a mask, and another metal (in the above-mentioned embodiment, "hafnium") is added to an insulating film (in the above-mentioned embodiment, "insulating film IF1" located in the region 1An) located in another region not covered with the mask, and then the insulating film exposed by removing the mask is used as a gate insulating film. However, the gate insulating film may be formed by manufacturing method shown in FIGS. 17 to 28.

Figure 17:
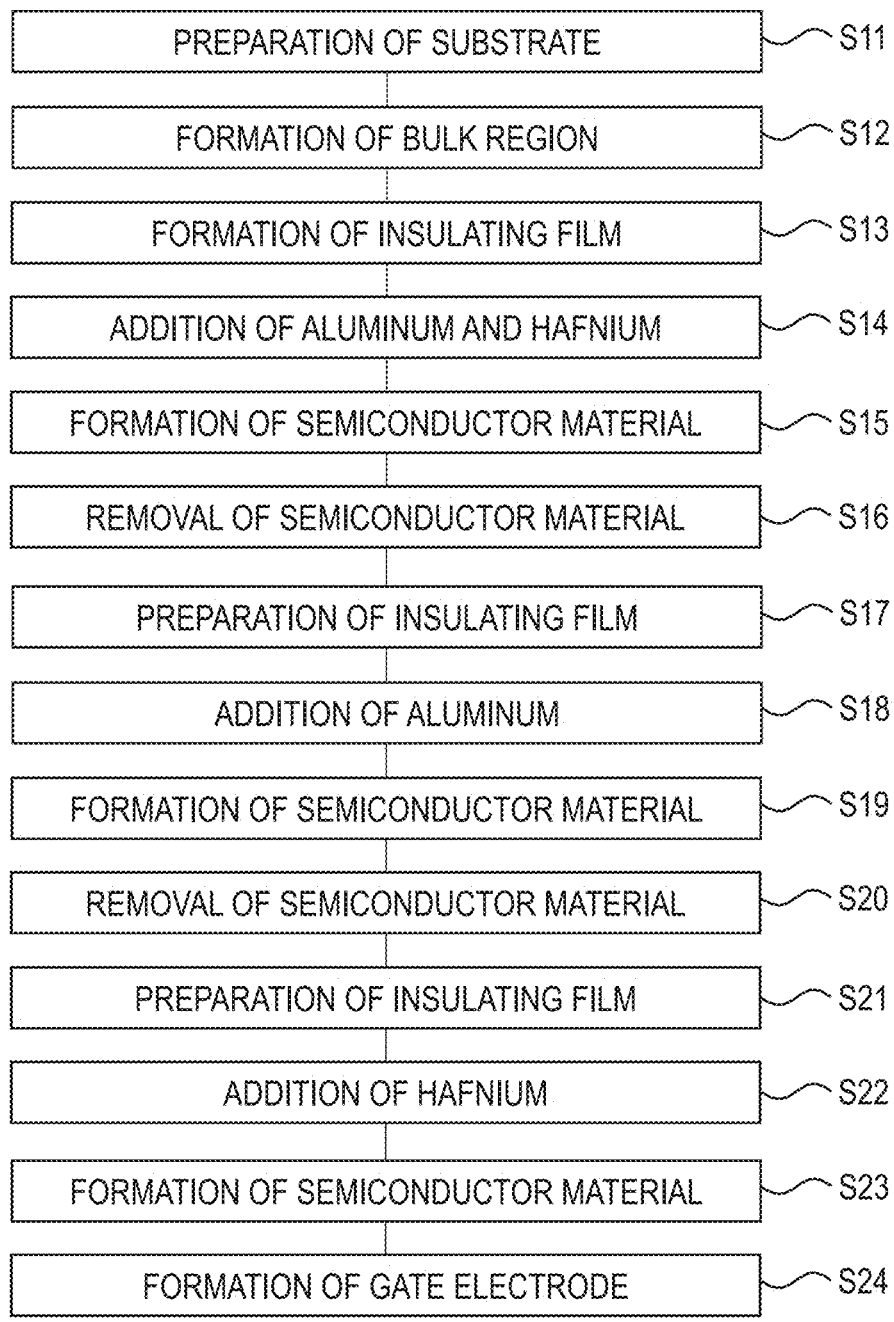
FIG. 17 is a process flow diagram showing a manufacturing process of a semiconductor device according to a second modified example.

For details, first, steps S11 to S13 shown in FIG. 17 are performed. Here, since steps S11 to S13 shown in FIG. 17 are the same as steps S1 to S3 shown in FIG. 5 of the above embodiment, the description of steps S11 to S13 is omitted. Further, the process flow diagram shown in FIG. 17 is a process flow diagram based on the semiconductor device SMD2 of the above first modified example.

Figure 18:
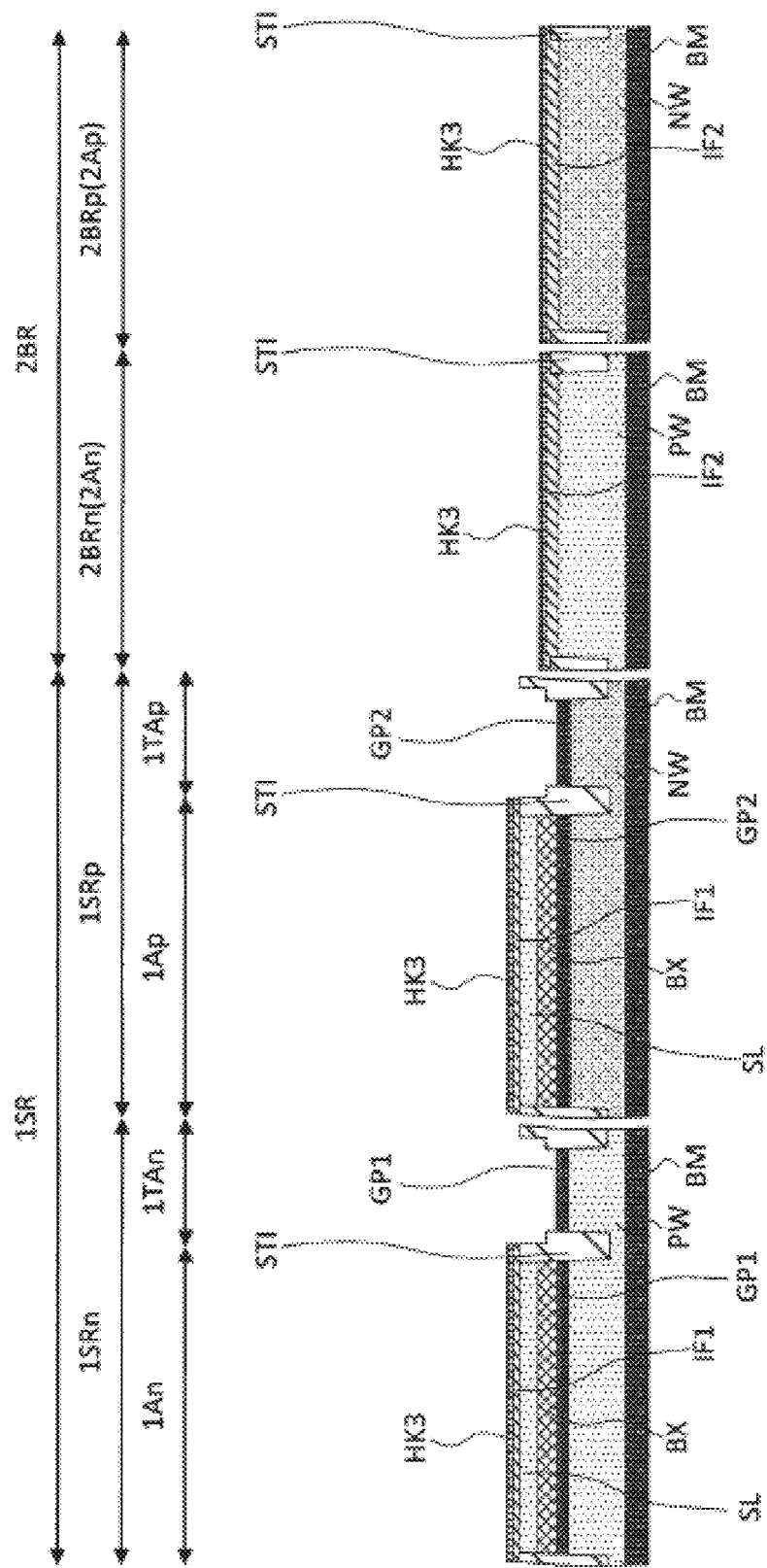
FIG. 18 is a cross-sectional view of the semiconductor device according to the second modified example during the manufacturing process.

Next, as step S14 shown in FIG. 17, both aluminum and hafnium are added to the insulating film IF1 located in each of the regions 1An and 1Ap which are the SOI region 1SR and to the insulating film IF2 located in each of the regions 2An and 2Ap which are the bulk region 2BR. As a result, as shown in FIG. 18, a metallic film HK3 made of aluminum and hafnium is formed on the insulating film IF1, IF2.

Figure 19:
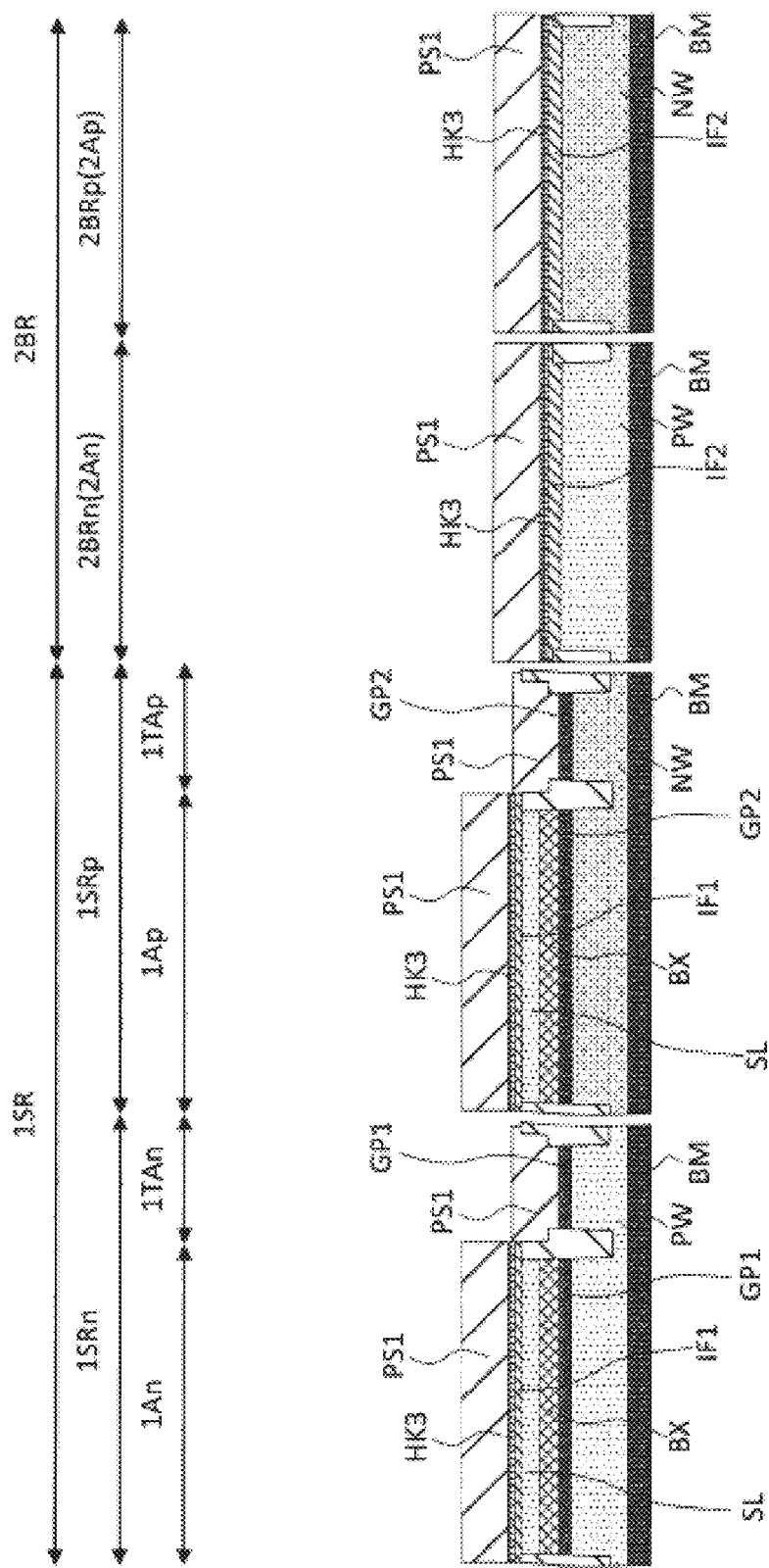
FIG. 19 is a cross-sectional view of the semiconductor device following FIG. 18 during the manufacturing process.

Next, as step S15 shown in FIG. 17, as shown in FIG. 19, each region 1An is SOI region 1SR, the insulating film IF1 located in 1Ap, each region 2An is the bulk region 2BR, so as to cover the insulating film IF2 located in 2Ap, each region 1An is SOI region 1SR, and the semiconductor layer SL located in 1Ap, each region 2An is the bulk region 2BR, on the semiconductor base material BM located in 2Ap, to form a semiconductor material PS1. Incidentally, the semiconductor material PS1 is made of, for example, polycrystalline silicon (specifically, doped polysilicon impurity is introduced or ion-implantation).

Figure 20:
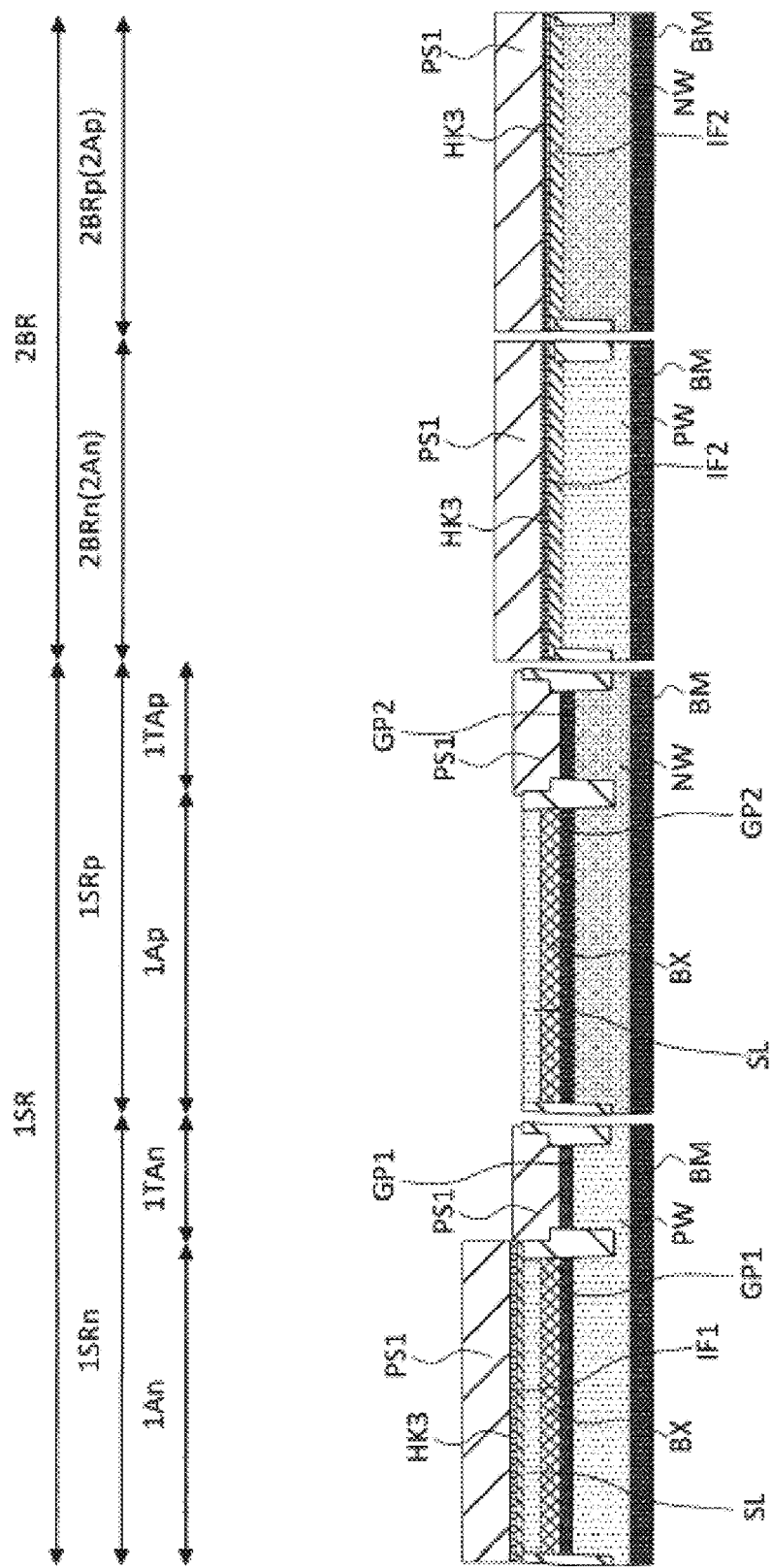
FIG. 20 is a cross-sectional view of the semiconductor device following FIG. 19 during the manufacturing process.

Next, as step S16 shown in FIG. 17, as shown in FIG. 20, the semiconductor material PS1 located in the region 1Ap in which the p-type field effect transistor Q1p is formed and the insulating film IF1 located in the region 1Ap and to which aluminum and hafnium are added are removed so that the semiconductor material PS1 located in the region 1An, the region 2An, and the region 2Ap remains. Thus, to expose the semiconductor layer SL located in the region 1Ap.

Figure 21:
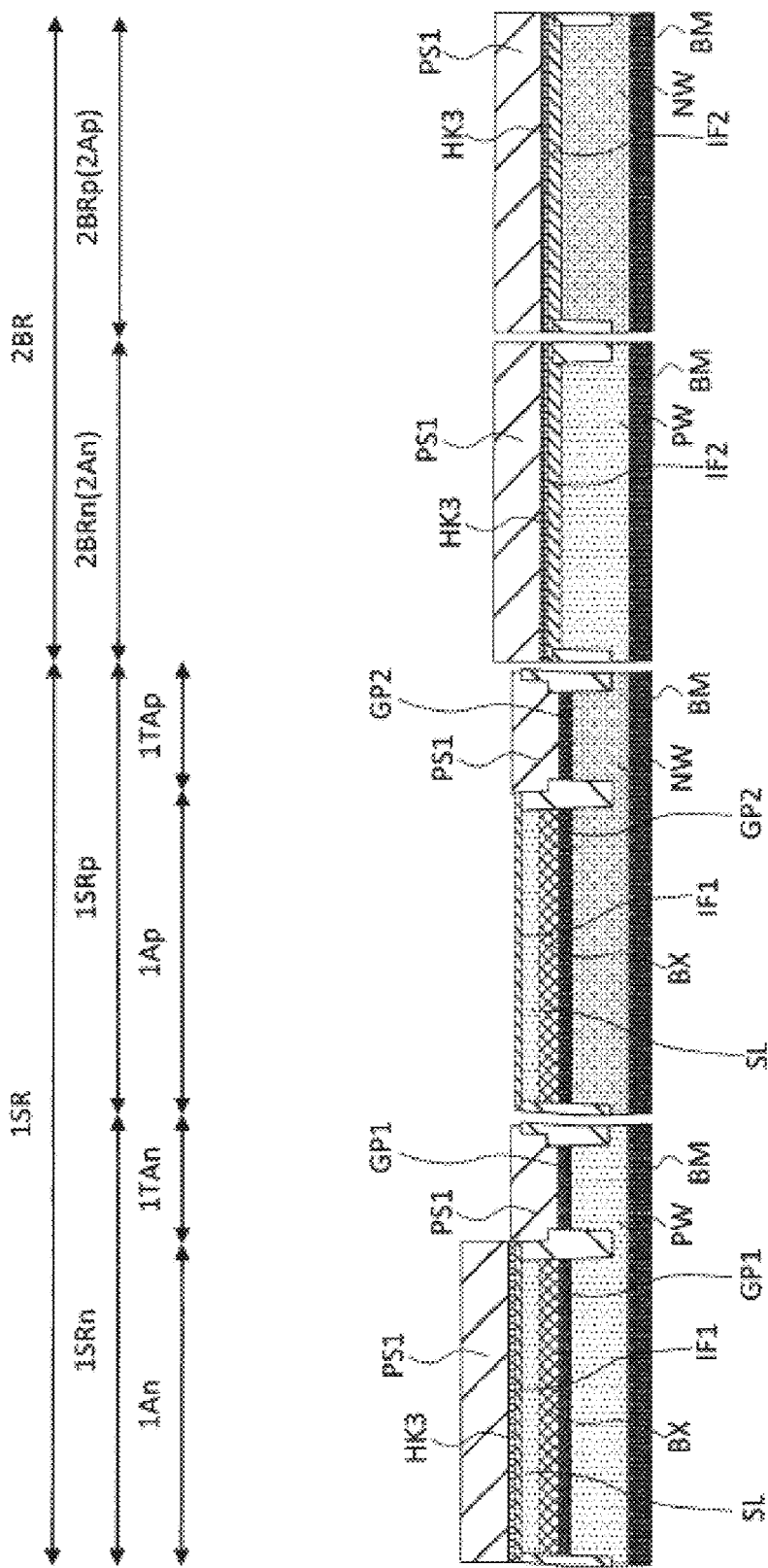
FIG. 21 is a cross-sectional view of the semiconductor device following FIG. 20 during the manufacturing process.

Next, as step S17 shown in FIG. 17, as shown in FIG. 21, with the semiconductor layer SL located in the region 1An and the semiconductor base material BM located in the regions 2An and 2Ap which are the bulk regions 2BR covered with the semiconductor material PS1, the insulating film IF1 made of silicon oxide is formed again on the semiconductor layer SL located in the region 1Ap in which the p-type field effect transistor Q1p is formed.

Figure 22:
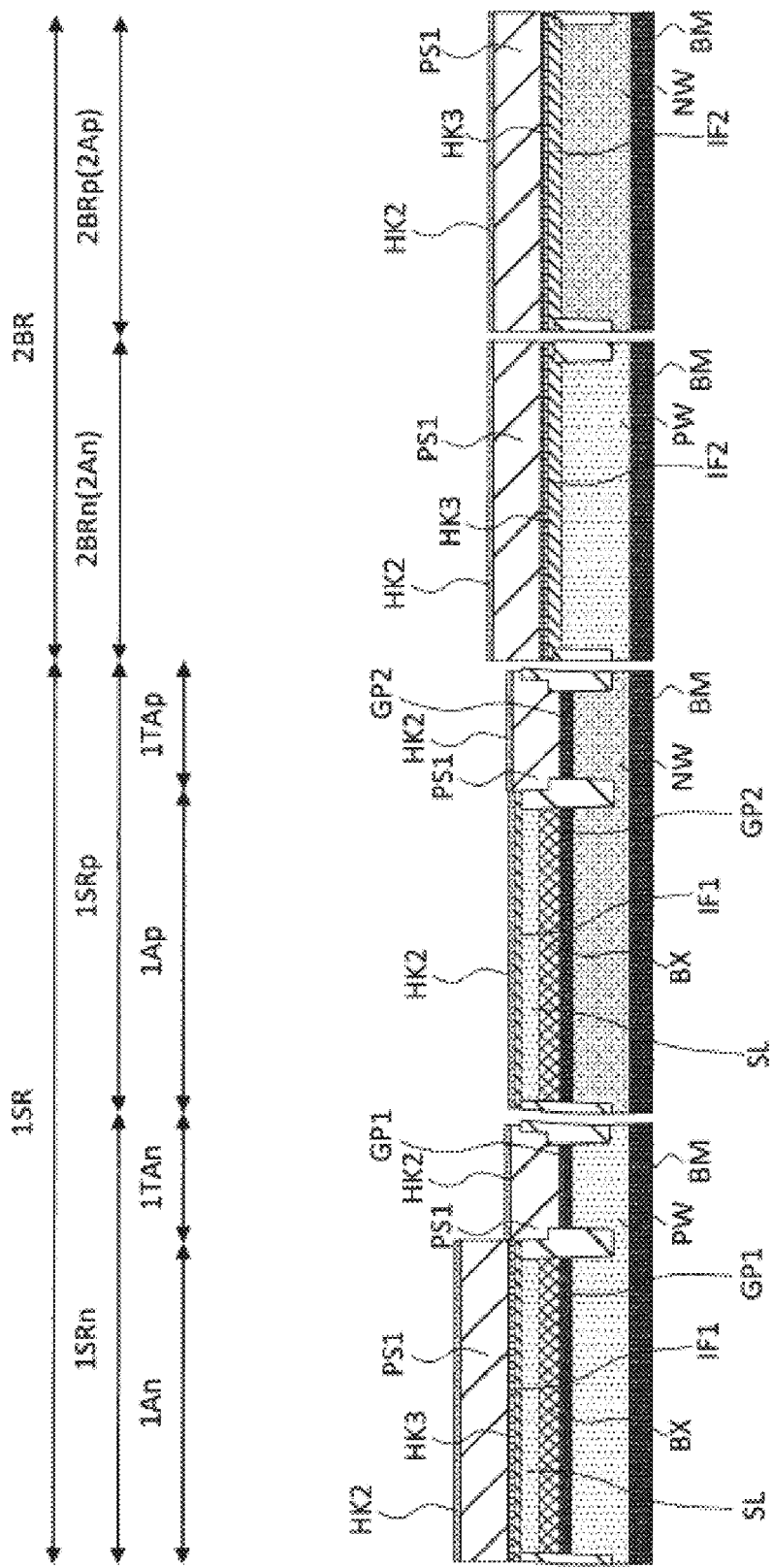
FIG. 22 is a cross-sectional view of the semiconductor device following FIG. 21 during the manufacturing process.

Next, as step S18 shown in FIG. 17, aluminum is added onto the insulating film IF1 located in the region 1Ap where the p-type field effect transistor Q1p is formed, with the semiconductor layers SL located in the region 1An and the semiconductor base materials BM located in the regions 2An and 2Ap which are the bulk regions 2BR covered with the semiconductor material PS1. Thus, as shown in FIG. 22, a metallic film HK2 made of aluminum is formed on the insulating film IF1 located in the area 1Ap (deposited). As shown in FIG. 22, the metallic film HK2 is also formed (deposited) on PS1 of semiconducting materials located in the respective regions 1An, 2An, and 2Ap.

Figure 23:
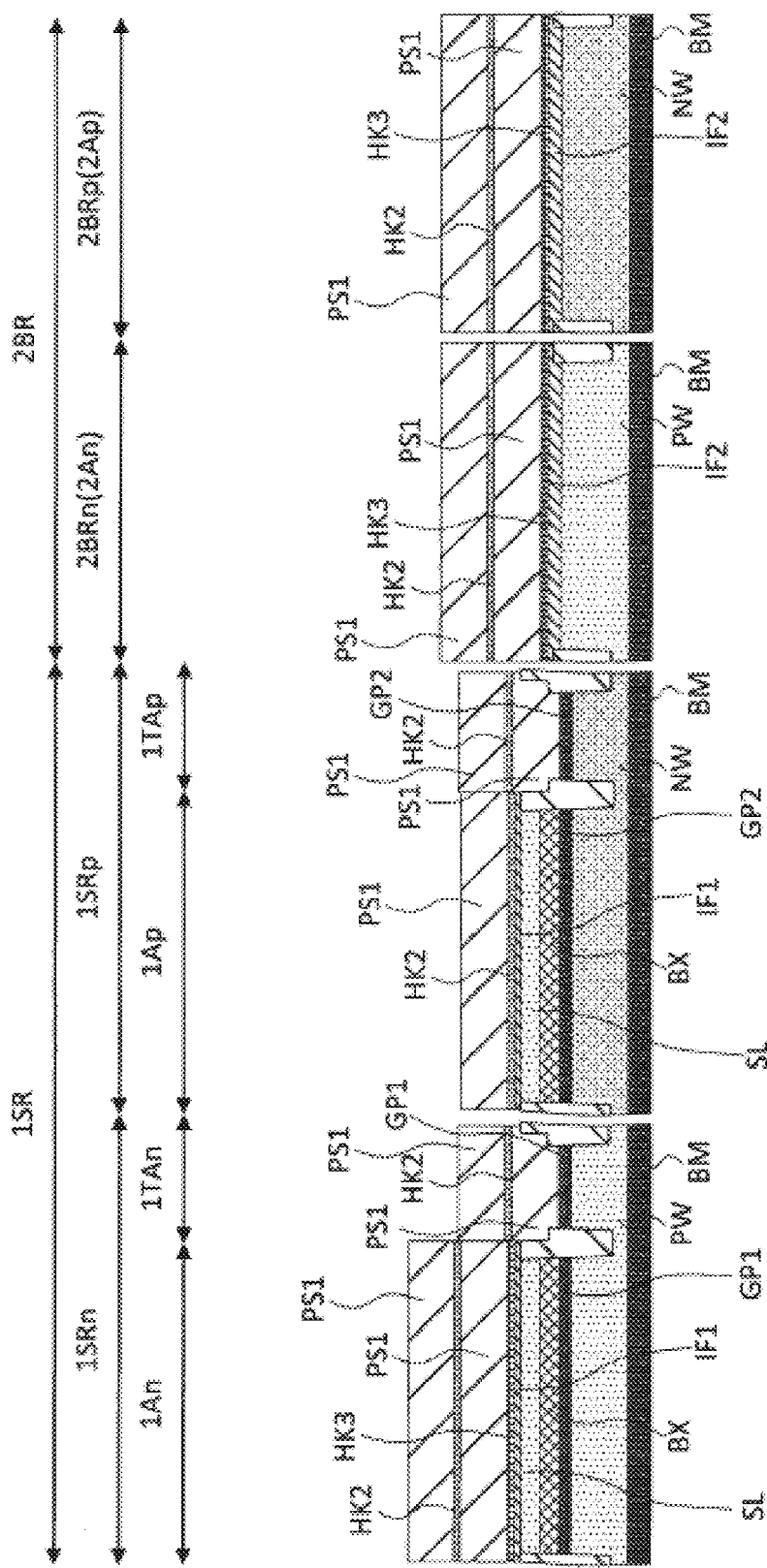
FIG. 23 is a cross-sectional view of the semiconductor device following FIG. 22 during the manufacturing process.

Next, as step S19 shown in FIG. 17, as shown in FIG. 23, a semiconductor layer SL located in the region 1An, each region 2An is the bulk region 2BR, while covering the semiconductor base material BM located in 2Ap with a semiconductor material PS1, located in the region 1Ap, and, on the insulating film IF1 where aluminum is added, to form a semiconductor material PS1 again. Incidentally, as shown in FIG. 22, the semiconductor material PS1 is formed on the semiconductor material PS1 located in the respective regions 1An, regions 2An, 2Ap (deposited).

Figure 24:
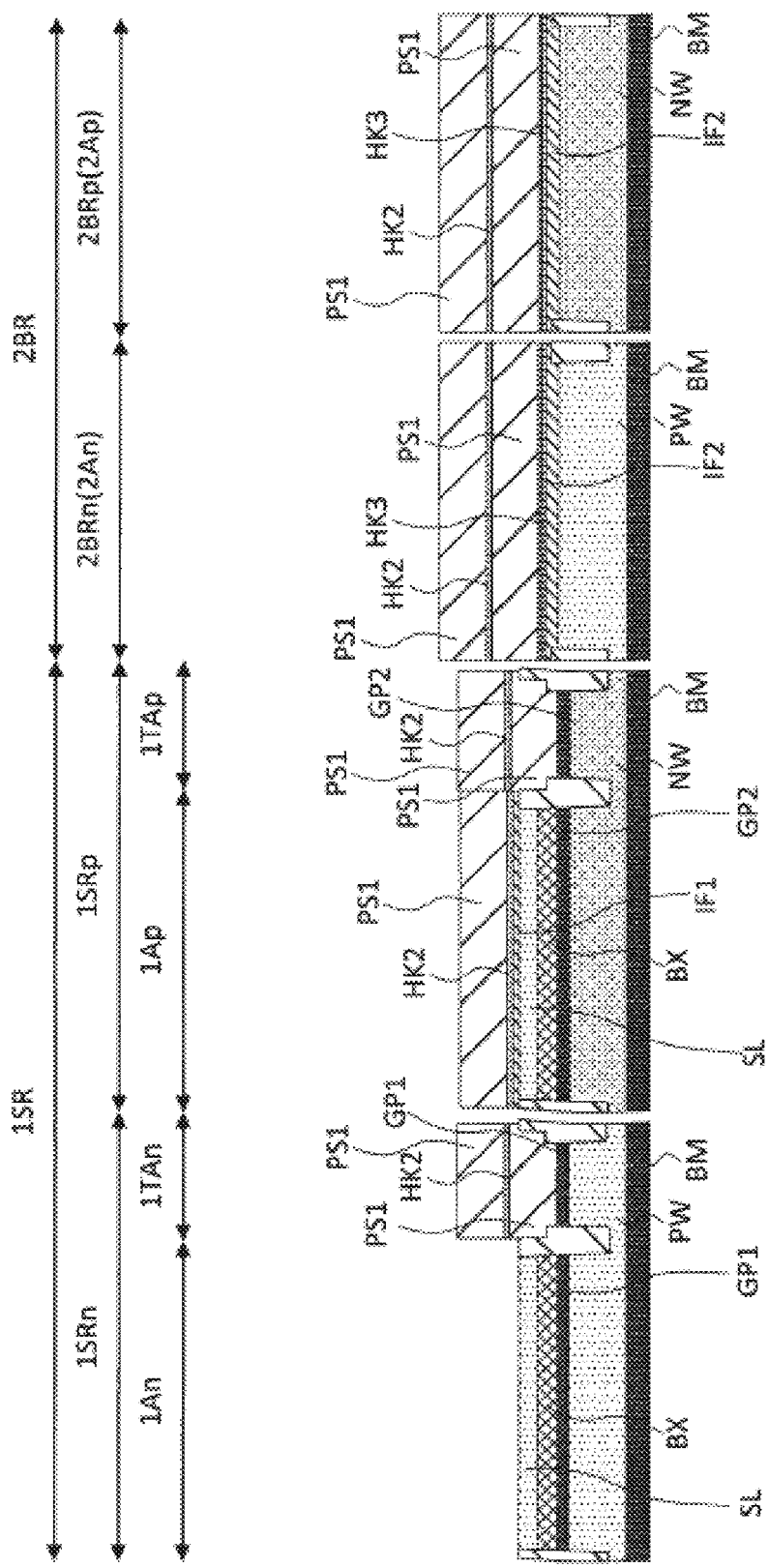
FIG. 24 is a cross-sectional view of the semiconductor device following FIG. 23 during the manufacturing process.

Next, as step S20 shown in FIG. 17, as shown in FIG. 24, the semiconductor material PS1 located in the region 1An where the n-type field effect transistor Q1n is formed and the insulating film IF1 located in the region 1An and to which aluminum and hafnium are added are removed so that the semiconductor material PS1 located in the region 1Ap, the region 2An, and the region 2Ap remains. Thus, to expose the semiconductor layer SL located in the region 1An.

Figure 25:
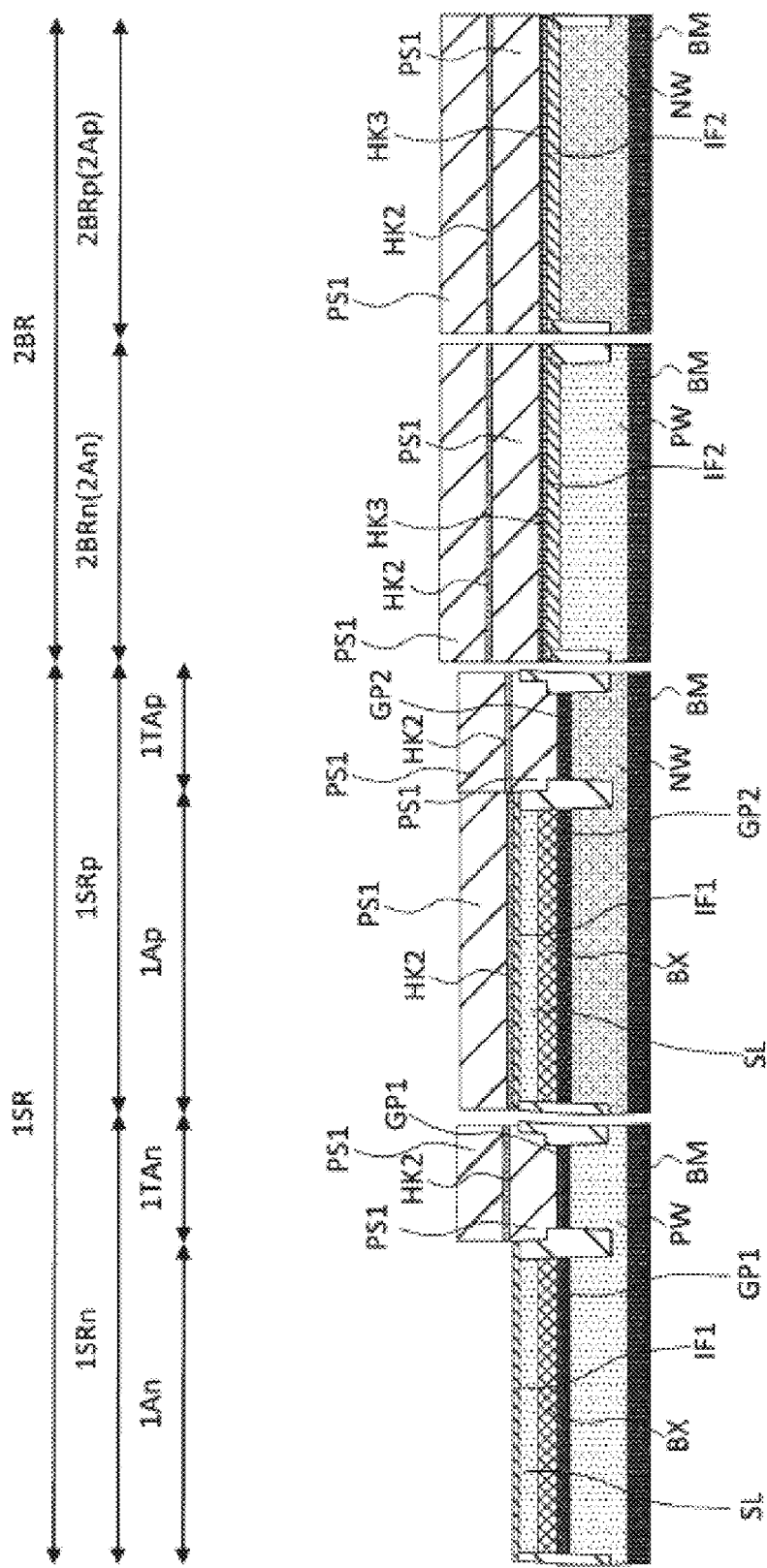
FIG. 25 is a cross-sectional view of the semiconductor device following FIG. 24 during the manufacturing process.

Next, as step S21 shown in FIG. 17, as shown in FIG. 25, with the semiconductor layer SL located in the region 1Ap and the semiconductor base material BM located in the regions 2An and 2Ap which are the bulk regions 2BR covered with the semiconductor material PS1, the insulating film IF1 made of silicon oxide is formed again on the semiconductor layer SL located in the region 1An where the n-type field effect transistor Q1n is to be formed.

Figure 26:
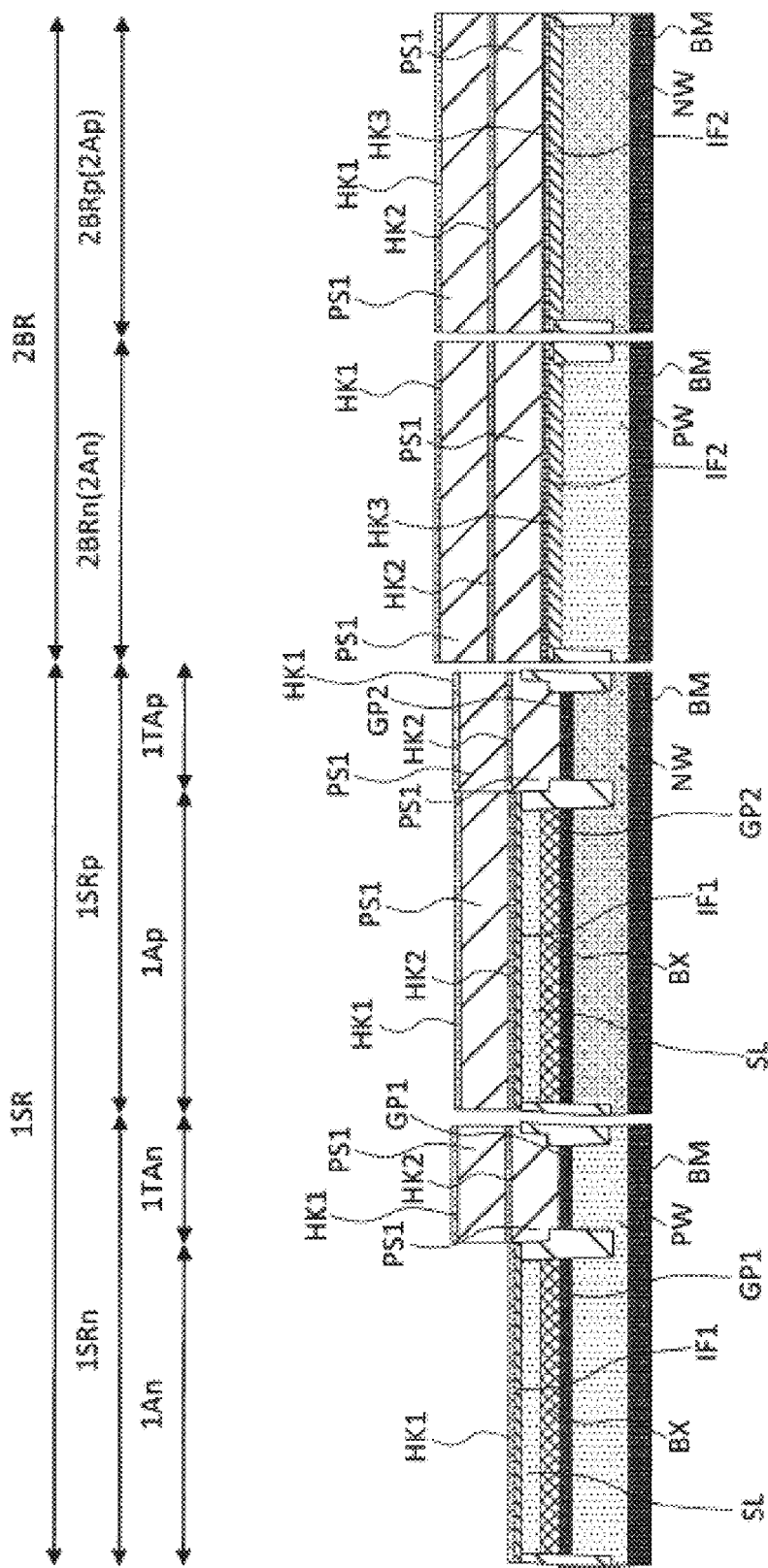
FIG. 26 is a cross-sectional view of the semiconductor device following FIG. 25 during the manufacturing process.

Next, as step S22 shown in FIG. 17, hafnium is added onto the insulating film IF1 located in the region 1An where the n-type field effect transistor Q1n is formed, with the semiconductor layers SL located in the region 1Ap and the semiconductor base materials BM located in the regions 2An and 2Ap that are the bulk regions 2BR covered with the semiconductor material PS1. As a result, as shown in FIG. 26, a metallic film HK1 made of hafnium is formed (deposited) on the insulating film IF1 located in the region 1An. As shown in FIG. 26, the metallic film HK1 is also formed (deposited) on PS1 of semiconducting materials located in the respective regions 1Ap, 2An, and 2Ap.

Figure 27:
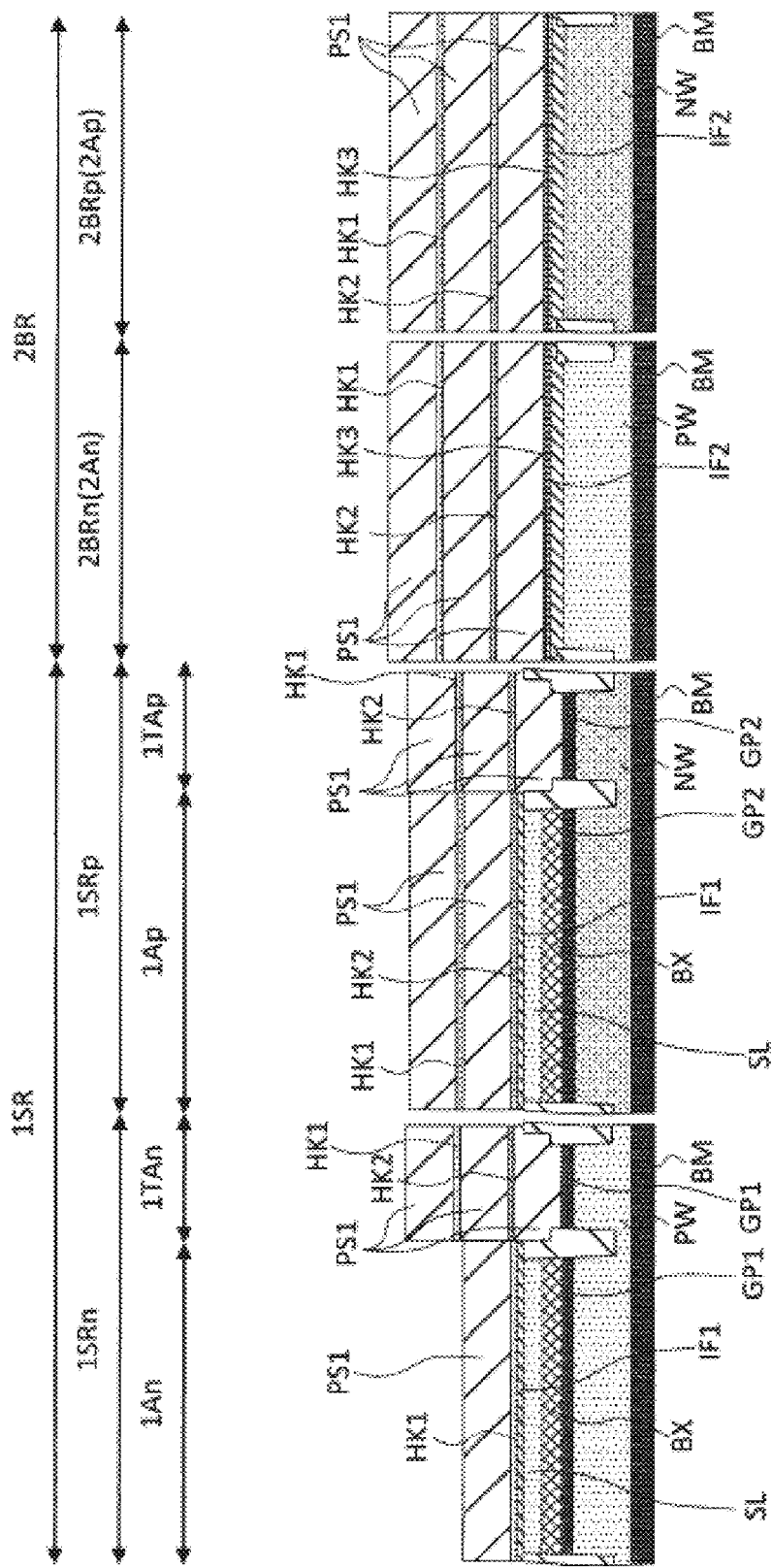
FIG. 27 is a cross-sectional view of the semiconductor device following FIG. 26 during the manufacturing process.

Next, as step S23 shown in FIG. 17, as shown in FIG. 27, a semiconductor layer SL located in the region 1Ap, each region 2An is the bulk region 2BR, while covering the semiconductor base material BM located in 2Ap with a semiconductor material PS1, located in the region 1An, and, on the insulating film IF1 where hafnium is added, to form a semiconductor material PS1 again. Incidentally, as shown in FIG. 27, the semiconductor material PS1 is formed (deposited) on the semiconductor material PS1 located in the respective regions 1Ap, 2An, 2Ap.

Figure 28:
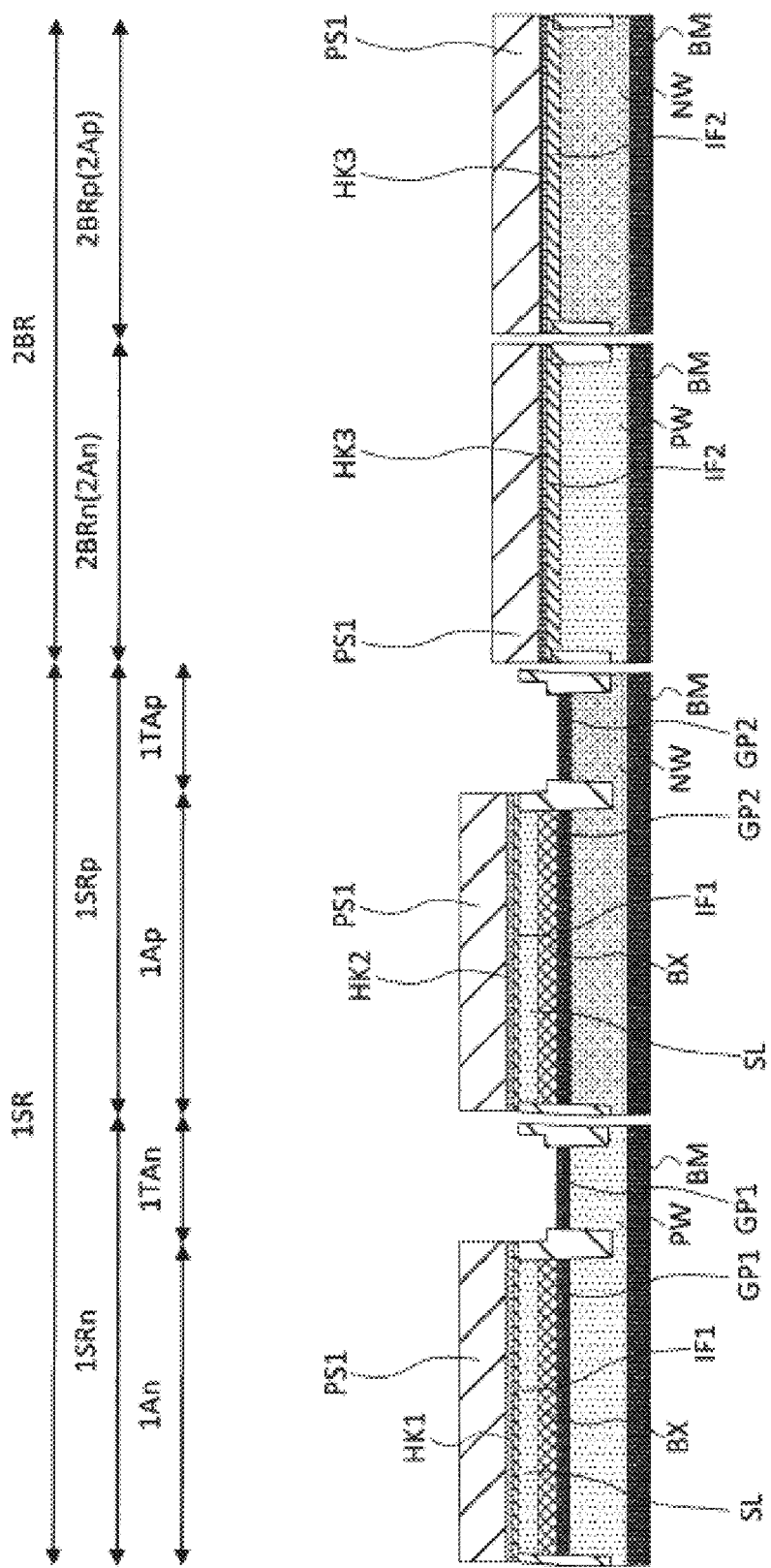
FIG. 28 is a cross-sectional view of the semiconductor device following FIG. 27 during the manufacturing process.

Next, as a step S24 shown in FIG. 17, the respective regions 1An, 1Ap, 2An, to form a gate electrode GE1, GE2, GE3, GE4 in 2Ap. Incidentally, as a pretreatment for forming the gate electrode GE1, GE2, GE3, GE4, as shown in FIG. 28, the unwanted semiconductor material PS1 is removed by, for example, CMP or etching process. The remaining semiconducting PS1 is then patterned into the desired geometry. Then, the gate electrode GE1, GE2, GE3, GE4 formed by patterning as a mask, of the insulating film IF1, IF2, to remove the portion exposed from the respective gate electrode GE1, GE2, GE3, GE4. Thus, as shown in FIG. 16, a gate electrode GE1 is formed on the semiconductor layer SL located in the region 1An via the gate insulating film GI1 (i.e., a film comprised of the insulating film IF1, and the metallic film HK1 formed on the insulating film IF1) formed by adding hafnium (Hf) to the insulating film IF1 located in the region 1An, without adding aluminum (Al) to the insulating film IF1 located in the region 1An. Also, as shown in FIG. 16, a gate electrode GE2 is formed on the semiconductor layer SL located in the region 1Ap via the gate insulating film GI2 (i.e., a film comprised of the insulating film IF1, and the metallic film HK2 formed on the insulating film IF1) formed by adding aluminum (Al) to the insulating film IF1 located in the region 1Ap, without adding hafnium (Hf) to the insulating film IF1 located in the region 1Ap. Also, as shown in FIG. 16, a gate electrode GE3 is formed on the semiconductor base material BM located in the region 2An via the gate insulating film GI5 (i.e., a film comprised of the insulating film IF2, and the metallic film HK3 formed on the insulating film IF2) formed by adding both aluminum (Al) and hafnium (Hf) to the insulating film IF2 located in the region 2An. Furthermore, as shown in FIG. 16, a gate electrode GE4 is formed on the semiconductor base material BM located in the region 2Ap via the gate insulating film GI5 (i.e., a film comprised of the insulating film IF2, and the metallic film HK3 formed on the insulating film IF2) formed by adding both aluminum (Al) and hafnium (Hf) to the insulating film IF2 located in the region 2Ap.

According to manufacturing method of the present second modified example, after forming the gate insulating film GI5 in each region 2An, 2Ap is the bulk region 2BR (i.e., after step S14 shown in FIG. 17), the respective regions 2An, 2Ap until forming each gate electrode GE3, GE4, the gate insulating film GI5 is protected by a semiconductor material PS1, as described in the above embodiment, the mask MSK1, the mask MSK2 and photoresist not affected by processing for removing. Further, after forming the gate insulating film GI2 in the region 1Ap is SOI region 1SR (i.e., after step S18 shown in FIG. 17), until forming the gate electrode GE2 in the region 1Ap, the gate insulating film GI2 is protected by a semiconductor material PS1 since, as described in the above embodiment, the mask MSK1, not affected by processing for removing the mask MSK2 and the photoresist. Furthermore, after forming the gate insulating film GI1 in the region 1An which is the SOI region 1SR (i.e., after step S22 shown in FIG. 17), until forming the gate electrode GE1 in the region 1An, the gate insulating film GI1 is protected by a semiconductor material PS1, as described in the above embodiment, the mask MSK1, mask MSK2 and photoresist It is not affected by processing for removing. As a result, the reliability of the semiconductor device SMD2 can be improved.

Figure 29:
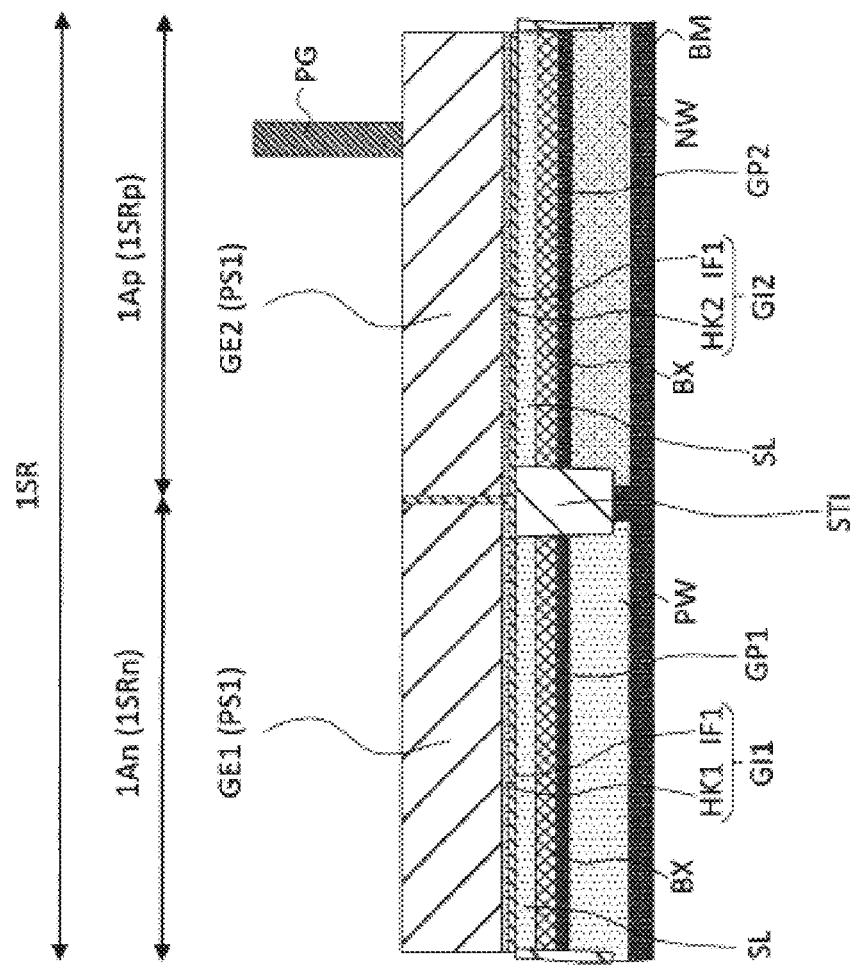
FIG. 29 is a cross-sectional view of a semiconductor device according to a further modified example of the second modified example.

In this second modified example, when the step S21 shown in FIG. 17 is performed, the insulating film IF1 made of silicon oxide is also formed on the sidewall of the semiconductor material PS1 remaining in the region 1Ap where the p-type field effect transistor Q1p is formed. Therefore, when the gate electrode GE1 of the field effect transistor Q1n and the gate electrode GE2 of the field effect transistor Q1p are formed, as shown in FIG. 29, the two gate electrodes GE1, GE2 may be connected to each other through the insulating film IF1 formed on the sidewall of the semiconductor-material PS1. Thus, the contact plug PG for supplying a gate voltage to each gate electrode GE1, GE2, connected only to one gate electrode (e.g., the gate electrode GE1), the gate voltage through the one gate electrode to the other gate electrode (e.g., the gate electrode GE2) it can also be supplied to. Incidentally, FIG. 29 is a cross-sectional view along the gate width direction of the gate electrode GE1, GE2. Also, FIGS. 1 and 16 are cross-sectional view along the gate length of each gate electrode GE1, GE2.

Third Modified Example

In the above embodiment, the semiconductor device SMD1 including the region 1An in which the n-type field effect transistor Q1n is formed, the region 1SRn having the region 1TAn for supplying the back gate voltage to the n-type field effect transistor Q1n, the region 1Ap in which the p-type field effect transistor Q1p is formed, and the region 1SRp having the region 1TAp for supplying the back gate voltage to the p-type field effect transistor Q1p has been described. However, in addition to the two field effect transistors Q1n, Q1p described above, the two field effect transistors Q1n, another field effect transistor Q3n breakdown voltage is higher than Q1p, Q3p is formed in the SOI area 1SR it may be a semiconductor device SMD3.

Figure 30:
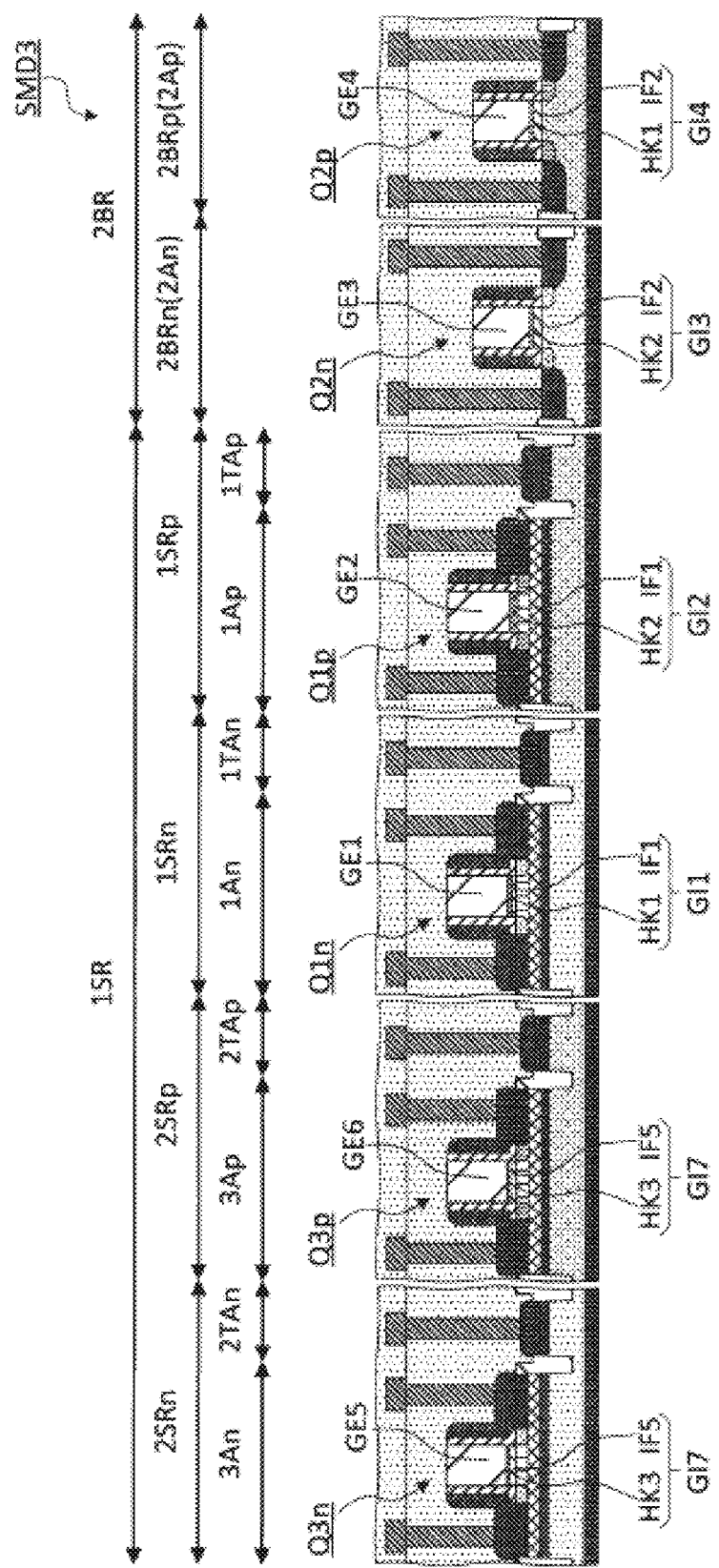
FIG. 30 is a cross-sectional view of a semiconductor device according to a third modified example.

For details, as shown in FIG. 30, the SOI region 1SR of the semiconductor device SMD3 includes, in addition to the two region 1SRn, 1SRp described above, a region 3An in which another n-type field effect transistor Q3n is formed, and a region 2SRn having a region 2TAn for supplying a back gate voltage to the n-type field effect transistor Q3n, a region 3Ap in which a p-type field effect transistor Q3p is formed, and a region 2SRp having a region 2TAp for supplying a back gate voltage to the p-type field effect transistor Q3p.

As shown in FIG. 30, the n-type field effect transistor Q3n formed in the region 3An basically has the same configuration as the n-type field effect transistor Q1n formed in the region 1An, except for the gate insulating film GI7 on which the gate electrodes GE5 are formed. Similarly, the p-type field effect transistor Q3p formed in the region 3Ap basically has the same configuration as the p-type field effect transistor Q1p formed in the region 1Ap except for the gate insulating film GI7 on which the gate electrodes GE6 are formed.

The driving voltage of the n-type field effect transistor Q3n formed in the region 3An and the p-type field effect transistor Q3p formed in the region 3Ap are, for example, 1.5 v to 2.4 v. That is, the drive voltage of each of the n-type field effect transistor Q3n formed in the region 3An and the p-type field effect transistor Q3p formed in the region 3Ap is higher than the drive voltage of each of the n-type field effect transistor Q1n formed in the region 1An and the p-type field effect transistor Q1p formed in the region 1Ap. The thickness of each of the gate insulating films GI7 composing the n-type field effect transistor Q3n formed in the region 3An and the p-type field effect transistor Q3p formed in the region 3Ap is larger than the thickness of each of the gate insulating films GI2 composing the n-type field effect transistor Q1n formed in the region 1An and the p-type field effect transistor Q1p formed in the region 1Ap.

The drive voltage of each of the n-type field effect transistor Q3n formed in the region 3An and the p-type field effect transistor Q3p formed in the region 3Ap is lower than the drive voltage of each of the n-type field effect transistor Q2n formed in the region 2An and the p-type field effect transistor Q2p formed in the region 2Ap. The thickness of each gate insulating film GI7 composing the n-type field effect transistor Q3n formed in the region 3An and the p-type field effect transistor Q3p formed in the region 3Ap is smaller than the thickness of each gate insulating film GI4 composing the n-type field effect transistor Q2n formed in the region 2An and the p-type field effect transistor Q2p formed in the region 2Ap.

As described above, the drive voltage of each field effect transistor Q3n and Q3p formed in each region 2SRn, 2SRp is higher than the drive voltage of each field effect transistor Q1n and Q1p formed in each region 1SRn, 1SRp. Therefore, if the threshold voltage of each of the field effect transistors Q3n and Q3p is too low, a leakage current (sub-threshold leakage current) may occur between the source and the drain of each of the field effect transistors Q3n and Q3p. Therefore, in the semiconductor device SMD3 of the present third modified example, first, the insulating film IF1 composing the gate insulating film GI1 of the n-type field effect transistor Q1n, without adding aluminum (Al), hafnium (Hf) It is added. Aluminum (Al) is added to the insulating film IF1 composing the gate insulating film GI2 of the p-type field effect transistor Q1p without adding hafnium (Hf). Further, to the insulating film IF5 composing the gate insulating film GI7 of the field effect transistors Q3n and Q3p, both aluminum (Al) and hafnium (Hf) are added. That is, in this third modified example, as shown in FIG. 30, a metallic film HK3 made of hafnium (Hf) and aluminum (Al) is formed (deposited) on the insulating film IF5.

As described above, the drive voltage of each field effect transistor Q3n and Q3p formed in each region 2SRn, 2SRp which is the SOI region 1SR is lower than the drive voltage of each field effect transistor Q2n and Q2p formed in each region 2BRn, 2BRp which is the bulk region 2BR. Therefore, if the threshold voltage of each of the field effect transistors Q3n and Q3p formed in each region 2SRn, 2SRp which is the SOI region 1SR is set too high, it becomes difficult to increase the on-state current flowing in the channel region of each of the field effect transistors Q3n and Q3p. In other words, it is difficult to operate the field effect transistors Q3n and Q3p at high speed. Therefore, in the semiconductor device SMD3 of the present third modified example, first, the insulating film IF1 composing the gate insulating film GI1 of the n-type field effect transistor Q1n, without adding aluminum (Al), hafnium (Hf) It is added. Aluminum (Al) is added to the insulating film IF1 composing the gate insulating film GI2 of the p-type field effect transistor Q1p without adding hafnium (Hf). Aluminum (Al) is added to the insulating film IF2 composing the gate insulating film GI3 of the n-type field effect transistor Q2n without adding hafnium (Hf). Hafnium (Hf) is added to the insulating film IF2 composing the gate insulating film GI4 of the p-type field effect transistor Q2p without adding aluminum (Al). Further, to the insulating film IF5 composing the gate insulating film GI7 of the field effect transistors Q3n and Q3p, both aluminum (Al) and hafnium (Hf) are added. That is, in this third modified example, as shown in FIG. 30, a metallic film HK3 made of hafnium (Hf) and aluminum (Al) is formed (deposited) on the insulating film IF5.

Fourth Modified Example

In the above embodiment, first modified example, second modified example, and third modified example, aluminum (Al) was not added to the insulating film IF1 formed in the region 1An in which the n-type field effect transistor Q1n is formed, and hafnium (Hf) was not added to the insulating film IF1 formed in the region 1Ap in which the p-type field effect transistor Q1p is formed. However, not only hafnium (Hf) but also aluminum (Al) may be added to the insulating film IF1 formed in the region 1An in which the n-type field effect transistor Q1n is formed. In order to lower the threshold voltage of the n-type field effect transistor Q1n formed in the region 1An which is the SOI region 1SR, it is preferable to reduce the ratio of the number of aluminum atoms (Al) to the total number of aluminum atoms (Al) and hafnium atoms (Hf) as much as possible, as shown in FIG. 3. In addition, not only aluminum (Al) but also hafnium (Hf) may be added to the insulating film IF1 formed in the region 1Ap where the p-type field effect transistor Q1p is formed. In order to lower the threshold voltage of the p-type field effect transistor Q1p formed in the region 1Ap which is the SOI region 1SR, as shown in FIG. 4, it is preferable that the ratio of the number of atoms of hafnium (Hf) to the total number of atoms of aluminum (Al) and hafnium (Hf) be as small as possible. However, as described above, when each metal is deposited by, for example, a sputtering method, the addition amount of the deposited metal tends to vary. Therefore, in addition to lowering the threshold voltage of the field effect transistor, the n-type field effect transistor and the p-type field effect transistor formed in the SOI region of substrate If you want to improve the manufacturing yield of semiconductor device, as in the above embodiment, the n-type field effect transistor Q1n is formed in the region 1An insulating film IF1 formed on the region 1An is not added with aluminum (Al), also, it is preferable not to add hafnium (Hf) to the insulating film IF1 formed in the region 1Ap where the p-type field effect transistor Q1p is formed.

Fifth Modified Example

In the above embodiment, in the above first modified example and the above second modified example, after the step of adding aluminum (Al) to the insulating film IF1 formed in the region 1Ap in which the p-type field effect transistor Q1p is formed, the step of adding hafnium (Hf) to the insulating film IF1 formed in the region 1An in which the n-type field effect transistor Q1n (see FIG. 1) is formed has been described. However, after the step of adding hafnium (Hf) to the insulating film IF1 formed in the region 1An in which the n-type field effect transistor Q1n is formed, the step of adding aluminum (Al) to the insulating film IF1 formed in the region 1Ap in which the p-type field effect transistor Q1p (see FIG. 1) is formed may be performed.

Sixth Modified Example

Furthermore, in the above-described embodiment, it has been described that each gate electrode GE1, GE2, GE3, GE4 is made of, for example, polycrystalline silicon (specifically, doped polysilicon in which impurities are introduced or ion-implantation). However, each gate electrode GE1, GE2, GE3, GE4 may be a gate electrode made of a metal such as, for example, aluminum (Al). Further, either the gate electrodes GE1, GE2 of the field effect transistors Q1n and Q1p formed in the SOI region 1SR or the gate electrodes GE1, GE2 of the field effect transistors Q2n and Q2p formed in the bulk region 2BR may be gate electrodes made of the above metals. As a result, the work function of the metal, it is possible to further adjust the threshold voltage of the field effect transistor.

The invention made by the present inventor has been described above in detail based on the embodiment, but the present invention is not limited to the embodiment described above, and it is needless to say that various modifications can be made without departing from the gist thereof.

For example, although various modified examples have been described above, some or all of each modified example described above may be applied in conjunction with each other within a scope consistent with the gist described above for each modified example.

What is claimed is:

1. A semiconductor device comprising:
a semiconductor base material having a first region, a second region, a third region and a fourth region;
an insulating layer formed on the semiconductor base material located in each of the first region and the second region;
a semiconductor layer formed on the insulating layer located in each of the first region and the second region;
a first gate electrode of a first field effect transistor of n-type, the first gate electrode being formed on the semiconductor layer located in the first region via a first gate insulating film;
a second gate electrode of a second field effect transistor of p-type, the second gate electrode being formed on the semiconductor layer located in the second region via a second gate insulating film;
a third gate electrode of a third field effect transistor of n-type, the third gate electrode being formed on the semiconductor base material located in the third region via a third gate insulating film; and
a fourth gate electrode of a fourth field effect transistor of p-type, the fourth gate electrode being formed on the semiconductor base material located in the fourth region via a fourth gate insulating film,
wherein the first gate insulating film is an insulating film made of silicon oxide, and to which hafnium is added without addition of aluminum,
wherein the second gate insulating film is an insulating film made of silicon oxide, and to which aluminum is added without addition of hafnium,
wherein the third gate insulating film is an insulating film made of silicon oxide, and to which aluminum is added, and
wherein the fourth gate insulating film is an insulating film made of silicon oxide, and to which hafnium is added.

2. The semiconductor device according to claim 1,
wherein a thickness of each of the third gate insulating film and the fourth gate insulating film is larger than a thickness of each of the first gate insulating film and the second gate insulating film.

3. The semiconductor device according to claim 1,
wherein a thickness of the semiconductor layer located in each of the first region and the second region is 10 nm to 20 nm,
wherein a thickness of the insulating layer located in each of the first region and the second region is 10 nm to 20 nm,
wherein a first well region of n-type is formed in the semiconductor base material located in the first region such that the first well region is in contact with the insulating layer located in the first region,
wherein a second well region of p-type is formed in the semiconductor base material located in the second region such that the second well region is in contact with the insulating layer located in the second region,
wherein a first ground plane region of n-type is formed in the first well region such that the first ground plane region is in contact with the insulating layer located in the first region,
wherein a second ground plane region of p-type is formed in the second well region such that the second ground plane region is in contact with the insulating layer located in the second region,
wherein a concentration of an impurity composing the first ground plane region is higher than a concentration of an impurity composing the first well region, and
wherein a concentration of an impurity composing the second ground plane region is higher than a concentration of an impurity composing the second well region.

4. The semiconductor device according to claim 3,
wherein a first offset spacer is formed on a sidewall of the first gate electrode,
wherein a second offset spacer is formed on a sidewall of the second gate electrode,
wherein an epitaxial growth layer is formed on each of a front surface of the semiconductor layer located in the first region, which is exposed from the first gate electrode and the first offset spacer, and a front surface of the semiconductor layer located in the second region, which is exposed from the second gate electrode and the second offset spacer,
wherein the first through fourth gate electrodes, the first through second offset spacers and the epitaxial growth layer are covered with an interlayer insulating film,
wherein a contact hole is formed in the interlayer insulating film, and
wherein the contact hole is filled with a conductive material.

5. The semiconductor device according to claim 1,
wherein each of the third gate insulating film and the fourth gate insulating film is an insulating film made of silicon oxide, and to which both aluminum and hafnium are added.

6. The semiconductor device according to claim 5,
wherein a ratio of a number of hafnium atoms, which are composing the fourth gate insulating film, to a total number of aluminum atoms and hafnium atoms, which are composing the fourth gate insulating film, is 75% or more, and less than 100%.

7. The semiconductor device according to claim 6,
wherein a ratio of a number of hafnium atoms, which are composing the third gate insulating film, to a total number of aluminum atoms and hafnium atoms, which are composing the third gate insulating film, is 75% or more, and less than 100%.

8. The semiconductor device according to claim 5,
wherein the semiconductor base material further has a fifth region and a sixth region,
wherein a fifth gate electrode of a fifth field effect transistor of n-type is formed on the semiconductor layer located in the fifth region via a fifth gate insulating film,
wherein a sixth gate electrode of a sixth field effect transistor of p-type is formed on the semiconductor layer located in the sixth region via a sixth gate insulating film,
wherein a thickness of each of the fifth gate insulating film and the sixth gate insulating film is larger than a thickness of each of the first gate insulating film and the second gate insulating film, and
wherein each of the fifth gate insulating film and the sixth gate insulating film is an insulating film made of silicon oxide, and to which both aluminum and hafnium are added.

9. The semiconductor device according to claim 1,
wherein the semiconductor base material further has a fifth region and a sixth region,
wherein a fifth gate electrode of a fifth field effect transistor of n-type is formed on the semiconductor layer located in the fifth region via a fifth gate insulating film, wherein a sixth gate electrode of a sixth field effect transistor of p-type is formed on the semiconductor layer located in the sixth region via a sixth gate insulating film, wherein a thickness of each of the fifth gate insulating film and the sixth gate insulating film is larger than a thickness of each of the first gate insulating film and the second gate insulating film, and wherein each of the fifth gate insulating film and the sixth gate insulating film is an insulating film made of silicon oxide, and to which both aluminum and hafnium are added.

10. A method of manufacturing a semiconductor device, comprising:
    (a) providing an SOI substrate having:
        a first region in which a first field effect transistor of n-type is to be formed,
        a second region in which a second field effect transistor of p-type is to be formed,
        a third region in which a third field effect transistor of n-type is to be formed, and
        a fourth region in which a fourth field effect transistor of p-type is to be formed,
    the SOI substrate being comprised of:
        a semiconductor base material,
        an insulating layer formed on the semiconductor base material, and
        a semiconductor layer formed on the insulating layer;
    (b) after the (a), removing the semiconductor layer located in each of the third region and the fourth region and the insulating layer located in each of the third region and the fourth region, thereby exposing the semiconductor base material located in each of the third region and the fourth region;
    (c) after the (b), forming a first insulating film made of silicon oxide on the semiconductor layer located in each of the first region and the second region, and forming a second insulating film made of silicon oxide on the semiconductor base material located in each of the third region and the fourth region;
    (d) after the (c), forming a first mask on the semiconductor layer in the first region such that the first insulating film located in the second region and the second insulating film located in the third region are exposed from the first mask, and such that the first insulating film located in the first region is covered with the first mask;
    (e) after the (d), adding aluminum to each of the first insulating film located in the second region and the second insulating film located in the third region, while the semiconductor layer located in the first region is covered with the first mask;
    (f) after the (e), removing the first mask;
    (g) after the (f), forming a second mask on the semiconductor layer located in the second region such that the first insulating film located in the first region and the second insulating film located in the fourth region are exposed from the second mask, and such that the first insulating film located in the second region is covered with the second mask;
    (h) after the (g), adding hafnium to each of the first insulating film located in the first region and the second insulating film located in the fourth region, while the semiconductor layer located in the second region is covered with the second mask;
    (i) after the (h), removing the second mask; and
    (j) after the (i), forming a first gate electrode of the first field effect transistor of n-type on the semiconductor layer located in the first region via a first gate insulating film, forming a second gate electrode of the second field effect transistor of p-type on the semiconductor layer located in the second region via a second gate insulating film, forming a third gate electrode of the third field effect transistor of n-type on the semiconductor base material located in the third region via a third gate insulating film, and forming a fourth gate electrode of the fourth field effect transistor of p-type on the semiconductor base material located in the fourth region via a fourth gate insulating film, wherein the first gate insulating film is the first insulating film located in the first region, and to which hafnium is added without addition of aluminum, wherein the second gate insulating film is the first insulating film located in the second region, and to which aluminum is added without addition of hafnium, wherein the third gate insulating film is the second insulating film located in the third region, and to which aluminum is added, and wherein the fourth gate insulating film is the second insulating film located in the fourth region, and to which hafnium is added.

11. The method according to claim 10,
    wherein a thickness of each of the third gate insulating film and the fourth gate insulating film is larger than a thickness of each of the first gate insulating film and the second gate insulating film.

12. The method according to claim 10, further comprising:
    after the (b) and before the (c), forming a first well region of n-type in the semiconductor base material located in the first region such that the first well region is in contact with the insulating layer located in the first region, and forming a second well region of p-type in the semiconductor base material located in the second region such that the second well region is in contact with the insulating layer located in the second region; and
    after forming the first and second wells in the first and second regions, respectively, and before the (c), forming a first ground plane region of n-type in the first well region such that the first ground plane region is in contact with the insulating layer located in the first region, and forming a second ground plane region of p-type in the second well region such that the second ground plane region is in contact with the insulating layer located in the second region, wherein a thickness of the semiconductor layer composing the SOI substrate provided in the (a), and located in each of the first region and the second region is 10 nm to 20 nm, wherein a thickness of the insulating layer composing the SOI substrate provided in the (a), and located in each of the first region and the second region is 10 nm to 20 nm, wherein a concentration of an impurity composing the first ground plane region is higher than a concentration of an impurity composing the first well region, and wherein a concentration of an impurity composing the second ground plane region is higher than a concentration of an impurity composing the second well region.

13. The method according to claim 12, further comprising:

after the (j), forming a first offset spacer on a sidewall of the first gate electrode, and forming a second offset spacer on a sidewall of the second gate electrode;

after forming the first and second offset spacers, performing an epitaxial growth process to each of a first front surface of the semiconductor layer located in the first region, which is exposed from the first gate electrode and the first offset spacer, and a second front surface of the semiconductor layer located in the second region, which is exposed from the second gate electrode and the second offset spacer, thereby forming an epitaxial growth layer on each of the front surface and the second front surface;

after forming the epitaxial growth layer, covering the epitaxial growth layer with an interlayer insulating film;

after covering the epitaxial growth layer with the interlayer insulating film, forming a contact hole in the interlayer insulating film; and after forming the contact hole, filling the contact hole with a conductive material, thereby forming a contact plug connecting with the epitaxial growth layer.

14. The method according to claim 10, wherein, in the (j), the third gate electrode is formed on the semiconductor base material located in the third region via the third gate insulating film formed by adding both aluminum and hafnium to the second insulating film located in the third region, and the fourth gate electrode is formed on the semiconductor base material located in the fourth region via the fourth gate insulating film formed by adding both aluminum and hafnium to the second insulating film located in the fourth region.

15. The semiconductor device according to claim 14, wherein a ratio of a number of hafnium atoms, which are composing the fourth gate insulating film, to a total number of aluminum atoms and hafnium atoms, which are composing the fourth gate insulating film, is 75% or more, and less than 100%.

16. The semiconductor device according to claim 15, wherein a ratio of a number of hafnium atoms, which are composing the third gate insulating film, to a total number of aluminum atoms and hafnium atoms, which are composing the third gate insulating film, is 75% or more, and less than 100%.

17. A method of manufacturing a semiconductor device, comprising:

(a) providing an SOI substrate having:
　a first region in which a first field effect transistor of n-type is to be formed,
　a second region in which a second field effect transistor of p-type is to be formed,
　a third region in which a third field effect transistor of n-type is to be formed, and
　a fourth region in which a fourth field effect transistor of p-type is to be formed, the SOI substrate being comprised of:
　a semiconductor base material,
　an insulating layer formed on the semiconductor base material, and
　a semiconductor layer formed on the insulating layer;

(b) after the (a), removing the semiconductor layer located in each of the third region and the fourth region and the insulating layer located in each of the third region and the fourth region, thereby exposing the semiconductor base material located in each of the third region and the fourth region;

(c) after the (b), forming a first insulating film made of silicon oxide on the semiconductor layer located in each of the first region and the second region, and forming a second insulating film made of silicon oxide on the semiconductor base material located in each of the third region and the fourth region;

(d) after the (c), adding both aluminum and hafnium to each of the first insulating film located in each of the first region and the second region and the second insulating film located in each of the third region and the fourth region;

(e) after the (d), forming a first semiconductor material on each of the semiconductor layer located in each of the first region and the second region and the semiconductor base material located in each of the third region and the fourth region such that the first insulating film located in each of the first region and the second region and the second insulating film located in each of the third region and the fourth region are covered with the first semiconductor material;

(f) after the (e), exposing the semiconductor layer located in the second region by removing the first semiconductor material located in the second region and the first insulating film located in the second region, and to which both aluminum and hafnium are added, such that the first semiconductor material located in each of the first region, the third region and the fourth region is left;

(g) after the (f), forming a third insulating film made of silicon oxide on the semiconductor layer located in the second region, while the semiconductor layer located in the first region and the semiconductor base material located in each of the third region and the fourth region are covered with the first semiconductor material;

(h) after the (g), adding aluminum to the third insulating film located in the second region, while the semiconductor layer located in the first region and the semiconductor base material located in each of the third region and the fourth region are covered with the first semiconductor material;

(i) after the (h), forming a second semiconductor material on the third insulating film located in the second region, and to which aluminum is added, while the semiconductor layer located in the first region and the semiconductor base material located in each of the third region and the fourth region are covered with the first semiconductor material;

(j) after the (i), exposing the semiconductor layer located in the first region by removing the first semiconductor material located in the first region and the first insulating film located in the first region, and to which both aluminum and hafnium are added, such that the second semiconductor material located in the second region and the first semiconductor material located in each of the third region and the fourth region are left;

(k) after the (j), forming a fourth insulating film made of silicon oxide on the semiconductor layer located in the first region, while the semiconductor layer located in the second region is covered with the second semiconductor material, and while the semiconductor base material located in each of the third region and the fourth region is covered with the first semiconductor material;

(l) after the (k), adding hafnium to the fourth insulating film located in the first region, while the semiconductor layer located in the second region is covered with the second semiconductor material, and while the semiconductor base material located in each of the third region and the fourth region is covered with the first semiconductor material;

(m) after the (l), forming a third semiconductor material on the fourth insulating film located in the first region, and to which hafnium is added, while the semiconductor layer located in the second region is covered with the second semiconductor material, and while the semiconductor base material located in each of the third region and the fourth region is covered with the first semiconductor material; and (n) after the (m), forming a first gate electrode of the first field effect transistor of n-type on the semiconductor layer located in the first region via the fourth insulating film located in the first region, and to which hafnium is added, forming a second gate electrode of the second field effect transistor of p-type on the semiconductor layer located in the second region via the third gate insulating film located in the first region, and to which aluminum is added, forming a third gate electrode of the third field effect transistor of n-type on the semiconductor base material located in the third region via the second insulating film located in the third region, and to which both aluminum and hafnium are added, and forming a fourth gate electrode of the fourth field effect transistor of p-type on the semiconductor base material located in the fourth region via the second insulating film located in the fourth region, and to which both aluminum and hafnium are added, by patterning each of the first semiconductor material, the second semiconductor material and the third semiconductor material.

18. The method according to claim 17, wherein, in the (n), a thickness of each of the fourth insulating film located in the first region and the third insulating film located in the second region is larger than a thickness of the second insulating film located in each of the third region and the fourth region.

* * * * *